(12) United States Patent
Nishiyama

(10) Patent No.: US 10,490,484 B2
(45) Date of Patent: Nov. 26, 2019

(54) ELECTRONIC DEVICE

(71) Applicant: Renesas Electronics Corporation, Tokyo (JP)

(72) Inventor: Tomohiro Nishiyama, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/969,835

(22) Filed: May 3, 2018

(65) Prior Publication Data

US 2018/0342440 A1  Nov. 29, 2018

(30) Foreign Application Priority Data

May 26, 2017 (JP) .................................. 2017-104843

(51) Int. Cl.
| | | |
|---|---|---|
| *H01L 23/492* | (2006.01) | |
| *H01L 23/053* | (2006.01) | |
| *H01L 29/739* | (2006.01) | |
| *H01L 25/07* | (2006.01) | |
| *H01L 25/11* | (2006.01) | |

(Continued)

(52) U.S. Cl.
CPC .......... *H01L 23/492* (2013.01); *H01L 23/053* (2013.01); *H01L 25/072* (2013.01); *H01L 25/115* (2013.01); *H01L 29/7397* (2013.01); *H01L 23/051* (2013.01); *H01L 23/3107* (2013.01); *H01L 23/62* (2013.01); *H01L 2224/32245* (2013.01);

(Continued)

(58) Field of Classification Search
CPC ....... H01L 25/07; H01L 25/072; H01L 23/04; H01L 23/48; H01L 23/49838; H01L 23/3114; H01L 29/41
See application file for complete search history.

(56) References Cited

U.S. PATENT DOCUMENTS

2004/0227231 A1* 11/2004 Maly ..................... H01L 25/072
257/724
2016/0351505 A1* 12/2016 Tamada ................ H01L 25/072

FOREIGN PATENT DOCUMENTS

| JP | 2002-203941 A | 7/2002 |
| JP | 2006-086438 A | 3/2006 |
| JP | 2016-066974 A | 4/2016 |

OTHER PUBLICATIONS

Extended European Search Report received in corresponding European Application No. 18173786.7 dated Oct. 25, 2018.

* cited by examiner

*Primary Examiner* — Ermias T Woldegeorgis
(74) *Attorney, Agent, or Firm* — Mattingly & Malur, PC

(57) ABSTRACT

An electronic device has a first bus bar (conductor plate) connected to a first semiconductor device (semiconductor part) having a first power transistor; and a second bus bar (conductor plate) connected to a second semiconductor device (semiconductor part) having a second power transistor. The first and second bus bars have first portions facing each other with an insulating plate interposed therebetween and extending in a Z direction intersecting with an upper surface (main surface) of a board. The first bus bar has a second portion located between the first portion and a terminal (exposed portion) and extending in an X direction away from the second bus bar and a third portion located between the second portion and the terminal and extending in the X direction. An extension distance of the third portion in the Z direction is shorter than an extension distance of the second portion in the X direction.

15 Claims, 28 Drawing Sheets

(51) Int. Cl.
*H01L 23/051* (2006.01)
*H01L 23/31* (2006.01)
*H01L 23/62* (2006.01)

(52) U.S. Cl.
CPC .................... *H01L 2224/33* (2013.01); *H01L 2224/48091* (2013.01); *H01L 2924/181* (2013.01)

ELECTRONIC DEVICE

CROSS-REFERENCE TO RELATED APPLICATION

The present application claims priority from Japanese Patent Application No. 2017-104843 filed on May 26, 2017, the content of which is hereby incorporated by reference into this application.

TECHNICAL FIELD OF THE INVENTION

The present invention relates to an electronic device (semiconductor module), and relates to, for example, a technique effectively applied to an electronic device in which a plurality of semiconductor parts each provided with a power transistor are mounted on a board.

BACKGROUND OF THE INVENTION

There is known an electronic device in which a plurality of semiconductor chips each provided with a power transistor are mounted on a board (see Japanese Patent Application Laid-Open Publication No. 2016-66974 (Patent Document 1), Japanese Patent Application Laid-Open Publication No. 2002-203941 (Patent Document 2), and Japanese Patent Application Laid-Open Publication No. 2006-86438 (Patent Document 3)). The power transistor provided in each of the semiconductor chips is used as, for example, a switching element constituting a part of a power conversion circuit. In addition, there is known a technique in which a metal plate connected to a positive terminal and a metal plate connected to a negative terminal are disposed to face each other at a short distance, whereby parasitic inductance of each metal plate is reduced by using mutual inductance generated between the metal plates.

SUMMARY OF THE INVENTION

In a power supply system which drives an air conditioner, an automobile or various types of industrial equipment, a power conversion circuit such as an inverter circuit is incorporated. Configuration examples of the power conversion circuit include an electronic device (power conversion device, semiconductor module) in which a plurality of semiconductor chips each having a transistor (power transistor) operating as a switching element are mounted on one board and are electrically connected to each other.

Indexes of the performance of the modularized electronic device described above include, for example, electrical characteristics such as power conversion efficiency, electrical reliability such as dielectric strength, and a mounting area of the module. The inventor of the present application has made an effort to improve the performance of the modularized electronic device, and has found that there is a room for improvement of the indexes of the performance described above.

For example, from the viewpoint of improving the electrical characteristics of the electronic device, preferably, a transmission path which supplies a high-side potential to a semiconductor part constituting a power conversion circuit and a transmission path which supplies a low-side potential to a semiconductor part constituting the power conversion circuit are disposed close to each other, whereby an influence of parasitic inductance of each transmission path is reduced by using mutual inductance. However, in the case of a power module such as the power conversion device, potential difference between the transmission path on the high side and the transmission path on the low side reaches, for example, approximately several hundreds of volts in some cases. Thus, it is necessary to improve the dielectric strength on the high side and the low side.

Other problems and novel features of the present invention will be apparent from the description of the present specification and the accompanying drawings.

An electronic device according to one embodiment includes: a first conductor bar connected to a first semiconductor part provided with a first power transistor; and a second conductor bar connected to a second semiconductor part provided with a second power transistor. The first conductor bar and the second conductor bar respectively have first portions facing each other with an insulator interposed therebetween and extending in a first direction intersecting with a first main surface of a board. Also, the first conductor bar has a second portion located between the first portion and an exposed portion and extending in a second direction away from the second conductor bar and a third portion located between the second portion and the exposed portion and extending in the second direction. An extension distance of the third portion in the first direction is shorter than an extension distance of the second portion in the second direction.

According to the embodiment described above, it is possible to improve the performance of the electronic device.

BRIEF DESCRIPTIONS OF THE DRAWINGS

Figure 1:
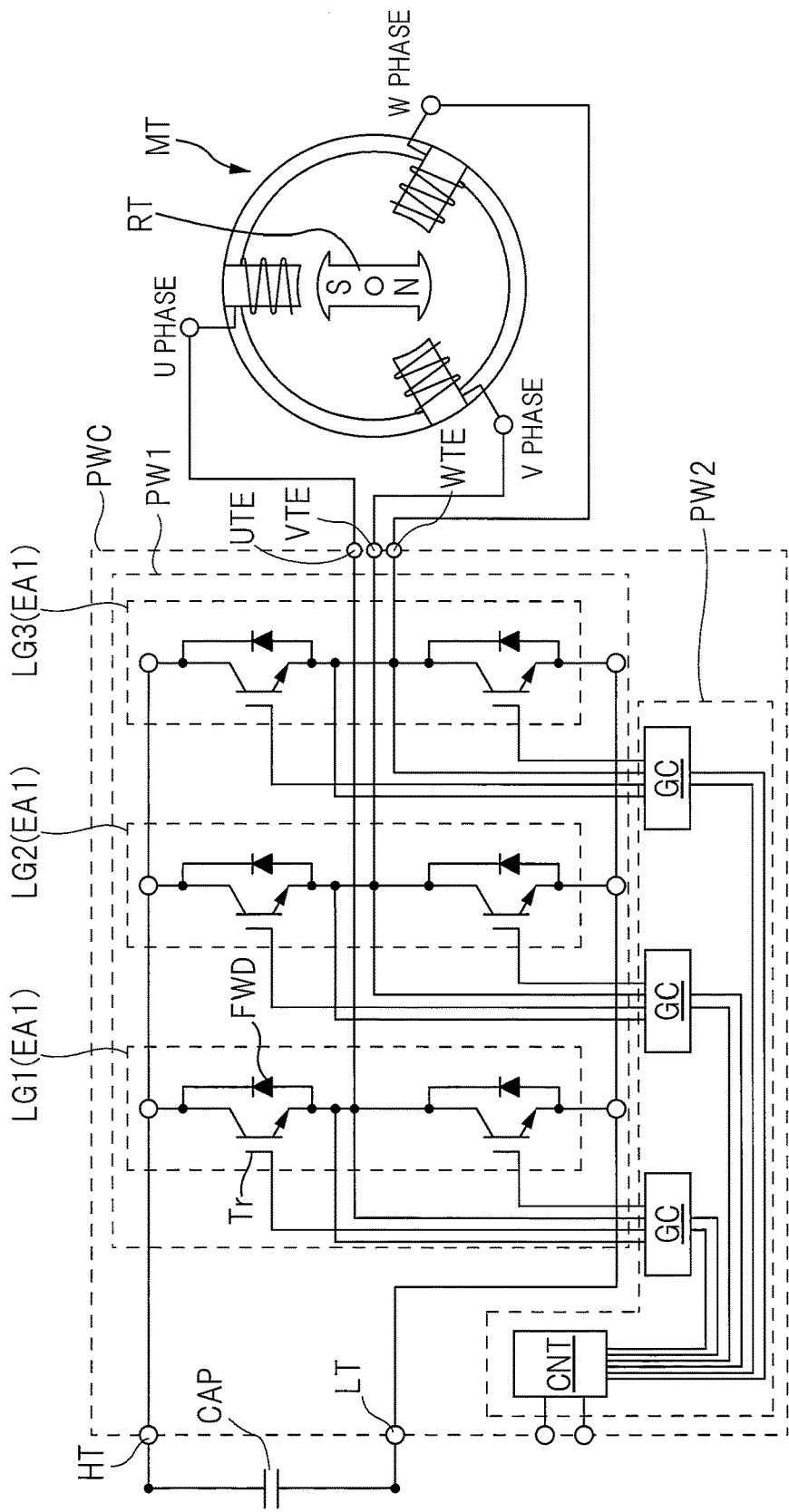
FIG. 1 is a circuit diagram showing a configuration example of an inverter circuit connected to a three-phase induction motor.

DESCRIPTIONS OF THE PREFERRED EMBODIMENTS (Explanation of Description Form, Basic Terminology and Usage in Present Application)

In the present application, the embodiments will be described in a plurality of sections when required as a matter of convenience. However, these sections are not irrelevant to each other unless otherwise stated, and a part of one example relates to the other example as details or a part or the entire of a modification example regardless of the order of description. Also, the repetitive description of similar parts will be omitted in principle. Further, the constituent elements in the embodiments are not always indispensable unless otherwise stated or except for the case where the constituent elements are theoretically indispensable in principle or the constituent elements are obviously indispensable from the context.

Likewise, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar parts are denoted by the same or similar reference character or reference number, and the descriptions thereof are not repeated in principle.

In addition, in the attached drawings, hatching may be omitted even in cross sections in the case where the hatchings make the drawings complicated on the contrary or discrimination from void is clear. In relation to this, when it is clear from the description or the like, an outline of a background may be omitted even in a planarly closed hole. Furthermore, even in the cases other than the cross section, hatching or dot patterns may be applied so as to clarify a boundary of regions or clarify that a portion is not a vacant space.

Further, in the present specification, "electronic part" refers to a part utilizing electrons, and in particular, a part utilizing electrons in semiconductor is "semiconductor part". Examples of the "semiconductor part" include a semiconductor chip. Therefore, the term including "semiconductor chip" is "semiconductor part", and a generic concept of "semiconductor part" is "electronic part".

In addition, in the present specification, the "semiconductor device" refers to a structure provided with a semiconductor part and an external connection terminal electrically connected to the semiconductor part and a structure in which a semiconductor part is covered with a sealing body. In particular, the "semiconductor device" is configured to be electrically connectable to an external device by the external connection terminal.

Further, in the present specification, a "power transistor" refers to a group of unit transistors (cell transistors) which are connected in parallel with one another (for example, thousands to tens of thousands of unit transistors connected in parallel with one another) in order to achieve a function of the unit transistor even at a current greater than the allowable current of the unit transistor. For example, if the unit transistor functions as a switching element, the "power transistor" serves as a switching element which can be applied to a current greater than the allowable current of the unit transistor. Examples of the "power transistor" constituting the switching element include an IGBT (Insulated Gate Bipolar Transistor) and a power MOSFET (Metal Oxide Semiconductor Field Effect Transistor). In the present specification, the term "power transistor" is an expression used to describe a generic concept encompassing, for example, both a "power MOSFET" and an "IGBT". Also, the semiconductor chip including the power transistor is referred to as a power semiconductor chip in some cases.

First Embodiment

In the present embodiment, a power conversion device which is a semiconductor module provided with an inverter circuit (power conversion circuit) will be described as an example of the electronic device in which a plurality of semiconductor devices are mounted on a board.

The inverter circuit refers to a circuit which converts a DC (direct current) power to an AC (alternating current) power. For example, if the plus and minus of a DC power supply are alternately output, the direction of current is reversed accordingly. In this case, since the direction of current is alternately reversed, the output can be regarded as AC power. This is the principle of the inverter circuit. As to the AC power, there are various forms such as the single-phase AC power and three-phase AC power. In the present embodiment, a three-phase inverter circuit which converts a DC power into a three-phase AC power will be described as an example. Also, in the present embodiment, electronic parts constituting one phase in the three-phase inverter circuit will be described. However, the technical idea of the present embodiment is not limited to the case of being applied to the three-phase inverter circuit, but can be widely applied to a single-phase inverter circuit and others.

<Configuration Example of Inverter Circuit>

FIG. 1 is a circuit diagram showing a configuration example of an inverter circuit connected to a three-phase induction motor. In FIG. 1, a motor MT which is a three-phase induction motor and an inverter circuit PWC are provided. The motor MT is configured to be driven by three-phase currents having different phases. In the motor MT, a rotating magnetic field is generated around a rotor RT which is a conductor, by using three-phase alternating currents referred to as a U phase, a V phase and a W phase each having a phase shifted by 120 degrees from each other. In this case, the magnetic field rotates around the rotor RT. This means that a direction of magnetic flux crossing the rotor RT which is a conductor rotates. As a result, electromagnetic induction is generated in the rotor RT which is a conductor, and an induction current flows in the rotor RT. Then, a force generated by the induction current flowing in the rotating magnetic field acts on the rotor RT, so that the rotor RT is rotated. In the circuit shown in FIG. 1, the AC power is supplied to the induction motor by using the inverter circuit PWC which generates an alternating current from a direct current. In the inverter circuit PWC shown in FIG. 1, three types (U phase, V phase, W phase) of AC powers are generated and are supplied to the motor MT.

A configuration example of the inverter circuit PWC will be described below. As shown in FIG. 1, in the inverter circuit PWC in the present embodiment, a transistor Tr and a diode FWD are provided for each of the three phases. A switching element provided in the inverter circuit PWC in the present embodiment is configured of constituent elements including the transistor Tr and the diode FWD connected in anti-parallel to each other. In other words, each of an upper arm and a lower arm of a leg LG1, an upper arm and a lower arm of a leg LG2, and an upper arm and a lower arm of a leg LG3 shown in FIG. 1 is configured of constituent elements including the transistor Tr and the diode FWD connected in anti-parallel to each other.

The transistor Tr is a power transistor which operates as a switching element, and is an IGBT in the example of the present embodiment. In the inverter circuit PWC, the transistor Tr and the diode FWD of each upper arm are connected in anti-parallel to each other between a high-side terminal HT (for example, positive potential terminal to which positive potential is supplied) to which a relatively high potential is supplied and each phase (U phase, V phase, W phase) of the motor MT. Also, the transistor Tr and the diode FWD of each lower arm are connected in anti-parallel to each other between a low-side terminal LT (for example, negative potential terminal to which negative potential is supplied) to which a potential relatively lower than each phase of the motor MT is supplied and each phase (U phase, V phase, W phase) of the motor MT. Namely, two transistors Tr and two diodes FWD are provided for each single phase. In other words, each of the legs LG1, LG2, and LG3 includes the transistor Tr which is a power transistor operating as a switching element for the high side and the transistor Tr which is a power transistor operating as a switching element for the low side. Hence, six transistors Tr and six diodes FWD are provided for the three phases. Further, a gate driving circuit (gate control circuit) GC is connected to a gate electrode of each transistor Tr, and the switching operation of the transistor Tr is controlled by the gate driving circuit GC. In the inverter circuit PWC configured in the above-described manner, the switching operation of the transistor Tr is controlled by the gate driving circuit GC, whereby the DC power is converted into the three-phase AC power and the three-phase AC power is supplied to the motor MT. In the example shown in FIG. 1, one gate driving circuit GC is connected to each of the legs LG1, LG2 and LG3. However, as a modification, the legs LG1, LG2, and LG3 may be connected to the same gate driving circuit GC. Alternatively, the six transistors Tr may be driven by respectively different gate driving circuits GC. Also, although details will be described below, an electronic device EA1 according to the present embodiment corresponds to any one of the legs LG1, LG2, and LG3 shown in FIG. 1.

In the inverter circuit PWC, the transistor Tr which is an IGBT is used as a switching element, and the diode FWD is provided so as to be connected in anti-parallel to the transistor Tr. From the viewpoint of simply achieving the switching function by the switching element, the configuration including only the transistor Tr as a switching element without the diode FWD is conceivable. However, it is necessary to provide the diode FWD when inductance is included in a load connected to the inverter circuit PWC.

When the load (motor MT in the example shown in FIG. 1) is a pure resistance including no inductance, there is no energy to be returned and the diode FWD is thus unnecessary. However, when a circuit including inductance such as a motor is connected to the load, there is a state (mode) in which a load current flows in the direction opposite to the turned-on switch. Namely, when the inductance is included in the load, energy sometimes returns from the inductance of the load to the inverter circuit PWC (current sometimes flows backward).

At this time, since the transistor Tr alone, which is an IGBT, does not have the function to allow the backflow current to flow, it is necessary to connect the diode FWD in anti-parallel to the transistor Tr. Namely, in the inverter circuit PWC, in the case where the load includes inductance as in the motor control, the energy ($\frac{1}{2} LI^2$) accumulated in the inductance must be discharged without fail when the transistor Tr is turned off. However, the transistor Tr alone cannot allow the backflow current for releasing the energy accumulated in the inductance to flow. Thus, in order to return the electric energy accumulated in the inductance, the diode FWD is connected in anti-parallel to the transistor Tr. Namely, the diode FWD has a function to allow the backflow current to flow for releasing the electric energy accumulated in the inductance. From the foregoing, in the inverter circuit PWC connected to the load including the inductance, it is necessary to provide the diode FWD in anti-parallel to the transistor Tr serving as the switching element. The diode FWD is referred to as a freewheeling diode.

In addition, in the case of the inverter circuit PWC, for example, as shown in FIG. 1, a capacitor element CAP is connected between the high-side terminal HT and the low-side terminal LT. For example, the capacitor element CAP has a function to reduce the surge voltage in the inverter circuit PWC and to stabilize the system voltage. In the example shown in FIG. 1, the capacitor element CAP is provided outside the inverter circuit PWC, but may be provided inside the inverter circuit PWC.

In addition, as shown in FIG. 1, the inverter circuit PWC according to the present embodiment includes an output unit PW1 having six switching elements corresponding to three phases and a control unit PW2 which controls the driving of the six power transistors in the output unit PW1. The control unit PW2 includes, in addition to the three gate driving circuits GC described above, a control circuit (logic circuit, arithmetic circuit) CNT which controls the operation of a high-side driving circuit and a low-side driving circuit included in each of the gate driving circuits GC. Further, though illustration thereof is omitted in FIG. 1, the control unit PW2 may include various control circuits that control the operation of the inverter circuit PWC in addition to those described above. For example, a noise filter circuit which reduces noises of a gate driving signal output from the gate driving circuit GC and a signal input to the gate driving circuit GC may be formed in the control unit PW2. Further, a circuit which measures a temperature or the like of electronic parts constituting the output unit PW1 and performs noise filtering or amplification of the measured electric signals may be formed in the control unit PW2.

<Electronic Device>

Next, an example of an electronic device constituting the inverter circuit PWC shown in FIG. 1 will be described. The electronic device EA1 described below is a semiconductor module including a circuit corresponding to any one of the legs LG1, LG2, and LG3 shown in FIG. 1. As shown in FIG. 1, the three-phase inverter circuit PWC can be configured of the three electronic devices EA1. Also, a single-phase inverter circuit can be configured of one electronic device EA1. Further, in the following description, the electronic device EA1 corresponding to the leg LG1 connected to the U phase shown in FIG. 1 is taken as an example. Therefore, in the following description, a terminal UTE connected to the U phase will be described as the terminal connected to the motor MT. However, since each of the three electronic devices EA1 shown in FIG. 1 has the same structure, the description of the electronic device EA1 corresponding to the leg LG2 or the leg LG3 is obtained by replacing the part of "the terminal UTE connected to the U phase" in the following description with "the terminal VTE connected to the V phase" or "the terminal WTE connected to the W phase".

Figure 2:
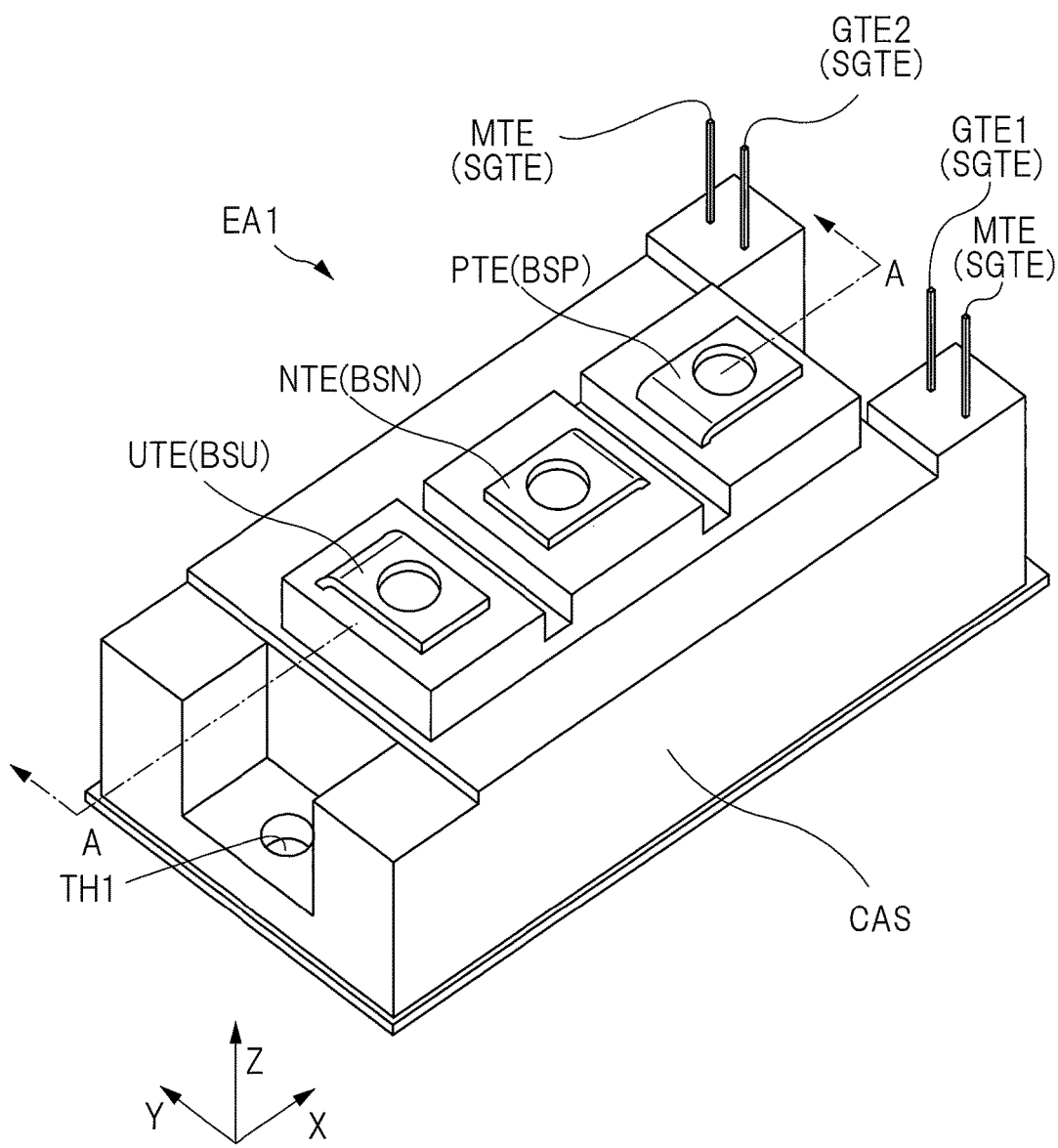
FIG. 2 is a perspective view showing an external appearance of an electronic device.
Figure 3:
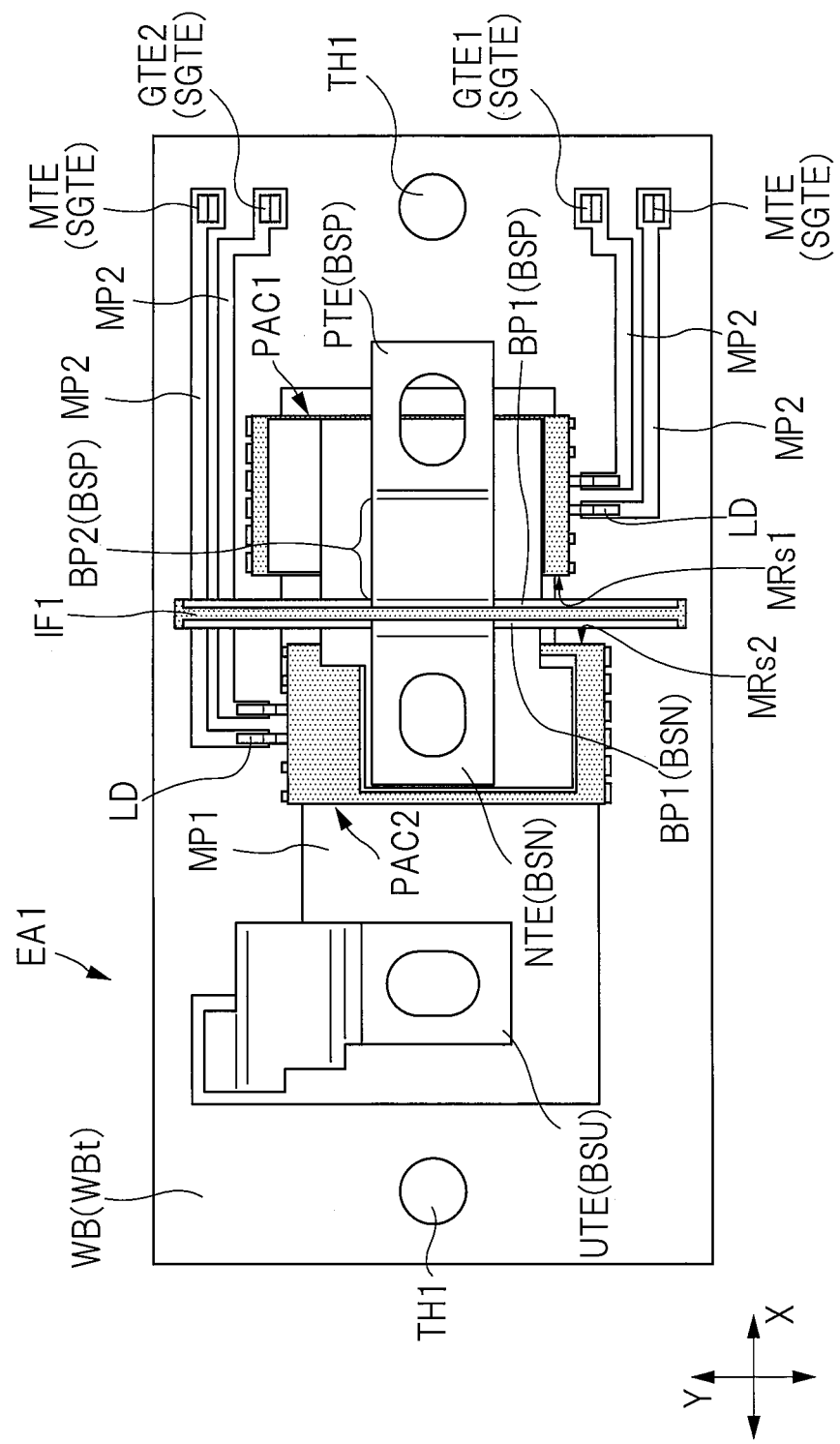
FIG. 3 is a plan view showing an internal structure of the electronic device shown in FIG. 2.
Figure 4:
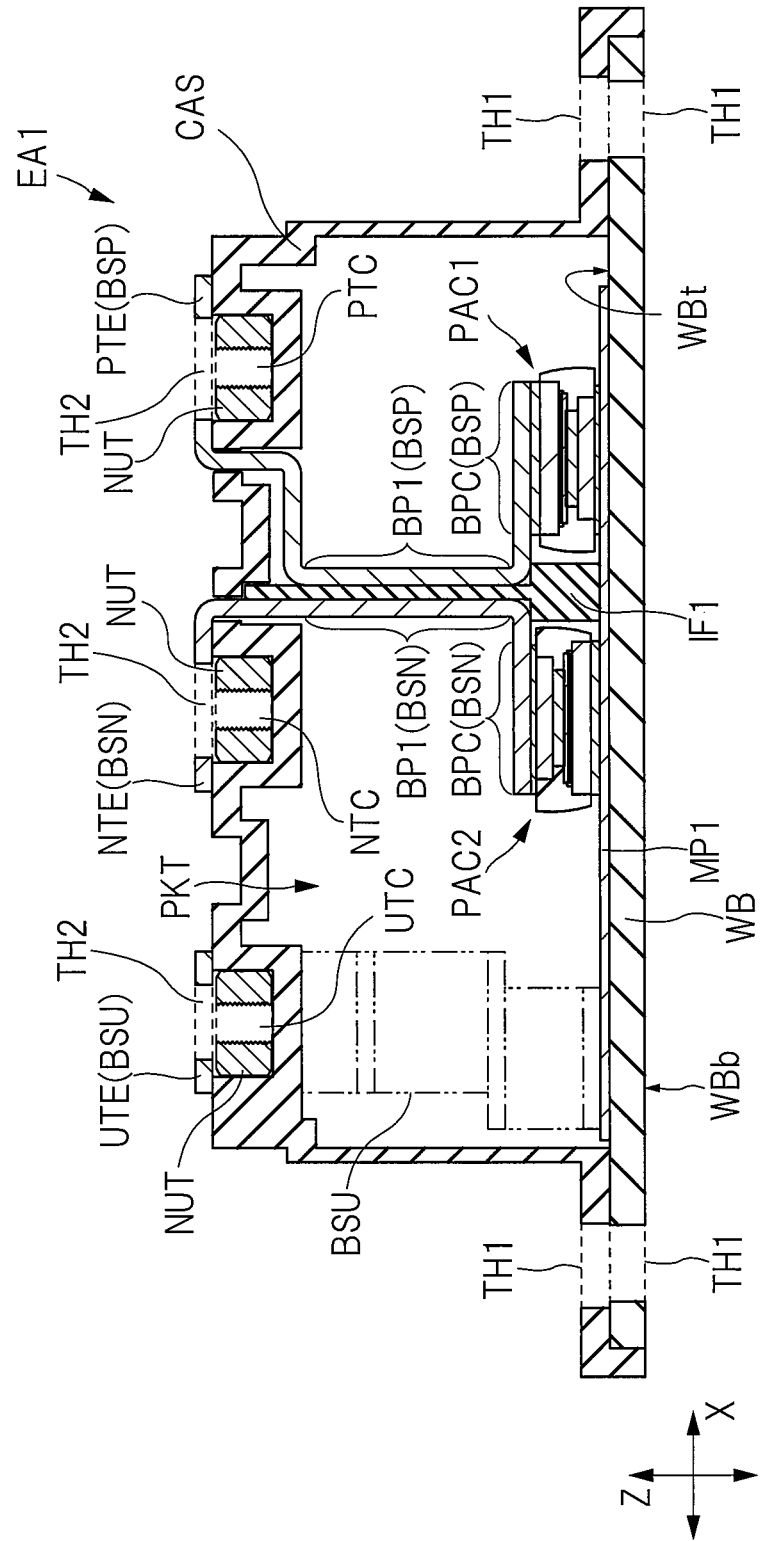
FIG. 4 is a cross-sectional view taken along a line A-A of FIG. 2.

FIG. 2 is a perspective view showing an external appearance of the electronic device according to the present embodiment. FIG. 3 is a plan view showing an internal structure of the electronic device shown in FIG. 2. In FIG. 3, dot patterns are applied to sealing bodies of the semiconductor devices PAC1 and PAC2 mounted on a board WB and an insulating plate IF1 interposed between a bus bar BSP and a bus bar BSN. Also, FIG. 4 is a cross-sectional view taken along a line A-A of FIG. 2. In FIG. 4, through holes provided in a member such as the board WB are indicated by broken lines. Further, the terminal UTE shown in FIG. 4 is connected to a conductor pattern MP1 via a bus bar BSU arranged on a cross section other than the cross section along the A-A line of FIG. 2. In FIG. 4, an outline of the bus bar BSU provided on a different cross section is indicated by two-dot chain lines.

As shown in FIG. 2, the electronic device EA1 according to the present embodiment includes a casing CAS and a plurality of external terminals exposed from the casing CAS. As shown in FIG. 4, the casing CAS includes a housing (space, concave section) PKT in which the board WB having the semiconductor devices (semiconductor parts, semiconductor packages) PAC1 and PAC2 mounted thereon is installed. The casing CAS is a cover member which covers the board WB, and an upper surface WBt of the board WB is covered with the casing CAS. In the example shown in FIG. 4, a lower surface WBb of the board WB is exposed from the casing CAS.

The casing CAS and the board WB each have through holes TH1 provided to overlap with each other, and the casing CAS and the board WB can be fixed to a mounting board (not shown) by inserting a fastener such as a bolt (not shown) into the through holes TH1. In the example of the present embodiment, the casing CAS has a rectangular planar shape and has long sides in an X direction and short sides in a Y direction orthogonal to the X direction.

Also, the plurality of external terminals exposed from the casing CAS include following terminals. That is, the electronic device EA1 has a terminal PTE and a terminal NTE. Also, the electronic device EA1 has the terminal UTE which is an output terminal connected to the U phase shown in FIG. 1. The terminal PTE is connected to the terminal HT shown in FIG. 1. Also, the terminal NTE is connected to the terminal LT shown in FIG. 1. Further, the electronic device EA1 has a plurality of signal terminals SGTE for the signal transmission to and from the semiconductor device. The plurality of signal terminals SGTE include terminals GTE1 and GTE2 which transmit gate signals to the semiconductor device. Further, the plurality of signal terminals SGTE include a monitoring terminal MTE which outputs signals for monitoring an operation state of the semiconductor device such as a temperature, a voltage or a current. In the example of the present embodiment, the signal terminal SGTE is an output terminal. However, the signal terminal SGTE serving as an input terminal to input signals to the semiconductor device may be provided.

There are various modifications for the arrangement of the plurality of external terminals, and the plurality of external terminals are arranged in the following manner in the example of the present embodiment. Namely, the terminal PTE, the terminal NTE, and the terminal UTE are arranged between the two long sides of the casing CAS along one long side of the casing CAS in the X direction. Also, the plurality of signal terminals SGTE are arranged along one short side of the casing CAS in the Y direction.

Each of the terminal UTE, the terminal PTE, and the terminal NTE of the electronic device EA1 has the following structure. As shown in FIG. 4, the casing CAS has a concave portion (external terminal portion) UTC, a concave portion (external terminal portion) NTC, and a concave portion (external terminal portion) PTC arranged in the X direction above the board WB. A nut NUT is inserted in each of the concave portions UTC, NTC, and PTC. Further, a part (exposed portion) of each of the bus bars BSP, BSN, and BSU, which is a conductive member for electrically connecting the plurality of semiconductor devices PAC1 and PAC2 in the housing PKT of the casing CAS and the external device (for example, the motor MT shown in FIG. 1), is exposed to the outside of the casing CAS.

The exposed portion of each of the bus bars BSP, BSN, and BSU from the casing CAS covers the nut NUT inserted in each of the concave portions PTC, NTC, and UTC. In addition, a through hole TH2 is formed in the exposed portion of each of the bus bars BSP, BSN, and BSU from the casing CAS. By inserting a fastener such as a bolt (not shown) into each through hole TH2 and screwing it into the nut NUT inserted in each of the concave portions PTC, NTC, and UTC, the terminals PTE, NTE, and UTE, which are exposed portions of the bus bars BSP, BSN, and BSU from the casing CAS, are fixed to the nuts NUT.

In the present application, a part of each of the bus bars BSP, BSN, and BSU exposed to the outside of the casing CAS (that is, exposed portion) is defined as an external terminal. Therefore, although each of the external terminals shown in FIG. 3 is a conductive member led to the outside of the casing CAS from a portion covered with the casing CAS, the portion covered with the casing CAS is not included in the external terminal.

In addition, the electronic device EA1 includes the board WB. The board WB has the upper surface (front surface, surface) WBt and the lower surface (back surface, surface) WBb located on the opposite side of the upper surface WBt. The upper surface WBt of the board WB has a substantially rectangular shape configured of a pair of long sides and a pair of short sides intersecting with the long sides. In the example shown in FIG. 3, the upper surface WBt of the board WB has two long sides extending in the X direction and two short sides extending in the Y direction. A plurality of conductor patterns MP1 are formed on the upper surface WBt of the board WB. The semiconductor devices (semiconductor parts) PAC1 and PAC2 are mounted on the conductor pattern MP1 formed on the upper surface WBt of the board WB.

As described above, the electronic device EA1 according to the present embodiment is a semiconductor module provided with a circuit corresponding to the leg LG1 shown in FIG. 1. Therefore, the electronic device EA1 includes one semiconductor device PAC1 having the transistor Tr corresponding to the upper arm of the leg LG1 shown in FIG. 1 and one semiconductor device PAC2 having the transistor Tr corresponding to the lower arm of the leg LG1. The semiconductor device PAC1 and the semiconductor device PAC2 are mounted so as to be adjacent to each other in the X direction.

Although details will be described below, the two semiconductor devices in the electronic device EA1 have the same structure. In other words, the two semiconductor devices in the electronic device EA1 are electronic parts of the same type. Although details will be described below, the semiconductor device PAC1 and the semiconductor device PAC2 differ in the mounting direction on the conductor pattern MP1. Further, since the semiconductor device PAC1 and the semiconductor device PAC2 differ in the mounting direction on the conductor pattern MP1 as described above, a bending direction of the lead LD differs from each other. However, the semiconductor device PAC1 and the semiconductor device PAC2 have the same structure except for the differences described above. For example, each of the semiconductor device PAC1 and the semiconductor device PAC2 has the transistor Tr and the diode FWD shown in FIG. 1.

In addition, the bus bar BSP is connected to the semiconductor device PAC1, and the bus bar BSN is connected to the semiconductor device PAC2. Further, each of the semiconductor device PAC1 and the semiconductor device PAC2 is electrically connected to the bus bar BSU via the conductor pattern MP1. Details of the structure and layout of the bus bar BSP and the bus bar BSN will be described below.

Also, as shown in FIG. 3, the semiconductor device PAC1 is connected to the terminal GTE1 and the monitoring terminal MTE, and the semiconductor device PAC2 is connected to the terminal GTE2 and the monitoring terminal MTE. A plurality of leads LD are led out from each of the semiconductor device PAC1 and the semiconductor device PAC2. Each of the plurality of leads LD is connected to the signal terminal SGTE via the conductor pattern MP2 serving as the wiring pattern formed on the upper surface WBt of the board WB.

In addition, the conductor patterns (metal patterns) MP1 are formed on the upper surface WBt of the board WB. The semiconductor device PAC1 and the semiconductor device PAC2 are mounted on one conductor pattern MP1. In other words, the semiconductor device PAC1 and the semiconductor device PAC2 are electrically connected via the conductor pattern MP1. The conductor pattern MP1 is connected to the terminal UTE via the bus bar BSU.

<Structure of Semiconductor Chip>

Figure 5:
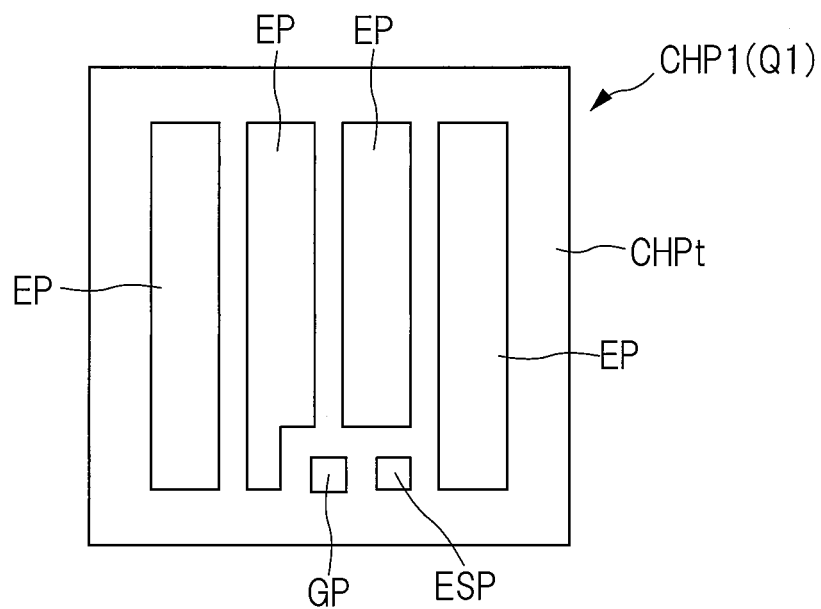
FIG. 5 is a plan view showing a shape of a front surface of a semiconductor chip shown in FIG. 3 in which a transistor is formed.
Figure 6:
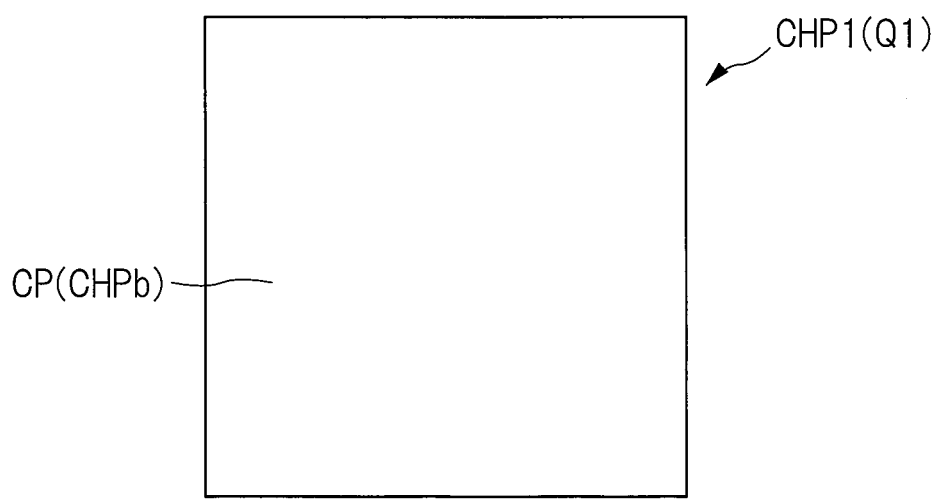
FIG. 6 is a plan view showing a back surface of the semiconductor chip shown in FIG. 5.
Figure 7:
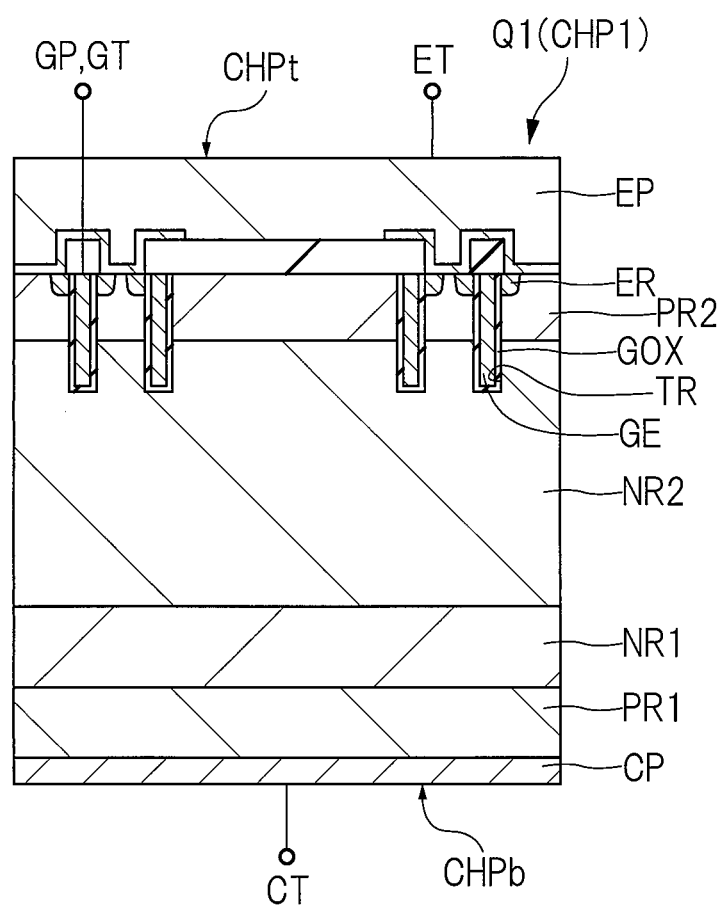
FIG. 7 is a cross-sectional view showing an example of a structure of the transistor provided in the semiconductor chip shown in FIG. 5 and FIG. 6.

Next, the structure of each member provided in the electronic device EA1 will be sequentially described in detail. First, the structure of the transistor Tr and the diode FWD constituting the inverter circuit PWC shown in FIG. 1 will be described with reference to the drawings. FIG. 5 is a plan view showing a shape of a front surface of a semiconductor chip in which the transistor shown in FIG. 1 is formed. FIG. 6 is a plan view showing a back surface of the semiconductor chip shown in FIG. 5. FIG. 7 is a cross-sectional view showing an example of a structure of the transistor provided in the semiconductor chip shown in FIG. 5 and FIG. 6.

In the case of the electronic device EA1 shown in FIG. 3, the transistor Tr and the diode FWD constituting the inverter circuit PWC shown in FIG. 1 are formed in respectively independent semiconductor chips. In the following, the semiconductor chip in which the transistor Tr is formed will be first described and then the semiconductor chip in which the diode FWD is formed will be described.

As shown in FIG. 5 and FIG. 6, the semiconductor chip CHP1 in the first embodiment has a front surface (surface, upper surface, main surface) CHPt (see FIG. 5) and a back surface (surface, lower surface, main surface) CHPb (see FIG. 6) on the opposite side of the front surface CHPt. The front surface CHPt and the back surface CHPb of the semiconductor chip CHP1 have a substantially square shape. For example, an area of the front surface CHPt and an area of the back surface CHPb are equal to each other.

Also, as shown in FIG. 5, the semiconductor chip CHP1 has a gate electrode (gate electrode pad, front surface electrode) GP formed on the front surface CHPt and an emitter electrode (emitter electrode pad, front surface electrode) EP formed on the front surface CHPt. In the example shown in FIG. 5, one gate electrode GP and a plurality of (four in FIG. 5) emitter electrodes EP are exposed on the front surface CHPt. An exposed area of each of the plurality of emitter electrodes EP is larger than an exposed area of the gate electrode GP. Although details will be described below, the emitter electrode EP is connected to the output terminal or the terminal LT of the inverter circuit PWC (see FIG. 1). Therefore, the impedance of the transmission path in which a large current flows can be reduced by increasing the exposed area of the emitter electrode EP. Further, the plurality of emitter electrodes EP are electrically connected to each other. Also, as a modification of FIG. 5, one emitter electrode EP with a large area may be provided instead of the plurality of emitter electrodes EP.

Further, in the example shown in FIG. 5, a sensing electrode ESP is exposed on the front surface CHPt. The sensing electrode ESP is formed integrally with the emitter electrode EP. A voltage and others of the emitter electrode EP can be detected from the sensing electrode ESP. When an opening from which the sensing electrode ESP is exposed and an opening from which the emitter electrode EP is exposed are separated from each other as shown in FIG. 5, the bleeding of the conductive member for connecting the emitter electrode EP to the sensing electrode ESP can be preferably suppressed. However, as a modification of FIG. 5, the opening of the sensing electrode ESP and the opening of the emitter electrode EP may not be separated from each other.

Also, as shown in FIG. 6, the semiconductor chip CHP1 has a collector electrode (collector electrode pad, back surface electrode) CP formed on the back surface CHPb. The collector electrode CP is formed over the entire back surface CHPb of the semiconductor chip CHP1. As can be seen from the comparison between FIG. 5 and FIG. 6, an exposed area of the collector electrode CP is even larger than the exposed area of the emitter electrode EP. Although details will be described below, the collector electrode CP is connected to the output terminal or the terminal HT of the inverter circuit PWC (see FIG. 1). Therefore, the impedance of the transmission path in which a large current flows can be reduced by increasing the exposed area of the collector electrode CP.

Note that, although a basic structure of the semiconductor chip CHP1 has been described with reference to FIG. 5 and FIG. 6, there are various modifications. For example, an electrode for monitoring the operation state of the semiconductor chip CHP1 or an electrode for inspecting the semiconductor chip CHP1 such as an electrode for temperature detection, an electrode for voltage detection or an electrode for current detection may be provided in addition to the electrodes shown in FIG. 5. When these electrodes are provided, the electrodes are exposed on the front surface CHPt of the semiconductor chip CHP1 like the gate electrode GP. Also, these electrodes correspond to the electrodes for signal transmission. The exposed area of each emitter electrode EP (each of the plurality of exposed surfaces shown in FIG. 5) is larger than the exposed area of the electrode for signal transmission.

Also, the transistor Tr provided in the semiconductor chip CHP1 has the structure shown in FIG. 7, for example. A $p^+$ type semiconductor region PR1 is formed on the collector electrode CP formed on the back surface CHPb of the semiconductor chip CHP1. An $n^+$ type semiconductor region NR1 is formed on the $p^+$ type semiconductor region PR1, and an $n^-$ type semiconductor region NR2 is formed on the $n^+$ type semiconductor region NR1. Further, a p type semiconductor region PR2 is formed on the $n^-$ type semiconductor region NR2, and a trench TR which penetrates through the p type semiconductor region PR2 and reaches the $n^-$ type semiconductor region NR2 is formed. In addition, an $n^+$ type semiconductor region ER to be an emitter region is formed in alignment with the trench TR. A gate insulating film GOX made of, for example, a silicon oxide film is formed in the trench TR, and a gate electrode GE is formed in the trench TR via the gate insulating film GOX. The gate electrode GE is made of, for example, a polysilicon film, and is formed to fill the trench TR.

In the transistor Tr configured in this manner, the gate electrode GE is connected to a gate terminal GT (described below in detail) via the gate electrode GP shown in FIG. 5. Likewise, the $n^+$ type semiconductor region ER to be the emitter region is electrically connected to an emitter terminal ET (described below in detail) via the emitter electrode EP. The p type semiconductor region PR1 to be the collector region is electrically connected to the collector electrode CP formed on the back surface CHPb of the semiconductor chip CHP1.

The transistor Tr configured in this manner has both of the high-speed switching characteristics and the voltage driving characteristics of the power MOSFET and the low ON-voltage characteristics of the bipolar transistor.

Note that the $n^+$ type semiconductor region NR1 is referred to as a buffer layer. The $n^+$ type semiconductor region NR1 is provided so as to prevent the punch-through phenomenon in which a depletion layer grown in the $n^-$ type semiconductor region NR2 from the p type semiconductor region PR2 comes in contact with the $p^+$ type semiconductor region PR1 formed in the layer below the $n^-$ type semiconductor region NR2 when the transistor Tr is turned off. Also, the $n^+$ type semiconductor region NR1 is provided for the purpose of restricting the hole injection amount from the $p^+$ type semiconductor region PR1 to the $n^-$ type semiconductor region NR2.

Further, the gate electrode of the transistor Tr is connected to the gate driving circuit GC shown in FIG. 1. At this time, the signals from the gate driving circuit GC are applied to the gate electrode GE (see FIG. 7) of the transistor Tr via the gate terminal GT (see FIG. 7), whereby the switching operation of the transistor Tr can be controlled from the gate driving circuit GC.

Figure 8:
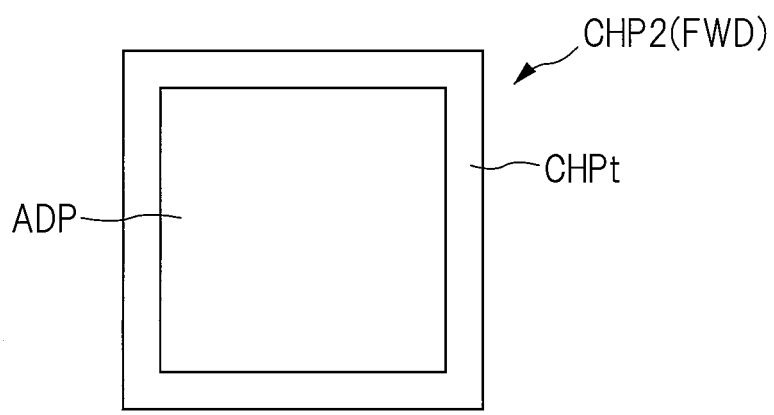
FIG. 8 is a plan view showing a shape of a front surface of a semiconductor chip shown in FIG. 3 in which a diode is formed.
Figure 9:
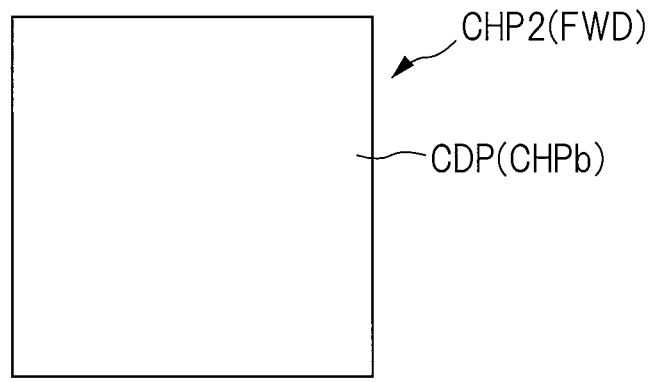
FIG. 9 is a plan view showing a back surface of the semiconductor chip shown in FIG. 8.

Next, the semiconductor chip in which the diode FWD shown in FIG. 1 is formed will be described. FIG. 8 is a plan view showing a shape of a front surface of the semiconductor chip in which the diode shown in FIG. 1 is formed. FIG. 9 is a plan view showing a back surface of the semiconductor chip shown in FIG. 8. Also, FIG. 10 is a cross-sectional view showing an example of a structure of the diode provided in the semiconductor chip shown in FIG. 8 and FIG. 9.

As shown in FIG. 8 and FIG. 9, the semiconductor chip CHP2 in the first embodiment has a front surface (surface, upper surface, main surface) CHPt (see FIG. 8) and a back surface (surface, lower surface, main surface) CHPb (see FIG. 9) on the opposite side of the front surface CHPt. The front surface CHPt and the back surface CHPb of the semiconductor chip CHP2 have a substantially square shape. For example, an area of the front surface CHPt and an area of the back surface CHPb are equal to each other. Also, as can be seen from the comparison between FIG. 5 and FIG. 8, the area of the front surface CHPt of the semiconductor chip CHP1 (see FIG. 5) is larger than the area of the front surface CHPt of the semiconductor chip CHP2 (see FIG. 8).

In addition, as shown in FIG. 8, the semiconductor chip CHP2 has an anode electrode (anode electrode pad, front surface electrode) ADP formed on the front surface CHPt. Further, as shown in FIG. 9, the semiconductor chip CHP2 has a cathode electrode (cathode electrode pad, back surface electrode) CDP formed on the back surface CHPb. The cathode electrode CDP is formed over the entire back surface CHPb of the semiconductor chip CHP2.

Figure 10:
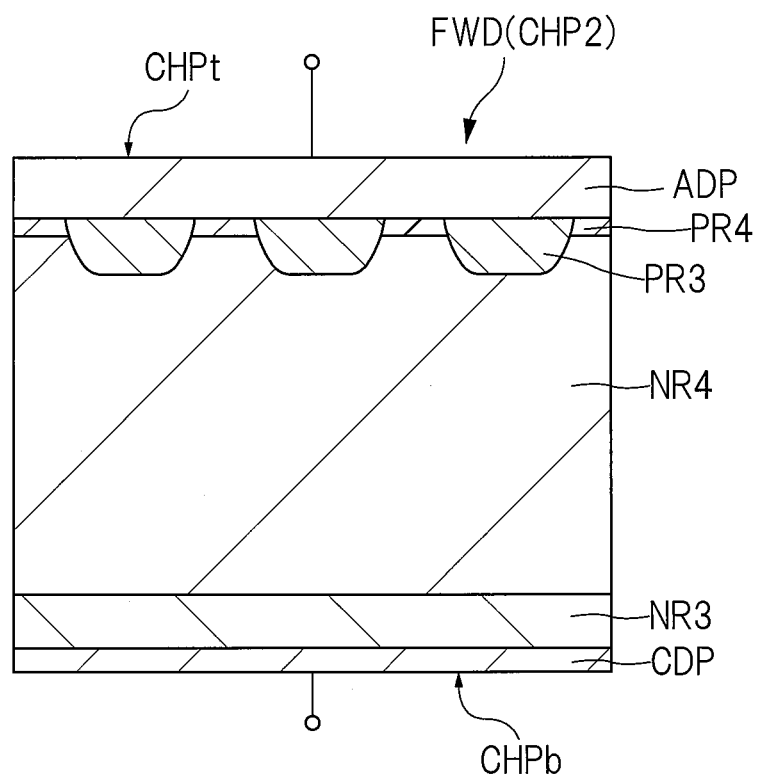
FIG. 10 is a cross-sectional view showing an example of a structure of the diode provided in the semiconductor chip shown in FIG. 8 and FIG. 9.

Also, the diode FWD provided in the semiconductor chip CHP2 has the structure shown in FIG. 10, for example. As shown in FIG. 10, an $n^+$ type semiconductor region NR3 is formed on the cathode electrode CDP formed on the back surface CHPb of the semiconductor chip CHP2. Further, an $n^-$ type semiconductor region NR4 is formed on the $n^+$ type semiconductor region NR3, and p type semiconductor regions PR3 separated from each other are formed on the n⁻ type semiconductor region NR4. A p⁻ type semiconductor region PR4 is formed between the p type semiconductor regions PR3. The anode electrode ADP is formed on the p type semiconductor region PR3 and the p⁻ type semiconductor region PR4. The anode electrode ADP is made of, for example, aluminum-silicon.

In the diode FWD configured in this manner, when a positive voltage is applied to the anode electrode ADP and a negative voltage is applied to the cathode electrode CDP, the pn junction between the n⁻ type semiconductor region NR4 and the p type semiconductor region PR3 is forward biased and a current flows. On the other hand, when a negative voltage is applied to the anode electrode ADP and a positive voltage is applied to the cathode electrode CDP, the pn junction between the n⁻ type semiconductor region NR4 and the p type semiconductor region PR3 is reverse biased and no current flows. In this way, the diode FWD having a rectifying function can be operated.

<Configuration of Semiconductor Device>

Next, a configuration of the semiconductor device which is a switch constituting the inverter circuit PWC shown in FIG. 1 will be described with reference to drawings. As described above, the electronic device EA1 shown in FIG. 3 includes the semiconductor device PAC1 and the semiconductor device PAC2. However, the semiconductor device PAC1 and the semiconductor device PAC2 have the same configuration. Therefore, the semiconductor device PAC1 and the semiconductor device PAC2 having the same configuration will be described as a semiconductor device (semiconductor part) PAC below. Although details will be described below, in the electronic device EA1 according to the present embodiment, the semiconductor device PAC1 and the semiconductor device PAC2 are mounted on the conductor pattern MP1, with their constituent members being inverted from each other. However, in the following description, when top and bottom of each constituent member of the semiconductor device PAC is described, the direction from the back surface CHPb to the front surface CHPt of the semiconductor chip CHP1 shown in FIG. 7 is defined as an upward direction and the direction from the front surface CHPt to the back surface CHPb is defined as a downward direction regardless of the direction in mounting. The same is true of the case where the surface of each member is described as an upper surface or a lower surface.

The semiconductor device PAC in the first embodiment is obtained by integrating one transistor Tr and one diode FWD to be the constituent elements of the inverter circuit PWC shown in FIG. 1 into single package. Namely, the electronic device (semiconductor module, power module) EA1 (see FIG. 3) corresponding to one leg LG1 of the three-phase inverter circuit PWC is configured by using the two semiconductor devices PAC in the first embodiment.

Figure 11:
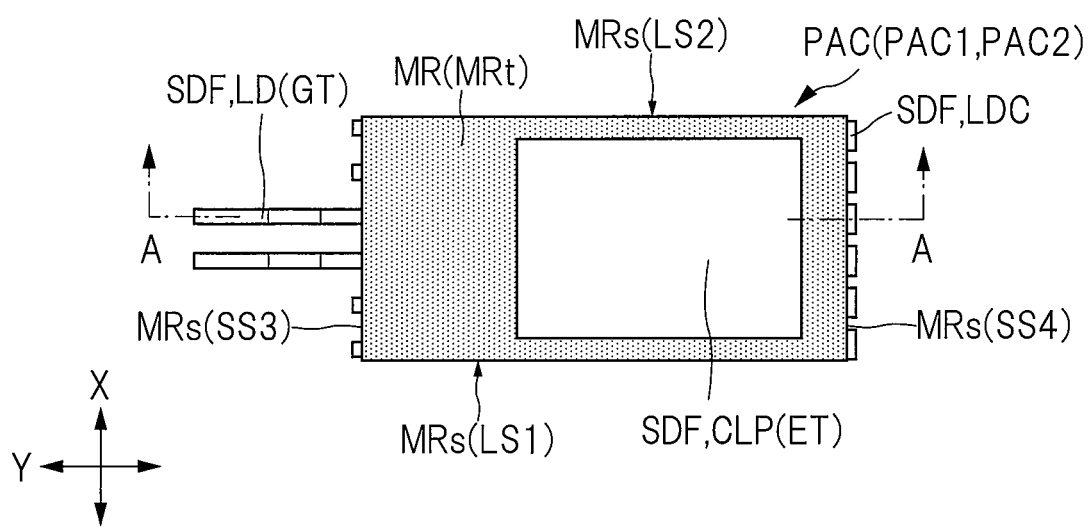
FIG. 11 is a plan view showing an example of a shape of one main surface of the semiconductor device shown in FIG. 3.
Figure 12:
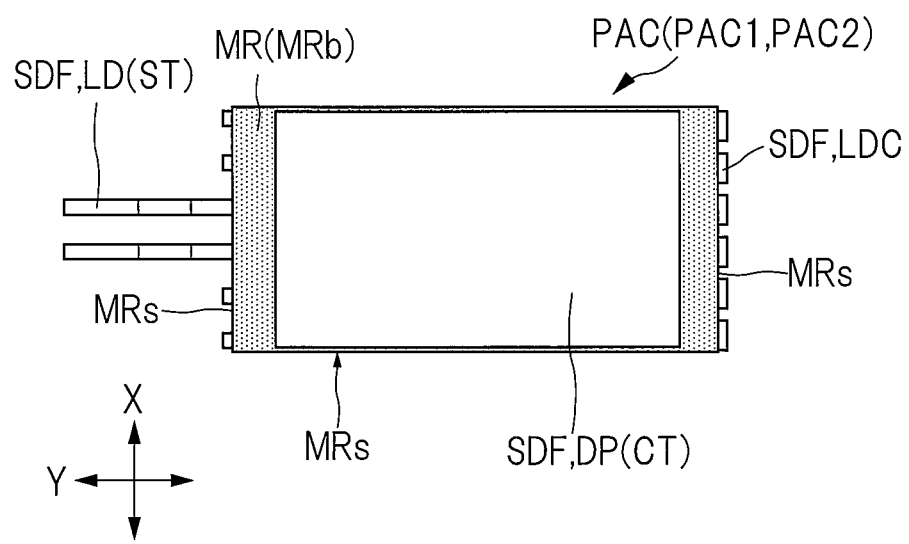
FIG. 12 is a plan view showing an example of a shape of the other main surface on an opposite side of the one main surface of the semiconductor device shown in FIG. 11.
Figure 13:
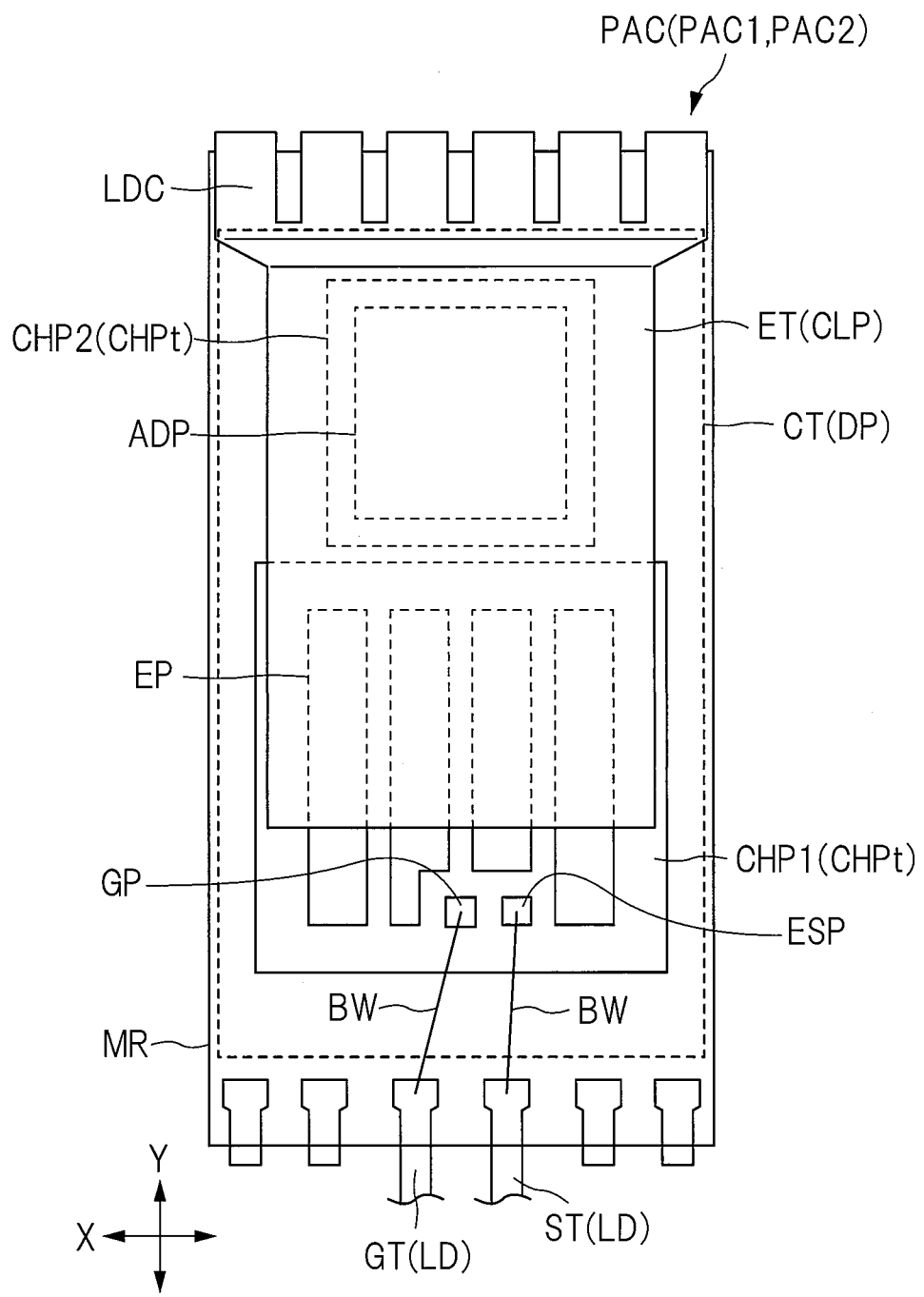
FIG. 13 is a plan view showing an internal structure of the semiconductor device shown in FIG. 11 and FIG. 12.
Figure 14:
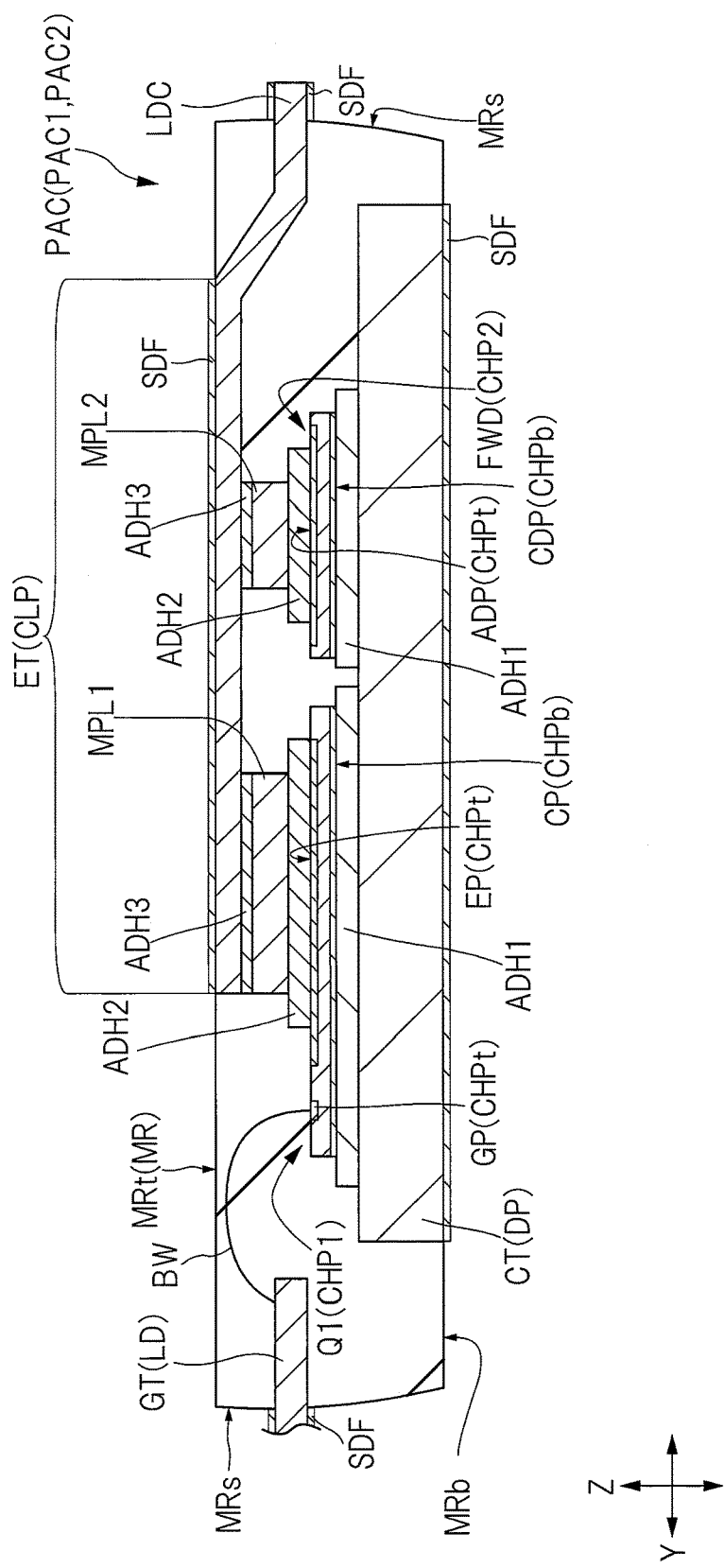
FIG. 14 is a cross-sectional view taken along a line A-A of FIG. 11.

FIG. 11 is a plan view showing an example of a shape of one main surface of the semiconductor device shown in FIG. 3. FIG. 12 is a plan view showing an example of a shape of the other main surface on an opposite side of the one main surface of the semiconductor device shown in FIG. 11. Also, FIG. 13 is a plan view showing an internal structure of the semiconductor device shown in FIG. 11 and FIG. 12. FIG. 14 is a cross-sectional view taken along a line A-A of FIG. 11. In FIG. 13, in order to clearly show the planar positional relationship of a die pad DP, the semiconductor chips CHP1 and CHP2, the emitter electrode EP, the gate electrode GP, the sensing electrode ESP, and the anode electrode ADP, outlines thereof are indicated by broken lines or solid lines.

Also, in FIG. 13, illustrations of metal plates MPL1 and MPL2 shown in FIG. 14 are omitted for ease of viewing.

As shown in FIG. 11 and FIG. 12, the semiconductor device PAC includes a sealing body (resin body) MR having a main surface (upper surface, front surface) MRt (see FIG. 11), a main surface (lower surface, back surface) MRb (see FIG. 12) on an opposite side of the main surface MRt, and side surfaces MRs located between the main surface MRt and the main surface MRb in a thickness direction. The sealing body MR has a rectangular shape in plan view. In the example shown in FIG. 11, the sealing body MR has a long side LS1 and a long side LS2 facing each other and a short side SS3 and a short side SS4 facing each other and intersecting with the long sides LS1 and LS2.

The sealing body MR is made of resin in which the semiconductor chip CHP1 (see FIG. 14) and the semiconductor chip CHP2 (see FIG. 14) are collectively sealed, and the resin contains an epoxy-based resin material as a main component. In addition, the plurality of terminals provided in the semiconductor device PAC are exposed from the sealing body MR. As shown in FIG. 11, the emitter terminal (package terminal, front surface terminal) ET is exposed from the main surface MRt of the sealing body MR. The emitter terminal ET is a terminal (package terminal) connected to the emitter electrode EP of the semiconductor chip CHP1 described above with reference to FIG. 7. Also, as shown in FIG. 12, a collector terminal (package terminal, back surface terminal) CT is exposed from the main surface MRb of the sealing body MR. The collector terminal CT is a terminal (package terminal) connected to the collector electrode CP of the semiconductor chip CHP1 shown in FIG. 7.

Further, as shown in FIG. 11, the gate terminal GT is exposed from the side surface MRs of the sealing body MR. As shown in FIG. 7, the gate terminal GT is a terminal (package terminal) connected to the gate electrode GE of the semiconductor chip CHP1. Also, as shown in FIG. 12, the signal terminal ST is exposed from the side surface MRs of the sealing body MR. The signal terminal ST is a terminal which transmits signals for monitoring the operation state of the semiconductor device. Note that the gate terminal GT shown in FIG. 11 is a type of signal terminal which transmits gate signals to the gate electrode GE shown in FIG. 7. The leads LD led out from the inside of the sealing body MR to the outside are used as the gate terminal GT and the signal terminal ST which are the terminals constituting the signal transmission path. As shown in FIG. 14, the lead LD protrudes from the side surface MRs of the sealing body MR to the outside of the sealing body MR.

A cross-sectional area of the lead LD at the interface between the inside and the outside of the sealing body MR is smaller than the exposed area of each of the emitter terminal ET and the collector terminal CT from the sealing body MR. Thus, it is advantageous in that the increase in size of the semiconductor device PAC can be suppressed even when the number of signal terminals ST is increased. On the other hand, when the exposed area from the sealing body MR is large as in the emitter terminal ET and the collector terminal CT, it is advantageous in that the resistance component and the inductance component of the transmission path can be reduced because the cross-sectional area of the transmission path can be increased. Since a large current flows in the emitter terminal ET and the collector terminal CT, it is preferable to reduce the resistance component and the inductance component as much as possible. Meanwhile, the current flowing in the gate terminal GT and the signal terminal ST is relatively low. Therefore, it is preferable that the emitter terminal ET and the collector terminal CT in which a relatively large current flows have a large exposed area from the sealing body MR. In addition, the surface on the side to be mounted on the conductor pattern MP1 (see FIG. 3) of the board WB (see FIG. 3) serves as a main heat dissipation path of the semiconductor devices PAC1 and PAC2. Therefore, from the viewpoint of improving the heat dissipation characteristics, it is preferable to increase the exposed area of the emitter terminal and the collector terminal connected to the metal pattern MP1.

Next, the internal structure of the semiconductor device PAC will be described. As shown in FIG. 13 and FIG. 14, a rectangular die pad (chip mounting portion, metal plate, tab, heat spreader) DP is disposed in the sealing body MR. The die pad DP functions also as a heat spreader for improving the heat dissipation efficiency, and is made of a metal material containing copper having high heat conductivity as a main component. Herein, the "main component" means a material component contained most among the constituent materials constituting a member. For example, "material containing copper as a main component" means that a material of a member contains copper most. The intention of using the term "main component" in the present specification is to express that, for example, a member is basically made of copper, but the case where the member additionally contains impurities is not excluded.

In addition, as shown in FIG. 13, a projection area of the die pad DP is larger than the total of the area of the front surface CHPt of the semiconductor chip CHP1 and the area of the front surface CHPt of the semiconductor chip CHP2. Thus, both of the semiconductor chip CHP1 and the semiconductor chip CHP2 can be mounted on one die pad DP.

As shown in FIG. 14, the semiconductor chip CHP1 in which an IGBT is formed and the semiconductor chip CHP2 in which a diode is formed are mounted on the die pad DP via a conductive adhesive (die bond material, conductive member, connection member, boding material) ADH1 made of, for example, solder or a conductive resin. At this time, the surface on which the semiconductor chip CHP1 and the semiconductor chip CHP2 are mounted is defined as an upper surface of the die pad DP, and a surface opposite to the upper surface is defined as a lower surface. In this case, the semiconductor chip CHP1 and the semiconductor chip CHP2 are mounted on the upper surface of the die pad DP.

The semiconductor chip CHP2 in which a diode is formed is mounted such that the cathode electrode CDP formed on the back surface of the semiconductor chip CHP2 faces the upper surface of the die pad DP via the conductive adhesive ADH1. In this case, the anode electrode ADP formed on the front surface CHPt of the semiconductor chip CHP2 faces a clip CLP. On the other hand, the semiconductor chip CHP1 in which an IGBT is formed is mounted such that the collector electrode CP formed on the back surface CHPb of the semiconductor chip CHP1 faces a first surface of the die pad DP via the conductive adhesive ADH1. In this case, the emitter electrode EP and the gate electrode GP formed on the front surface CHPt of the semiconductor chip CHP1 face the clip CLP. Thus, the collector electrode CP of the semiconductor chip CHP1 and the cathode electrode CDP of the semiconductor chip CHP2 are electrically connected to each other via the conductive adhesive ADH1 and the die pad DP.

Further, as shown in FIG. 14, the lower surface of the die pad DP is exposed from the main surface MRb of the sealing body MR, and the exposed lower surface of the die pad DP serves as the collector terminal CT. Thus, the collector electrode CP of the semiconductor chip CHP1 and the cathode electrode CDP of the semiconductor chip CHP2 are electrically connected to the collector terminal CT via the conductive adhesive ADH1.

Also, when the semiconductor device PAC1 shown in FIG. 3 is mounted on the board WB, the lower surface of the die pad DP (see FIG. 14) is electrically connected to the conductor pattern MP1 formed on the board WB. In the case where the die pad DP serving as the collector terminal CT is exposed on the main surface MRb of the sealing body MR as in the semiconductor device PAC, the exposed area of the collector terminal CT can be increased as described above. Accordingly, the resistance component and the inductance component of the transmission path passing through the collector terminal CT can be reduced. Also, thermal resistance in the heat dissipation path can be reduced by increasing the exposed area of the collector terminal CT.

Further, as shown in FIG. 14, the thickness of the die pad DP is greater than the thickness of the gate terminal GT and the signal terminal ST (see FIG. 12). In this case, the thermal capacity of the die pad DP can be increased, and it is thus possible to improve the heat dissipation efficiency of the heat dissipation path passing through the die pad DP.

Also, as shown in FIG. 14, the clip (conductive member, metal plate, electrode connection member) CLP which is a conductive member is disposed on the emitter electrode EP of the semiconductor chip CHP1 and the anode electrode ADP of the semiconductor chip CHP2. In the example of the present embodiment, the clip CLP is a part of the conductive member integrally formed with the lead LDC and exposed on the main surface MRt of the sealing body MR. The lead LDC may be regarded as the clip CLP. However, in the present embodiment, since the exposed surface exposed from the main surface MRt of the sealing body MR is used as the emitter terminal ET and the lead LDC exposed from the side surface MRs of the sealing body MR is not used as the emitter terminal ET, the emitter terminal ET and the lead LDC are distinguished from each other.

Also, in the example shown in FIG. 14, the emitter electrode EP of the semiconductor chip CHP1 is electrically connected to the clip CLP via a conductive adhesive ADH2, the metal plate MPL1, and a conductive adhesive ADH3 stacked in order from the side of the emitter electrode EP. Also, the anode electrode ADP of the semiconductor chip CHP2 is electrically connected to the clip CLP via the conductive adhesive ADH2, the metal plate MPL2, and the conductive adhesive ADH3 stacked in order from the side of the anode electrode ADP.

Also, as shown in FIG. 14, the upper surface of the clip CLP is exposed from the main surface MRt of the sealing body MR, and the exposed upper surface of the clip CLP serves as the emitter terminal ET. Thus, the emitter electrode EP of the semiconductor chip CHP1 and the anode electrode ADP of the semiconductor chip CHP2 are electrically connected to the emitter terminal ET. When the clip CLP serving as the emitter terminal ET is exposed on the main surface MRt of the sealing body MR in this manner, the exposed area of the emitter terminal ET can be increased as described above. Accordingly, the resistance component and the inductance component of the transmission path passing through the emitter terminal ET can be reduced.

Note that the clip CLP is made of, for example, a metal material containing copper (Cu). Also, though not shown, the surface of the clip CLP may be covered with a metal film formed of, for example, tin plating. In this case, the mounting failure due to oxidation of copper can be prevented.

Also, in the example shown in FIG. 14, the clip CLP is formed integrally with the lead LDC, and thus the thickness of the clip CLP is equal to the thickness of the gate terminal GT and the signal terminal ST. However, in the present embodiment, after covering the clip CLP with the sealing body MR, a part of the clip CLP is exposed from the sealing body MR by polishing as described below. In this case, since the chip CLP is partially polished, a part of the chip CLP having the exposed surface is thinner than the other part of the chip CLP (for example, part of the LDC shown in FIG. 14). Meanwhile, a space between the clip CLP and the semiconductor chip CHP1 and a space between the clip CLP and the semiconductor chip CHP2 are widened for ensuring a loop height of the wire BW which connects the gate electrode GP and the gate terminal GT. Thus, in the case of the semiconductor device PAC shown in FIG. 14, the metal plate MPL1 is disposed between the clip CLP and the semiconductor chip CHP1, and the metal plate MPL2 is disposed between the clip CLP and the semiconductor chip CHP2. The metal plate MPL1 is adhered to the semiconductor chip CHP1 via the conductive adhesive ADH2 and is adhered to the clip CLP via the conductive adhesive ADH3. Also, the metal plate MPL2 is adhered to the semiconductor chip CHP2 via the conductive adhesive ADH2 and is adhered to the clip CLP via the conductive adhesive ADH3.

Note that there are various modifications in the mode of the clip CLP other than that shown in FIG. 14. For example, when the clip CLP and the lead LDC are separately formed as individual members, the degree of freedom in the design of the shape of the clip CLP is increased. For example, the clip CLP may be configured as a metal member in which the clip CLP, the conductive adhesive ADH3, and the metal plates MPL1 and MPL 2 shown in FIG. 14 are integrated. In this case, the clip CLP is connected to the semiconductor chip CHP1 and the semiconductor chip CHP2 via the conductive adhesive ADH2 shown in FIG. 14. Further, the metal plates MPL1 and MPL2 and the conductive adhesive ADH3 shown in FIG. 14 may be omitted by partially bending the clip CLP.

In addition, the lead LDC partially protrudes to the outside from the side surface MRs of the sealing body MR, but the part outside the sealing body MR is not connected to another member. In other words, the lead LDC does not have a function as a terminal (package terminal). Therefore, as a modification of the present embodiment, the lead LDC may be omitted. However, lead frames have high versatility when various types of products are manufactured in the manufacturing process of the semiconductor device, and it is preferable that lead frames common to various types of products can be used. Therefore, when the lead LDC is provided as in the case shown in FIG. 13 and FIG. 14, it is advantageous in that the versatility of the lead frame is improved.

Also, since the lead LDC does not function as a terminal in the case of the semiconductor device PAC, the lead LDC may be omitted when the clip CLP is formed as a member separated from the lead LDC. However, when the clip CLP and the lead LDC are integrally formed as in the present embodiment, it is easy to align the clip CLP and the semiconductor chips CHP1 and CHP2 in the manufacturing process of the semiconductor device PAC.

In addition, from the viewpoint of reducing the On-resistance of the semiconductor device PAC serving as a switching element, it is preferable that a material having a high electric conductivity is used for the conductive adhesive ADH1 connected to the die pad DP and the conductive adhesives ADH2 and ADH3 for electrically connecting the clip CLP and the electrodes of the semiconductor chips CHP1 and CHP2. Examples of the material having a high electric conductivity include a conductive resin containing a plurality of (large number of) conductive particles in the resin in addition to solder. Also, a sintered metal film in which a plurality of (large number of) conductive particles such as silver (Ag) particles are sintered may be used.

However, the semiconductor device PAC is mounted on the board WB as shown in FIG. 3 after being completed as a product. In this case, it is preferable that a material having high electrical conductivity such as solder or a conductive resin is used also for the connection member used for connecting the semiconductor devices PAC1 and PAC2 and the board WB. In this case, the conductive adhesive ADH1 and the conductive adhesives ADH2 and ADH3 shown in FIG. 14 must have heat resistance to the processing temperature in mounting the semiconductor device PAC.

For example, when solder is used to mount the semiconductor device PAC, the solder is molten for connection, and thus heat treatment (reflow) is necessary. When the solder used to connect the semiconductor device PAC and the board WB (see FIG. 3) and the solder used inside the semiconductor device PAC described above are the same material, there is a fear that the solder inside the semiconductor device PAC is molten due to the heat treatment (reflow) in mounting the semiconductor device PAC. Therefore, when the solder is used inside the semiconductor device PAC and the solder is used also in mounting the semiconductor device PAC, it is preferable that a high melting point solder having a melting point higher than that of the solder used in mounting is used inside the semiconductor device PAC.

On the other hand, when the conductive resin is used in mounting the semiconductor device PAC, heat treatment (cure baking) for curing the resin component in the conductive resin is necessary. However, since the curing temperature of resin is lower than the melting point of solder in general, the conductive adhesive ADH1 and the conductive adhesive ADH2 may be either the solder or the conductive resin in this case.

Further, even when solder is used in mounting the semiconductor device PAC, a conductive resin may be used as the conductive adhesive ADH1 and the conductive adhesive ADH2 as long as the heat resistant temperature of the resin is higher than the melting point of the solder.

In addition, as shown in FIG. 13 and FIG. 14, the gate electrode GP is formed on the front surface of the semiconductor chip CHP1, and the gate electrode GP is electrically connected to the gate terminal GT via the wire BW which is a conductive member. The wire BW is made of, for example, a conductive member containing gold, copper, or aluminum as a main component.

In a plan view, the semiconductor chip CHP1 is mounted on the die pad DP so as to be located between the semiconductor chip CHP2 and the gate terminal GT. Also, the semiconductor chip CHP1 is mounted on the die pad DP such that the gate electrode GP is located between the emitter electrode EP and the gate terminal GT. Accordingly, it is possible to reduce the length of the wire BW that connects the gate electrode GP and the gate terminal GT.

Also, in the example shown in FIG. 13, the signal terminal ST is electrically connected to the sensing electrode ESP for emitter via the wire BW. In this case, the signal terminal ST can be used as an inspection terminal which measures and outputs the voltage of the emitter electrode EP in the inspection in which a large current flows through the transistor Tr (see FIG. 15 described below) of the semiconductor chip CHP1. The signal terminal ST is connected to the monitoring terminal MTE shown in FIG. 3 and outputs the detected signal to the outside.

Further, as shown in FIG. 14, each of the plurality of wires BW is sealed by the sealing body MR. In the case of mounting to the electronic device EA1 (FIG. 3) in the state where the wires BW which are particularly susceptible to deformation or damage among the members constituting the semiconductor device PAC are protected by the sealing body MR, the handling property of each member at the time of mounting to the electronic device EA1 is improved. Accordingly, the assembly efficiency of the electronic device EA1 can be improved. In addition, as shown in FIG. 14, among the components constituting the semiconductor device PAC, the semiconductor chip CHP1, the semiconductor chip CHP2, a part of the die pad DP, a part of the clip CLP, a part of each of the plurality of leads LD, and the wire BW are sealed with resin.

Further, as shown in FIG. 14, in each of the clip CLP, the die pad DP, the lead LD, and the lead LDC, a portion exposed from the sealing body MR is covered with a metal film SDF. The metal film SDF is made of a metal material such as solder and is formed by, for example, the plating method. In the case where the semiconductor device PAC is mounted on the conductor pattern MP1 shown in FIG. 3 via solder, the metal film SDF that covers the exposed surface can improve wettability of the solder. The same is true of the case of the clip CLP and the leads LD and LDC. In particular, in the case where the die pad DP and the clip CLP are made of a metal material containing copper as a main component, the wettability can be greatly improved by covering the exposed surface with the metal film SDF.

<Connection Structure of Each Component>

Figure 15:
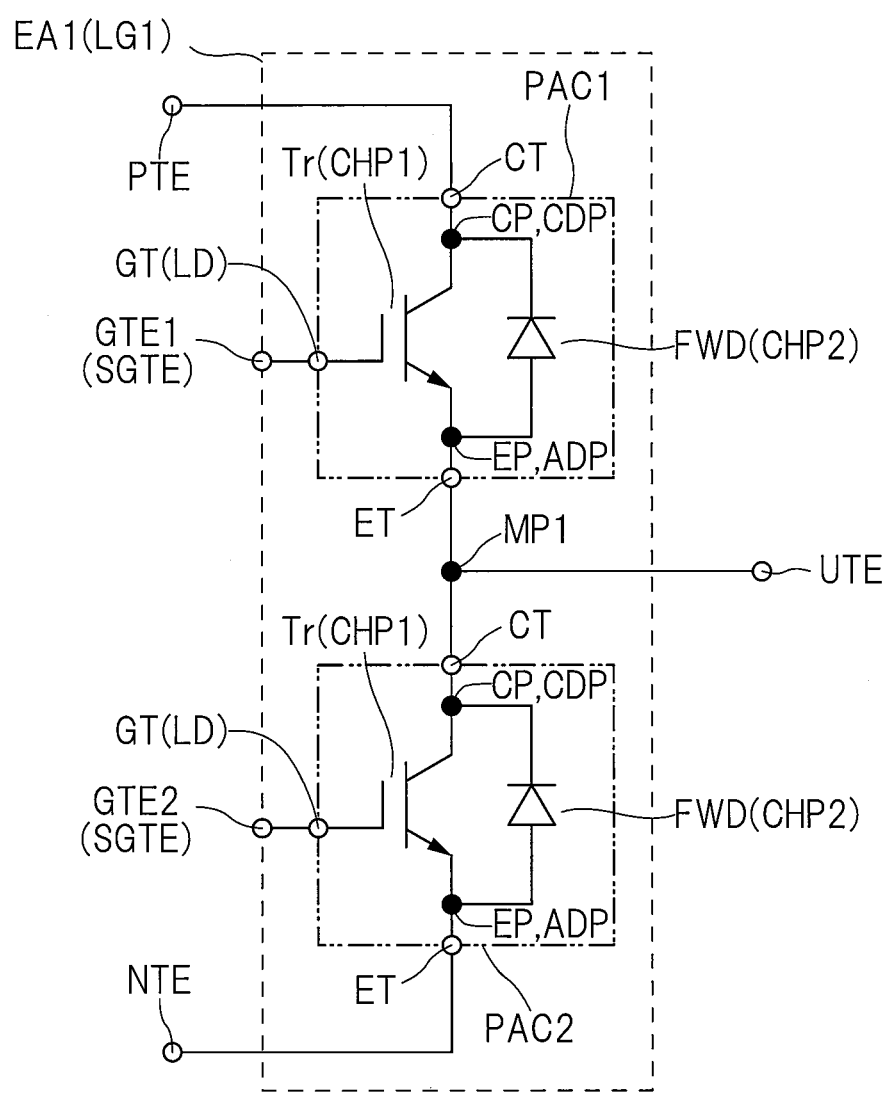
FIG. 15 is an explanatory diagram showing an equivalent circuit of the electronic device shown in FIG. 4.
Figure 16:
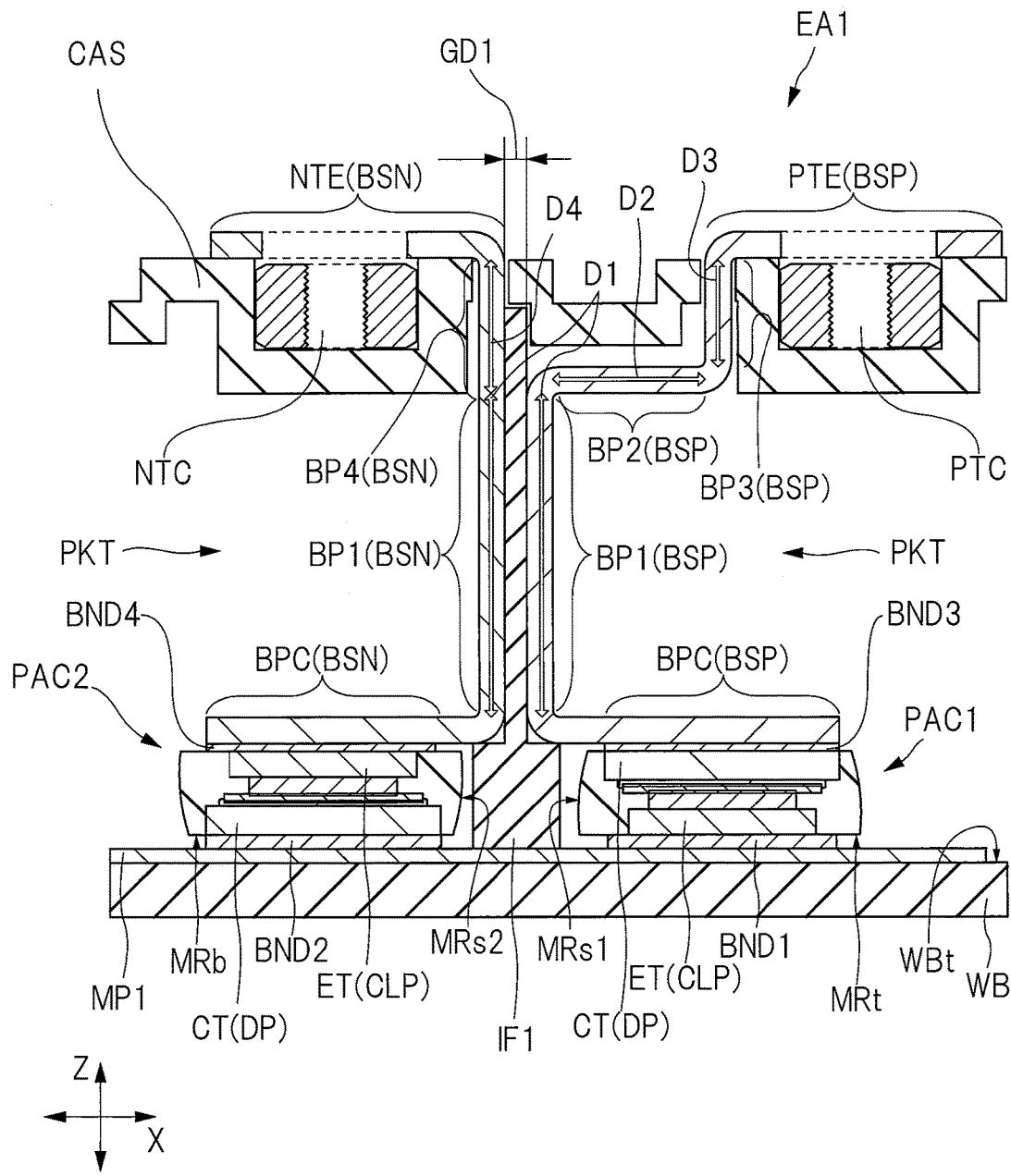
FIG. 16 is an enlarged cross-sectional view showing a periphery of a bus bar connected to the semiconductor device shown in FIG. 3 in an enlarged manner.
Figure 17:
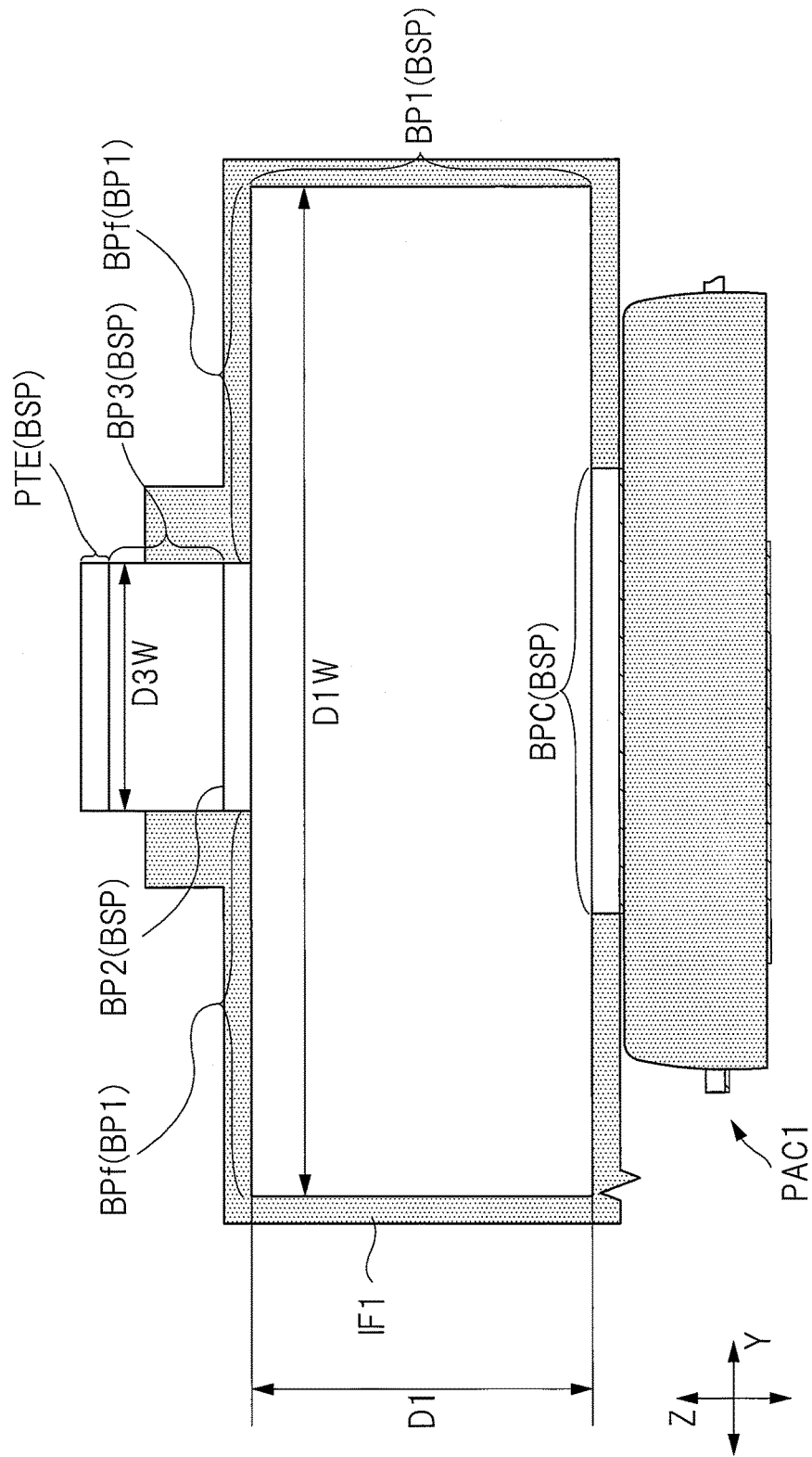
FIG. 17 is a side view of the bus bar and the semiconductor device shown in FIG. 16.
Figure 18:
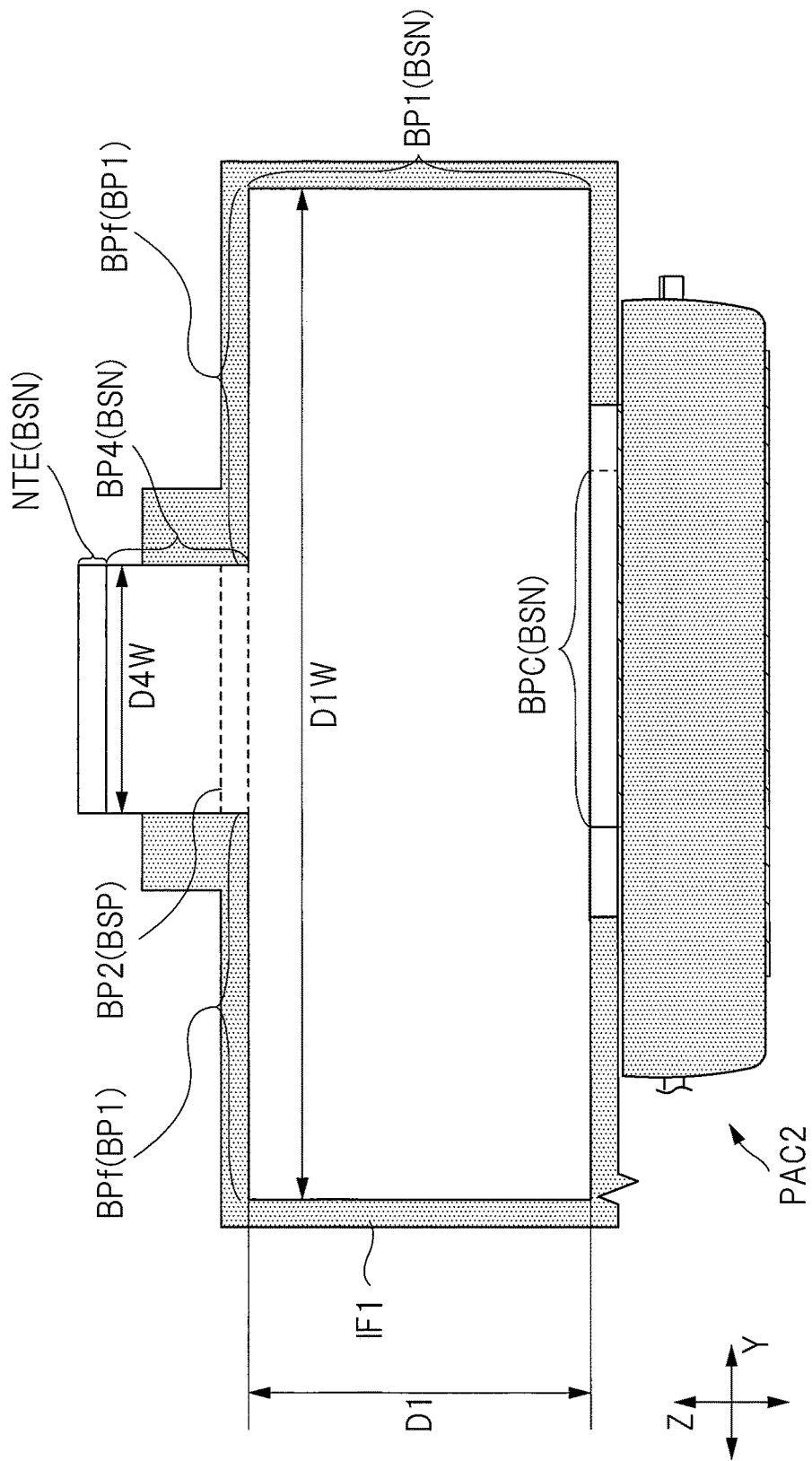
FIG. 18 is a side view of the bus bar and the semiconductor device shown in FIG. 16 as viewed from an opposite side of FIG. 17.

Next, a connection structure of the components of the electronic device EA1 shown in FIG. 4 will be described. FIG. 15 is an explanatory diagram showing an equivalent circuit of the electronic device shown in FIG. 4. FIG. 16 is an enlarged cross-sectional view showing a periphery of a bus bar connected to the semiconductor device shown in FIG. 3 in an enlarged manner. Also, FIG. 17 and FIG. 18 are side views of the bus bar and the semiconductor device shown in FIG. 16. FIG. 17 is a side view showing the insulating plate IF1 viewed from the side of the bus bar BSP shown in FIG. 16. Also, FIG. 18 is a side view showing the insulating plate IF1 viewed from the side of the bus bar BSN shown in FIG. 16.

As shown in FIG. 3, the electronic device EA1 has the conductor pattern MP1 formed on the upper surface WBt of the board WB. Further, the electronic device EA1 includes the semiconductor device PAC1 and the semiconductor device PAC2.

Also, as shown in FIG. 15, each of the semiconductor device PAC1 and the semiconductor device PAC2 includes the semiconductor chip CHP1 having the transistor Tr and the semiconductor chip CHP2 having the diode FWD. Each of the semiconductor device PAC1 and the semiconductor device PAC2 has the emitter terminal ET connected to the emitter electrode EP of the semiconductor chip CHP1 and the anode electrode ADP of the semiconductor chip CHP2 and the collector terminal CT connected to the collector electrode CP of the semiconductor chip CHP1 and the cathode electrode CDP of the semiconductor chip CHP2. Each of the semiconductor device PAC1 and the semiconductor device PAC2 has the gate terminal GT connected to the gate electrode GP (see FIG. 14) of the semiconductor chip CHP1 via the wire BW (see FIG. 14).

The collector electrode CP of the semiconductor chip CHP1 of the semiconductor device PAC1 shown in FIG. 15 is electrically connected to the terminal PTE via the collector terminal CT. Also, the emitter electrode EP of the semiconductor chip CHP1 of the semiconductor device PAC2 is electrically connected to the terminal NTE via the emitter terminal ET. The bus bar BSP shown in FIG. 16 corresponds to the transmission path that electrically connects the collector electrode CP of the semiconductor device PAC1 and the terminal PTE shown in FIG. 15. The bus bar BSN shown in FIG. 16 corresponds to the transmission path that electrically connects the emitter electrode EP of the semiconductor device PAC2 and the terminal NTE shown in FIG. 15.

Also, the emitter electrode EP of the semiconductor chip CHP1 of the semiconductor device PAC1 shown in FIG. 15 is electrically connected to the terminal UTE via the emitter terminal ET and the conductor pattern MP1. Further, the collector electrode CP of the semiconductor chip CHP1 of the semiconductor device PAC2 is electrically connected to the terminal UTE via the collector terminal CT and the conductor pattern MP1. The bus bar BSU shown in FIG. 3 and FIG. 4 corresponds to the transmission path that electrically connects the conductor pattern MP1 and the terminal UTE shown in FIG. 15.

Also, the collector terminal CT of the semiconductor device PAC2 and the emitter terminal ET of the semiconductor device PAC1 are electrically connected to each other via the conductor pattern MP1. In other words, the collector electrode CP of the semiconductor device PAC2 and the emitter electrode EP of the semiconductor device PAC1 are electrically connected to each other via the conductor pattern MP1. When the inverter circuit PWC described with reference to FIG. 1 is operated, the semiconductor device PAC1 operates as a high-side switch and the semiconductor device PAC2 operates as a low-side switch.

Further, the gate terminal GT of the semiconductor device PAC1 shown in FIG. 15 has a bent portion outside the sealing body MR (see FIG. 14), and is connected to the terminal GTE1 via the conductor pattern MP2 (see FIG. 3) formed on the board WB. In other words, the gate electrode GP (see FIG. 14) of the semiconductor chip CHP1 of the semiconductor device PAC1 is connected to the terminal GTE1 via the conductor pattern MP2 (see FIG. 3) formed on the board WB.

Likewise, the gate terminal GT of the semiconductor device PAC2 shown in FIG. 15 has a bent portion outside the sealing body MR (see FIG. 14), and is connected to the terminal GTE2 via the conductor pattern MP2 (see FIG. 3) formed on the board WB. In other words, the gate electrode GP (see FIG. 14) of the semiconductor chip CHP1 of the semiconductor device PAC2 is connected to the terminal GTE2 via the conductor pattern MP2 formed on the board WB.

Also, as shown in FIG. 16, each of the semiconductor device PAC1 and the semiconductor device PAC2 has a board-side main surface facing the upper surface WBt of the board WB and an opposite main surface located on an opposite side of the board-side main surface, and the bus bar BSP is bonded to the opposite main surface of the semiconductor device PAC1 and the bus bar BSN is bonded to the opposite main surface of the semiconductor device PAC2.

Specifically, the main surface MRt of the sealing body MR (see FIG. 14) of the semiconductor device PAC1 shown in FIG. 16 faces the upper surface WBt of the board WB. The clip CLP exposed from the main surface MRt of the sealing body MR of the semiconductor device PAC1 is bonded to the conductor pattern MP1 via a connection member BND1. Also, the die pad DP exposed from the main surface MRb of the sealing body MR of the semiconductor device PAC1 is bonded to a bonding portion BPC of the bus bar BSP via a connection member (conductive member, conductive adhesive, bonding material) BND3. The die pad DP of the semiconductor device PAC1 is electrically connected to the terminal PTE via the bus bar BSP.

Further, the main surface MRb of the sealing body MR (see FIG. 14) of the semiconductor device PAC2 shown in FIG. 16 faces the upper surface WBt of the board WB. The die pad DP exposed from the main surface MRb of the sealing body MR of the semiconductor device PAC2 is bonded to the conductor pattern MP1 via a connection member (conductive member, conductive adhesive, bonding material) BND2. The clip CLP exposed from the main surface MRt of the sealing body MR of the semiconductor device PAC2 is bonded to a bonding portion BPC of the bus bar BSN via a connection member (conductive member, conductive adhesive, clip bonding material, bonding material) BND4. The clip CLP of the semiconductor device PAC2 is electrically connected to the terminal NTE via the bus bar BSN.

Each of the connection members BND1, BND2, BND3, and BND4 shown in FIG. 16 is made of a conductive material such as solder or conductive resin like the conductive adhesive ADH1 and the conductive adhesive ADH2 described with reference to FIG. 14.

Also, the bus bar BSU shown in FIG. 3 and FIG. 4 is electrically connected to the conductor pattern MP1. Though illustration thereof is omitted in FIG. 3, the bus bar BSU is bonded to the conductor pattern MP1 via the same conductive material as the connection member BND1 shown in FIG. 16. The clip CLP of the semiconductor device PAC1 and the die pad DP of the semiconductor device PAC2 are electrically connected to the terminal UTE via the conductor pattern MP1 and the bus bar BSU.

The bus bar BSN, the bus bar BSP, and the bus bar BSU shown in FIG. 3 are bar-shaped (plate-like) conductive members disposed in a path that electrically connects the terminal of the semiconductor device and the external terminal of the electronic device, and are configured to reduce the transmission loss in the transmission path. For example, the bus bar BSN, the bus bar BSP, and the bus bar BSU shown in FIG. 3 are made of a material having high electric conductivity. Examples of the material having high electric conductivity include a metal material containing copper (Cu) as a main component, a metal material containing aluminum (Al) as a main component, and the like. Further, for example, the bus bar BSN and the bus bar BSP have a larger cross-sectional area of the transmission path as compared with such members as the lead LD shown in FIG. 3.

<Layout of Bus Bar>

Next, the layout of the bus bar shown in FIG. 4 will be described. In the following description, for example, when an extension distance of a portion of a constituent member of the electronic device EA1 is described like "an extension distance D1 of a portion BP1 of the bus bar BSP in the Z direction", the extension distance is defined as follows. For example, the bus bar BSP has extension portions (portions BP1, BP2, and BP3 and bonding portion BPC) extending in the X direction or the Z direction and bent portions between the two extension portions. In the following description, the term "extension distance" indicates a length of the extension portion excluding the length of the bent portion. For example, "the extension distance D1 of the portion BP1 of the bus bar BSP in the Z direction" does not include the thickness of the portion BP2 and the thickness of the bonding portion BPC, and the length of the portion BP1 extending in the Z direction corresponds to this. Also, since the portion BP1 of the bus bar BSN is defined as a portion that faces the portion BP1 of the bus bar BSP, "the extension distance D1 of the portion BP1 of the bus bar BSN in the Z direction" is equal to "the extension distance D1 of the portion BP1 of the bus bar BSP in the Z direction".

Various performance improvement requests for an electronic device including an inverter circuit such as the electronic device EA1 include a request to reduce inductance and impedance of a transmission path that connects a transistor operating as a switch and an external terminal. In particular, in a path that connects the terminal PTE to which a relatively high potential is supplied and the transistor Tr and a path that connects the terminal NTE to which a relatively low potential is supplied and the transistor Tr among the transmission paths shown in FIG. 15, the loss of the input voltage can be reduced by reducing the inductance. In addition, surge noise is reduced by reducing the inductance of the paths mentioned above. In this case, it is unnecessary to mount a separate component such as a surge filter for reducing the surge noise, and it is thus preferable from the viewpoint of reducing the number of components or miniaturizing the device.

Therefore, in the case of a module having a structure in which a semiconductor part and an external terminal are connected by a bus bar as in the electronic device EA1, it is preferable to minimize the parasitic inductance generated in the bus bar. As a method of reducing the parasitic inductance generated in the bus bar, it is preferable to shorten the extension distance of the bus bar (wiring path distance) in the first place. Further, as shown in FIG. 16, in a portion where a part of the bus bar BSP on the high side and a part of the bus bar BSN on the low side extend in parallel in a state of facing each other, mutual inductance is generated between the bus bar BSP and the bus bar BSN. In this case, the parasitic inductance generated in the bus bars BSP and BSN can be reduced by the influence of the mutual inductance. In the method of reducing the parasitic inductance generated in the bus bars BSP and BSN by the use of the mutual inductance as described above, the reduction effect of the parasitic inductance becomes greater as the area of the portion where the bus bar BSP and the bus bar BSN face each other becomes larger. In addition, the reduction effect of the parasitic inductance becomes greater when the separation distance between the bus bar BSP and the bus bar BSN is smaller because the influence of mutual inductance can be increased.

Therefore, when considering the layout of the bus bars BSP and BSN, it is preferable from the viewpoint of improving the power conversion efficiency that the extension distance of the bus bars BSP and BSN (wiring path distance) is shortened and the area of the portions extending in parallel in a state of facing each other at a short distance is increased.

As described above, in the case of the electronic device EA1, the semiconductor device PAC1 and the semiconductor device PAC2 are mounted on the board WB in a state of being inverted upside down. In other words, the front surface electrode (emitter electrode EP shown in FIG. 14) of the semiconductor chip CHP1 (see FIG. 14) of the semiconductor device PAC1 is provided between the board WB and the back surface electrode (collector electrode CP shown in FIG. 14) of the semiconductor chip CHP1 of the semiconductor device PAC1. Also, the back surface electrode of the semiconductor chip CHP1 of the semiconductor device PAC2 is provided between the board WB and the front surface electrode of the semiconductor chip CHP1 of the semiconductor device PAC2.

Therefore, in the case of the electronic device EA1, each of the bus bar BSP and the bus bar BSN does not reach the conductor pattern MP1 on the board WB, and the semiconductor device PAC1 or PAC2 is provided between the bus bar BSP or BSN and the board WB. Accordingly, it is possible to shorten the transmission path distance configured of the bus bars BSP and BSN.

Also, in the case of a power module such as the electronic device EA1, the potential difference between the potential (high side potential) supplied to the bus bar BSP and the potential (low side potential) supplied to the bus bar BSN is very large, for example, several hundred volts. Therefore, it is necessary to ensure insulation between the bus bar BSP and the bus bar BSN. From the viewpoint of improving the dielectric strength between the bus bar BSP and the bus bar BSN, for example, it is effective to interpose an insulating material such as the insulating plate (insulator) IF1 shown in FIG. 16 between the bus bar BSP and the bus bar BSN.

Meanwhile, outside the casing CAS, the insulating member is not provided between the bus bar BSP and the bus bar BSN as denoted by the terminals PTE and NTE in FIG. 16. Accordingly, the degree of freedom in the mounting of the electronic device EA1 can be improved. Thus, in the case of the terminals PTE and NTE exposed to the outside of the casing CAS, a method of improving the dielectric strength by increasing the separation distance between the terminal PTE and the terminal NTE is adopted. In particular, when discharge occurs between the terminal PTE and the terminal NTE, since the discharge occurs along the surface (exposed surface to the outside) of the casing CAS between the terminal PTE and the terminal NTE, the dielectric strength can be improved by increasing the creepage distance between the terminal PTE and the terminal NTE. In the present embodiment, the separation distance between the terminal PTE and the terminal NTE is larger than the separation distance GD1 at the portion BP1 where the separation distance between the bus bar BSP and the bus bar BSN is the smallest, and is, for example, 8.8 mm. In addition, a center-to-center distance between the through hole formed in the terminal PTE and the through hole formed in the terminal NTE is 23 mm.

As described above, it is necessary that the bus bars BSP and BSN have portions that extend in parallel in a state of facing each other at a short distance and the creepage distance is increased outside the casing CAS. Therefore, as shown in FIG. 16, at least one of the bus bars BSP and BSN has the portion BP2 that extends in a direction of increasing the separation distance between the bus bar BSP and the bus bar BSN. In the example shown in FIG. 16, the bus bar BSP has the portion BP2 extending in the X direction away from the bus bar BSN.

Also, when the dielectric strength is taken into consideration, it is necessary to interpose the insulating material between the portion BP2 of the bus bar BSP and the bus bar BSN. Therefore, the bus bar BSP has the portion BP3 located between the portion BP2 and the terminal (exposed portion) PTE and extending in the Z direction. As described above, the separation distance between the exposed portion (terminal NTE) of the bus bar BSN and the exposed portion (terminal PTE) of the bus bar BSP can be sufficiently increased by providing the portion BP3 in the bus bar BSP.

As described above, it is preferable that the extension distance of the bus bars BSP and BSN (wiring path distance) is shortened and the area of the portions BP1 extending in parallel in a state of facing each other at a short distance is increased. From this viewpoint, it is preferable that an extension distance D3 of the portion BP3 of the bus bar BSP in the Z direction is shortened as much as possible. By shortening the extension distance D3 of the portion BP3 in the Z direction, the extension distance D1 of the portion BP1 of the bus bar BSP in the Z direction can be increased. Thus, by increasing the extension distance D1, it is possible to increase the area of the region where the portion BP1 of the bus bar BSP and the portion BP1 of the bus bar BSN face each other.

The structure of the bus bar BSP and the bus bar BSN provided in the electronic device EA1 shown in FIG. 16 can be expressed as follows. Namely, the bus bar BSP has the bonding portion BPC bonded to the emitter terminal ET of the semiconductor device (semiconductor part) PAC1 and the exposed portion (terminal PTE) exposed to the outside of the casing CAS on the concave portion PTC of the casing CAS. The bus bar BSN has the bonding portion BPC bonded to the collector terminal CT of the semiconductor device (semiconductor part) PAC2 and the exposed portion (terminal NTE) exposed to the outside of the casing CAS on the concave portion NTC of the casing CAS. Also, the bus bar BSP and the bus bar BSN respectively have the portions BP1 facing each other with the insulating plate IF1 interposed therebetween and extending in the Z direction intersecting with the upper surface WBt of the board WB. The bus bar BSP has the portion BP2 located between the portion BP1 and the terminal PTE and extending in the X direction away from the bus bar BSN and the portion BP3 located between the portion BP2 and the terminal PTE and extending in the Z direction. The portions BP1 of the bus bar BSP and the bus bar BSN, the portion BP2 of the bus bar BSP, and the portion BP3 of the bus bar BSP are disposed in the housing PKT of the casing CAS. The extension distance D3 of the portion BP3 in the Z direction is shorter than the extension distance D2 of the portion BP2 in the X direction.

As described above, in the case of the electronic device EA1, the extension distance D3 of the portion BP3 of the bus bar BSP is shorter than the extension distance D2 of the portion BP2. In the example shown in FIG. 16, the extension distance D3 is, for example, 5.0 mm, and the extension distance D2 is, for example, 6.6 mm. If the thickness (height in the Z direction) of the casing CAS is constant, the extension distance D1 of the portion BP1 of the bus bar BSP can be increased by reducing the extension distance D3 as much as possible. In the example shown in FIG. 16, the extension distance D1 of the portion BP1 of the bus bar BSP and the extension distance D1 of the portion BP1 of the bus bar BSN in the Z direction are equal to each other and are 14.8 mm. Namely, in the example shown in FIG. 16, the extension distance D1 is longer than the extension distance D3 of the portion BP3. In addition, in the example shown in FIG. 16, the extension distance D1 is longer than the extension distance D2 of the portion BP2.

Further, although it is preferable that the extension distance D3 is shortened as much as possible, the distance D3 needs to have a certain length in order to ensure that the portion BP2 is covered with the casing CAS. On the other hand, since the insulating plate (insulator) IF1 is interposed between the portion BP1 of the bus bar BSP and the portion BP1 of the bus bar BSN, the dielectric strength can be ensured even if the separation distance GD1 between the portions BP1 facing each other is made small. Therefore, in the example shown in FIG. 16, the separation distance GD1 between the portion BP1 of the bus bar BSP and the portion BP1 of the bus bar BSN is shorter than the extension distance D3 of the portion BP3 of the bus bar BSP in the Z direction. In the example shown in FIG. 16, the portion BP1 of the bus bar BSP and the portion BP1 of the bus bar BSN are arranged at a regular interval, and a value of the separation distance GD1 is, for example, 1.0 mm. The plate thickness (thickness) of each of the bus bar BSP and the bus bar BSN is 1.2 mm, and a value of the separation distance GD1 is smaller than the plate thickness of each of the bus bar BSP and the bus bar BSN. The influence of mutual inductance generated in the bus bar BSP and the bus bar BSN is increased by shortening the separation distance GD1, so that the effect of reducing the parasitic inductance is increased.

In the case of the electronic device EA1, the portion BP2 extending in the X direction is provided in the bus bar BSP, but the portion corresponding to the portion BP2 of the bus bar BSP is not provided in the bus bar BSN. In addition, in order to cover the portion BP2 of the bus bar BSP with the casing CAS, the portion BP2 of the bus bar BSP is located at a position lower than the terminal NTE and the terminal PTE. Therefore, the bus bar BSN has a portion BP4 disposed between the portion BP1 and the terminal NTE that is the exposed portion and extending in the Z direction. The portion BP4 of the bus bar BSN does not face the portion BP1 of the bus bar BSP. Also, the portion BP4 of the bus bar BSN faces the portion BP3 of the bus bar BSP with a part of the casing CAS interposed therebetween. The portion BP4 of the bus bar BSN extends in the Z direction and an extension distance D4 of the portion BP4 in the Z direction is equal to the sum of the extension distance D3 of the portion BP3 of the bus bar BSP in the Z direction and the plate thickness of the portion BP2 of the bus bar BSP. In the example shown in FIG. 16, a value of the extension distance D4 is, for example, 6.2 mm.

In the present embodiment, the example in which the portion BP2 is formed only in the bus bar BSP has been described. However, the portion BP2 is provided for the purpose of ensuring the sufficient separation distance between the terminal NTE and the terminal PTE from the viewpoint of dielectric strength. Therefore, it is sufficient if at least one of the bus bar BSP and the bus bar BSN may be provided with the portion BP2. Accordingly, a modification of the electronic device EA1 may have the configuration in which the portion BP2 is not provided in the bus bar BSP and the portion BP2 is provided in the bus bar BSN. Alternatively, it is also possible to provide the portion BP2 in both the bus bar BSP and the bus bar BSN. In this case, since the extension distance D2 of the portion BP2 shown in FIG. 16 can be reduced to about a half of the example shown in FIG. 16, the extension distance D2 may be shorter than the extension distance D3 in some cases.

Further, in order to ensure the insulation between the bus bar BSP and the bus bar BSN in the housing PKT, the insulating plate IF1 extends longer than the portion BP1 of the bus bar BSP and the portion BP1 of the bus bar BSN in the Z direction. The insulating plate IF1 extends in the Z direction. A part (upper end part) of the insulating plate IF1 is located at a position higher than the portion BP2 of the bus bar BSP. Also, a part (lower end part) of the insulating plate IF1 is located at a position lower than the bonding portion BPC of the bus bar BSP and the bonding portion BPC of the bus bar BSN.

In the case of the electronic device EA1 in which the two semiconductor devices PAC1 and PAC2 are mounted on the board WB, as can be seen from FIG. 3, there is a margin in the layout on the board WB. Therefore, the bus bar BSP and the semiconductor device PAC1 connected to the terminal PTE and the bus bar BSN and the semiconductor device PAC2 connected to the terminal NTE can be demarcated with the insulating plate IF1 as a boundary. In the Z direction, the terminal PTE overlaps with the semiconductor device PAC1. Further, in the Z direction, the terminal NTE overlaps with the semiconductor device PAC1. In the Z direction, the portion BP2 of the bus bar BSP overlaps with the bonding portion BPC.

As shown in FIG. 3 and FIG. 16, the semiconductor device PAC1 has a side surface MRs1 facing the semiconductor device PAC2. Also, the semiconductor device PAC2 has a side surface MRs2 facing the side surface MRs1 of the semiconductor device PAC1. In addition, as shown in FIG. 3, the portion BP1 of the bus bar BSP, the portion BP1 of the bus bar BSN, and the insulating plate IF1 are respectively disposed between the semiconductor device PAC1 and the semiconductor device PAC2 in a plan view. Further, as shown in FIG. 16, each of the bus bar BSP and the bus bar BSN is not present between the semiconductor device PAC1 and the semiconductor device PAC2, and a part (lower end part) of the insulating plate IF1 is located between the side surface MRs1 of the semiconductor device PAC1 and the side surface MRs2 of the semiconductor device PAC2 in a cross-sectional view (or in a side view).

As will be described later in detail, when the number of semiconductor parts mounted on one board WB increases, it is sometimes difficult to dispose the insulating plate IF1 between the semiconductor device PAC1 and the semiconductor device PAC2 due to the layout restrictions. However, when the degree of freedom of the layout of the semiconductor devices PAC1 and PAC2 is high as in the board WB of the electronic device EA1, it is preferable that a part (lower end part) of the insulating plate IF1 is disposed between the side surface MRs1 of the semiconductor device PAC1 and the side surface MRs2 of the semiconductor device PAC2. With this configuration, the high dielectric strength characteristics can be achieved.

Also, as described above, in the method of reducing the parasitic impedance generated in the bus bars BSP and BSN by the use of the mutual inductance, the reduction effect of the parasitic inductance becomes greater as the area of the portion where the bus bar BSP and the bus bar BSN face each other becomes larger. Therefore, in the case of the electronic device EA1 of the present embodiment, the widths of the portion BP1 of the bus bar BSP and the portion BP1 of the bus bar BSN are made larger than the other portions, thereby increasing the facing area.

Specifically, as shown in FIG. 17, the portion BP1 of the bus bar BSP extends in the Y direction intersecting with each of the Z direction and the X direction (see FIG. 16). Further, an extension distance (width) D1W of the portion BP1 in the Y direction is longer than the extension distance D1 of the portion BP1 in the Z direction. Further, the extension distance D1W of the portion BP1 in the Y direction is longer than an extension distance (width) D3W of the portion BP3 in the Y direction. Likewise, as shown in FIG. 18, the portion BP1 of the bus bar BSN extends in the Y direction intersecting with each of the Z direction and the X direction (see FIG. 16). Also, the extension distance (width) D1W of the portion BP1 in the Y direction is longer than the extension distance D1 of the portion BP1 in the Z direction. Further, the extension distance D1W of the portion BP1 in the Y direction is longer than an extension distance (width) D4W of the portion BP4 in the Y direction.

The shape of the portion BP1 shown in FIG. 17 and FIG. 18 can be expressed as follows. Namely, the portion BP1 of the bus bar BSP shown in FIG. 17 has a central portion located between the portion BP2 and the bonding portion BPC and overhang portions BPf on both sides of the central portion in a side view. Likewise, the portion BP1 of the bus bar BSN shown in FIG. 18 has a central portion located between the portion BP4 and the bonding portion BPC and overhang portions BPf on both sides of the central portion in a side view.

As described above, since the parasitic inductance generated in the bus bar can be reduced by shortening the extension distance of the bus bar (wiring path distance), when the extension distance D1 of the portion BP1 in the Z direction becomes extremely long, the parasitic inductance rather becomes larger in some cases. However, even if the extension distance D1W in the Y direction shown in FIG. 17 and FIG. 18 is increased, the parasitic inductance does not increase. Therefore, by increasing the area of the overhang portion BPf shown in FIG. 17 and FIG. 18 within the range capable of being installed in the housing PKT shown in FIG. 4, the increase in parasitic inductance can be suppressed (increase in the extension distance D1 of the portion BP1 in the Z direction can be suppressed), and the influence of mutual inductance can be increased.

In the example shown in FIG. 17 and FIG. 18, the length (width, extension distance) of each overhang portion BPf in the Y direction is larger than the extension distance D3W of the portion BP3 in the Y direction shown in FIG. 17 and the extension distance D4W of the portion BP4 in the Y direction shown in FIG. 18.

<Manufacturing Method of Semiconductor Device>

Figure 19:
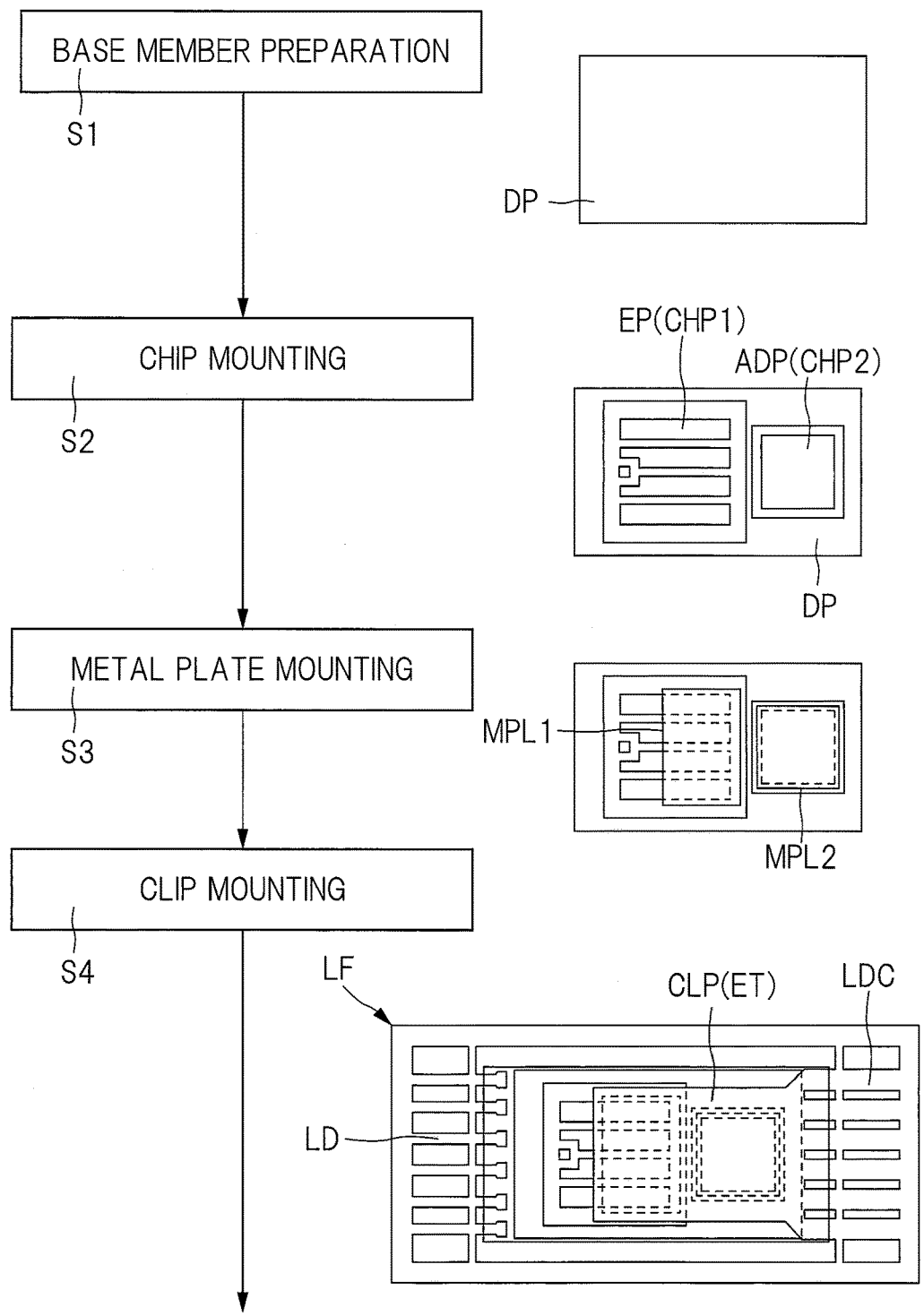
FIG. 19 is an explanatory diagram showing an assembly flow of the semiconductor device shown in FIG. 14.
Figure 20:
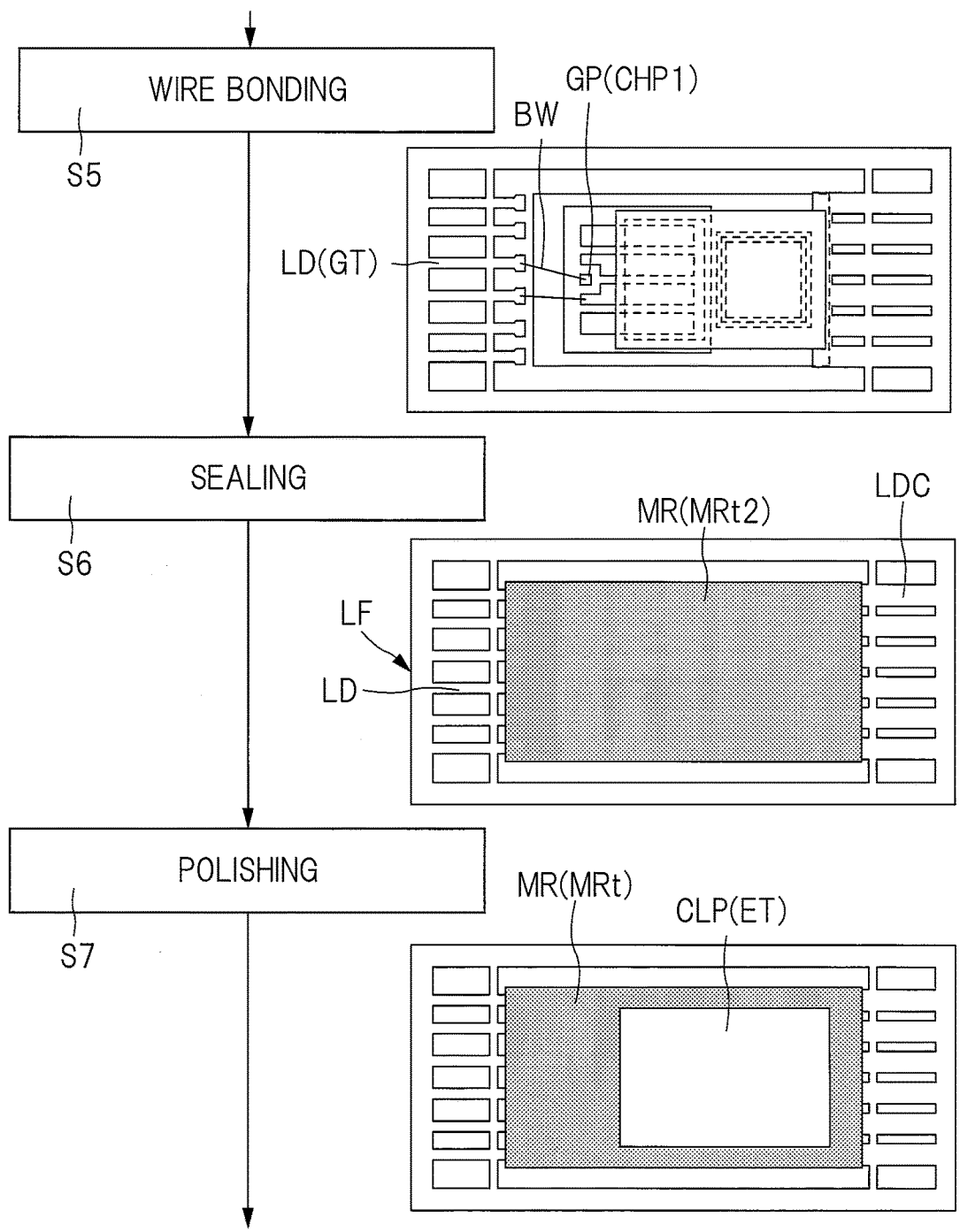
FIG. 20 is an explanatory diagram showing the assembly flow of the semiconductor device continued from FIG. 19.
Figure 21:
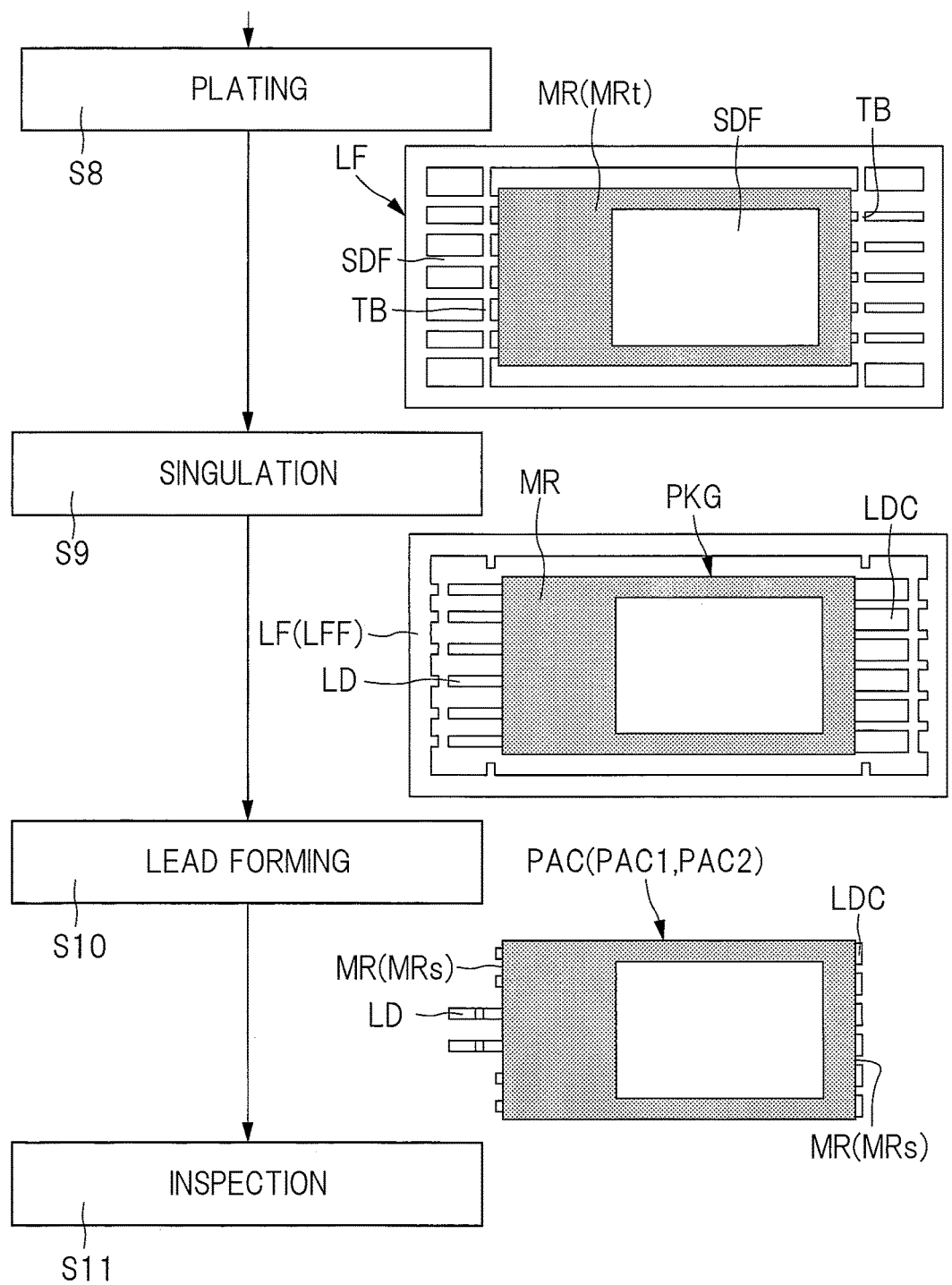
FIG. 21 is an explanatory diagram showing the assembly flow of the semiconductor device continued from FIG. 20.

Next, a manufacturing method of the semiconductor device PAC1 and the semiconductor device PAC2 mounted in the electronic device EA1 shown in FIG. 3 will be described. However, the semiconductor device PAC1 and the semiconductor device PAC2 have the same configuration as described above. Therefore, in the following description of the manufacturing method of the semiconductor device PAC1 and the semiconductor device PAC2, parts in common with each other will be described as a semiconductor device PAC. FIGS. 19 to 21 are explanatory diagrams showing an assembly flow of the semiconductor device shown in FIG. 13 and FIG. 14. Note that plan views showing the outline of respective steps are attached near the respective steps in FIGS. 19 to 21. The following description will be made with reference to plan views shown in FIGS. 19 to 21 and figures (for example, FIG. 13 and FIG. 14) described above in principle.

<Preparation of Base Member>

First, in a step S1 (base member preparation step) shown in FIG. 19, the die pad DP serving as the base member for mounting the semiconductor chip is prepared. In the case where the die pad DP is formed integrally with the lead frame LF (see plan view of step S4) as a modification of the present embodiment, the lead frame LF in which the die pad DP and the plurality of leads LD are integrally formed may be prepared in the step S1.

As shown in FIG. 14, the thickness of the die pad DP of the present embodiment is greater than the thicknesses of the lead LD and the lead LDC. In this case, the heat dissipation efficiency of the heat dissipation path passing through the die pad DP can be improved. However, since the thickness of the die pad DP is greater than that of the lead LD, the die pad DP is manufactured as a member independent of the lead frame LF (see FIG. 19). Therefore, in the case of the present embodiment, the die pad DP serving as a chip mounting portion is prepared in the step S1. The die pad DP is made of, for example, a metal material containing copper as a main component.

<Chip Mounting>

Next, in a step S2 (chip mounting step) shown in FIG. 19, the semiconductor chip CHP1 and the semiconductor chip CHP2 are mounted on the die pad DP. As shown in FIG. 14, in this step, the semiconductor chip CHP1 is mounted via the conductive adhesive ADH1 such that the collector electrode CP formed on the back surface CHPb of the semiconductor chip CHP1 faces the die pad DP. Note that examples of the conductive adhesive ADH1 include high melting point solder and the like. Also, the semiconductor chip CHP2 is mounted via the conductive adhesive ADH1 such that the cathode electrode CDP formed on the back surface CHPb of the semiconductor chip CHP2 faces the die pad DP.

In this step, on the die pad DP, the paste-like conductive adhesive ADH1 is disposed in each of a planned region (chip mounting region) where the semiconductor chip CHP1 is to be mounted and a planned region (chip mounting region) where the semiconductor chip CHP2 is to be mounted. Thereafter, the back surface CHPb (see FIG. 6 and FIG. 9) of each of the semiconductor chip CHP1 and the semiconductor chip CHP2 is pressed to the conductive adhesive ADH1 to mount each of the semiconductor chip CHP1 and the semiconductor chip CHP2 on the die pad DP.

In the case where solder is used for each of the conductive adhesives ADH1, ADH2, and ADH3 shown in FIG. 14, the heat treatment (reflow) is not performed in the step S2, and the reflow is performed after the clip mounting step shown as a step S4. On the other hand, in the case where conductive resin containing metal particles such as silver (Ag) in the thermosetting resin is used for each of the conductive adhesives ADH1, ADH2, and ADH3, the heat treatment (cure baking) at a temperature at which the conductive adhesive ADH1 is cured may be performed in the step S2. Also, even in the case where the conductive resin is used for each of the conductive adhesives ADH1, ADH2, and ADH3, the cure baking may be performed after the clip mounting step shown as the step S4.

In the case where the solder having a higher melting point is used in the order of the conductive adhesives ADH1, ADH2, and ADH3, the reflow may be performed in this step. However, after the reflow is performed, the washing treatment needs to be performed to remove residuals of flux components. Therefore, from the viewpoint of improving the manufacturing efficiency, it is better to reduce the number of times of reflow.

<Metal Plate Mounting>

Next, in a step S3 (metal plate mounting step) shown in FIG. 19, the metal plate MPL1 and the metal plate MPL2 are mounted on the semiconductor chip CHP1 and the semiconductor chip CHP2, respectively. Specifically, the metal plate MPL1 is mounted on the emitter electrode EP of the semiconductor chip CHP1 via the conductive adhesive ADH2 (see FIG. 14). Also, the metal plate MPL2 is mounted on the anode electrode ADP of the semiconductor chip CHP2 via the conductive adhesive ADH2.

In this step, the paste-like conductive adhesive ADH2 is disposed on each of the emitter electrode EP of the semiconductor chip CHP1 and the anode electrode ADP of the semiconductor chip CHP2. Thereafter, one surface of each of the metal plates MPL1 and MPL2 is pressed to the conductive adhesive ADH2 to mount the metal plates MPL1 and MPL2.

It has already been described that the timing of performing the heat treatment (reflow or cure baking) differs depending on the materials used for each of the conductive adhesives ADH1, ADH2, and ADH3 shown in FIG. 14. The same is true of this step, and redundant description will be omitted.

Further, this step is performed because the clip CLP is formed integrally with the lead frame LF. If the clip CLP is formed separately from the frame LF, this step may be omitted. In addition, if a part of the clip CLP is bent and the metal plates MPL1 and MPL2 are not used, this step may be omitted.

<Clip Mounting>

Next, in the step S4 (clip mounting step) shown in FIG. 19, the clip CLP is mounted on the semiconductor chip CHP1 and the semiconductor chip CHP2. Specifically, the clip CLP is mounted on the metal plate MPL1 and the metal plate MPL2 via the conductive adhesive ADH3 (see FIG. 14).

In this step, the paste-like conductive adhesive ADH3 is first disposed on the upper surface of each of the metal plate MPL1 and the metal plate MPL2. Thereafter, the lead frame LF in which the clip CLP and the plurality of leads LD are integrally formed is prepared, and the clip CLP is aligned such that the lower surface of the clip CLP covers the front surfaces CHPt (see FIG. 5 and FIG. 8) of the semiconductor chip CHP1 and the semiconductor chip CHP2. In the case where the clip CLP is formed integrally with the lead frame LF as in the present embodiment, the plurality of leads LD and the chip CLP can be easily aligned by aligning the lead frame LF and the die pad DP (or lead frame and semiconductor chip).

Then, the lower surface of the clip CLP is pressed to the conductive adhesive ADH3 to mount the clip CLP on the semiconductor chip CHP1 and the semiconductor chip CHP2.

Also, the clip CLP is formed integrally with the lead frame LF having the plurality of leads LD. Therefore, in this step, the plurality of leads LD are arranged around the die pad DP. This step can be regarded as a lead frame mounting step. In the case where both the clip CLP and the die pad DP are formed separately from the lead frame LF, the lead frame LF is preferably adhered and fixed to the die pad DP or the clip CLP in advance.

<Wire Bonding>

Next, in a step S5 (wire bonding step) shown in FIG. 20, the gate electrode GP of the semiconductor chip CHP1 and the lead LD serving as the gate terminal GT are electrically connected to each other via the wire BW. Also, in this step, the sensing electrode ESP for emitter and the lead LD serving as the signal terminal ST shown in FIG. 13 are electrically connected via the wire BW.

In this step, for example, one end of the wire BW is connected to the electrode (gate electrode GP or emitter electrode EP) of the semiconductor chip CHP1, and then a wire loop is formed. Thereafter, the wire BW is connected to a part (bonding region) of the lead LD, and then the wire is cut, whereby the wire BW shown in FIG. 14 is obtained.

Note that there are various modifications for the method of electrically connecting the electrode of the semiconductor chip CHP1 and the lead LD. For example, a belt-like metal ribbon may be used for the connection instead of the wire BW.

<Sealing>

Figure 22:
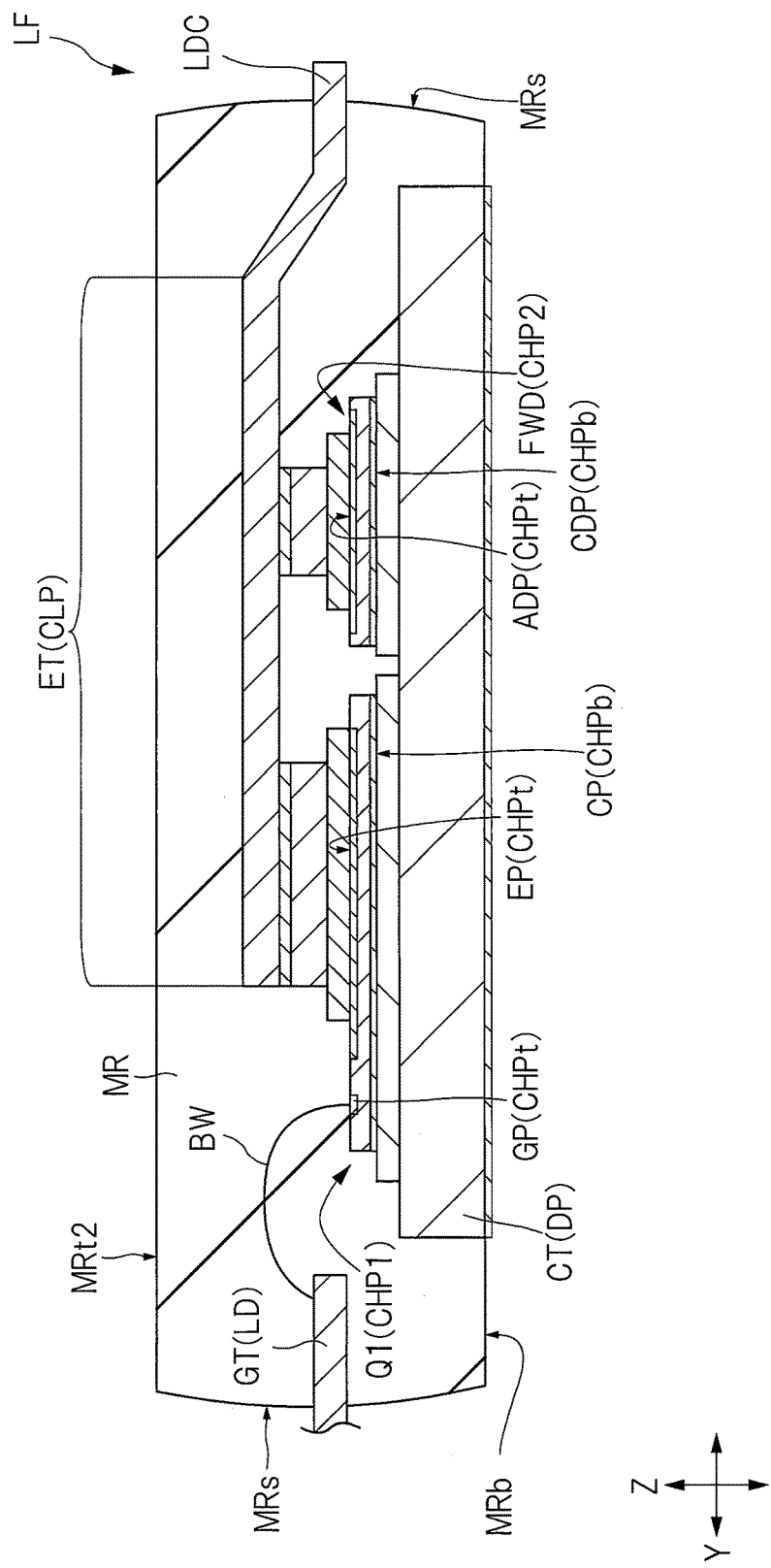
FIG. 22 is an enlarged cross-sectional view showing a state where a sealing body which seals a semiconductor chip is formed in the sealing step shown in FIG. 20.

Next, in a step S6 (sealing step) shown in FIG. 20, the semiconductor chip CHP1, the semiconductor chip CHP2, and the wire BW are sealed with resin. FIG. 22 is an enlarged cross-sectional view showing a state where the sealing body which seals the semiconductor chip is formed in the sealing step shown in FIG. 20.

In the present embodiment, in the sealing step, the sealing body MR is formed by, for example, a transfer molding method. In the transfer molding method, the resin is press-fitted into a cavity of a molding die (not shown) in a state where the lead frame LF is fixed in the molding die. The resin constituting the sealing body MR is mainly composed of, for example, epoxy-based thermosetting resin and contains filler particles such as silica. When the cavity of the molding die is filled with the resin, the shape of the sealing body MR shown in FIG. 20 and FIG. 22 is obtained. By heating the resin in the molding die to cure a part of the resin to some extent, the lead frame LF can be taken out from the molding die. Further, after taking out the lead frame LF from the molding die and further heating it in a heating furnace (baking furnace) to bring the resin into a fully cured state (state where the thermosetting resin component is entirely cured), the sealing body MR shown in FIG. 22 is obtained.

After this step, before performing a polishing step shown in FIG. 20, the clip CLP is sealed with the sealing body MR as shown in FIG. 22. A main surface MRt2 of the sealing body MR is a surface different from the main surface MRt shown in FIG. 14. On the other hand, the die pad DP is exposed from the main surface MRb of the sealing body MR. As a modification of the present embodiment, it is also possible to form the sealing body MR such that the clip CLP is exposed from the sealing body MR in the sealing step.

In the case where the clip CLP is sealed with the sealing body MR in the sealing step as in the present embodiment, the top of the wire loop of the wire BW and the cavity can be sufficiently separated even when the difference in height between the top of the wire loop and the upper surface of the clip CLP is small. Therefore, it is possible to suppress the deformation of the wire BW in the sealing step. However, in the case where the wire BW is not used or the above-described difference in height is sufficiently ensured and the possibility of deformation of the wire BW is low, the upper surface of the clip CLP may be exposed in this step.

Also, with respect to the side of the main surface MRb of the sealing body MR, the above-described reason is not present. Therefore, in this step, as shown in FIG. 22, the sealing body MR is formed such that the lower surface of the die pad DP is exposed from the main surface MRb of the sealing body MR.

<Polishing>

Next, in a step S7 (polishing step) shown in FIG. 20, the main surface (upper surface) MRt2 located on an opposite side of the main surface MRb (see FIG. 22) of the sealing body MR is polished to expose the upper surface of the clip CLP from the main surface MRt of the sealing body MR.

In this step, the main surface MRt2 of the sealing body MR shown in FIG. 22 is mechanically polished by using a grindstone. Note that there are various modifications for the polishing method, and chemical mechanical polishing (CMP) may be performed other than the mechanical polishing method. By this step, as shown in FIG. 14, the upper surface of the clip CLP is exposed on the main surface MRt of the sealing body MR.

As described above, this step can be omitted when the sealing body MR is formed such that the upper surface of the clip CLP is exposed from the sealing body MR in the sealing step.

<Plating>

Next, in a step S8 (plating step) shown in FIG. 21, as shown in FIG. 14, a metal film is formed on the upper surface of the clip CLP and the lower surface of the die pad DP exposed from the sealing body MR and the exposed portions of the lead LD and the lead LDC from the sealing body MR.

In this step, the lead frame LF (see FIG. 21) is immersed in a plating solution (not shown) which is, for example, an electrolytic solution containing a solder material and a current is caused to flow with using the lead frame LF as a cathode electrode. As a result, the metal film SDF is selectively formed on the metal portion of the lead frame LF exposed from the sealing body MR made of resin.

The metal film SDF formed in this step has a function of improving wettability of solder in the case where solder is used as the connection member BND1 in mounting the semiconductor device PAC in the electronic device EA1 shown in FIG. 16, for example. When the connection member BND1 is solder, the metal film SDF and the connection member BND1 are melted and integrated with each other. Further, when the connection member BND1 is conductive resin, the metal film SDF may not be formed.

<Singulation>

Next, in a step S9 (singulation step) shown in FIG. 21, the package for each sealing body MR is cut off from a frame portion LFF of the lead frame LF. Note that FIGS. 19 to 21 show an example in which one package PKG (see FIG. 21) is formed in one lead frame. Of course, it is also possible to actually manufacture the semiconductor device PAC in the mode shown in FIGS. 19 to 21. However, from the viewpoint of improving manufacturing efficiency, a plurality of packages PKG are obtained from one lead frame LF in many cases. In this case, by separating the packages PKG from the frame portion LFF of the lead frame, the plurality of packages PKG are separated from each other and singulated.

In this step, a part of each of the plurality of leads LD and LDC on the side closer to the frame portion LFF is cut. Further, in this step, a tie bar TB that couples the plurality of leads LD and the plurality of leads LDC to each other and is connected to the frame portion LFF is cut. As a result, the package PKG is separated from the frame portion LFF, and the plurality of leads LD and the plurality of leads LDC are separated from each other.

In FIG. 21, the singulation step and the lead forming step are shown separately, but the singulation step and the lead forming step may be performed collectively.

<Lead Forming>

Next, in a step S10 (lead forming step) shown in FIG. 21, the plurality of leads LD are bent to obtain the shape of the leads LD of the semiconductor device PAC1 or the shape of the leads LD of the semiconductor device PAC2. The bending direction of the leads LD is as follows.

Namely, the lead LD of the semiconductor device PAC1 shown in FIG. 14 is bent such that the tip of the lead LD comes closer to the main surface MRt than to the main surface MRb of the sealing body MR in the thickness direction of the semiconductor device PAC1. Also, the lead LD of the semiconductor device PAC2 is bent such that the tip of the lead LD comes closer to the main surface MRb than to the main surface MRt of the sealing body MR in the thickness direction of the semiconductor device PAC2.

Further, in the present embodiment, unused leads LD among the plurality of leads LD are cut in the vicinity of the side surface MRs of the sealing body MR. Further, in the present embodiment, the plurality of leads LDC are not used as terminals of the semiconductor device PAC. Therefore, the plurality of leads LDC are cut in the vicinity of the side surface MRs of the sealing body MR.

<Inspection>

Next, in a step S11 (inspection step) shown in FIG. 21, necessary inspections such as appearance inspection and electrical test are performed on the semiconductor device PAC. Those determined to be acceptable as a result of the inspection are mounted in the electronic device EA1 shown in FIG. 3. Alternatively, when the electronic device EA1 is assembled at another place, the semiconductor devices PAC determined to be acceptable are shipped as products.

<Manufacturing Method of Electronic Device>

Figure 23:
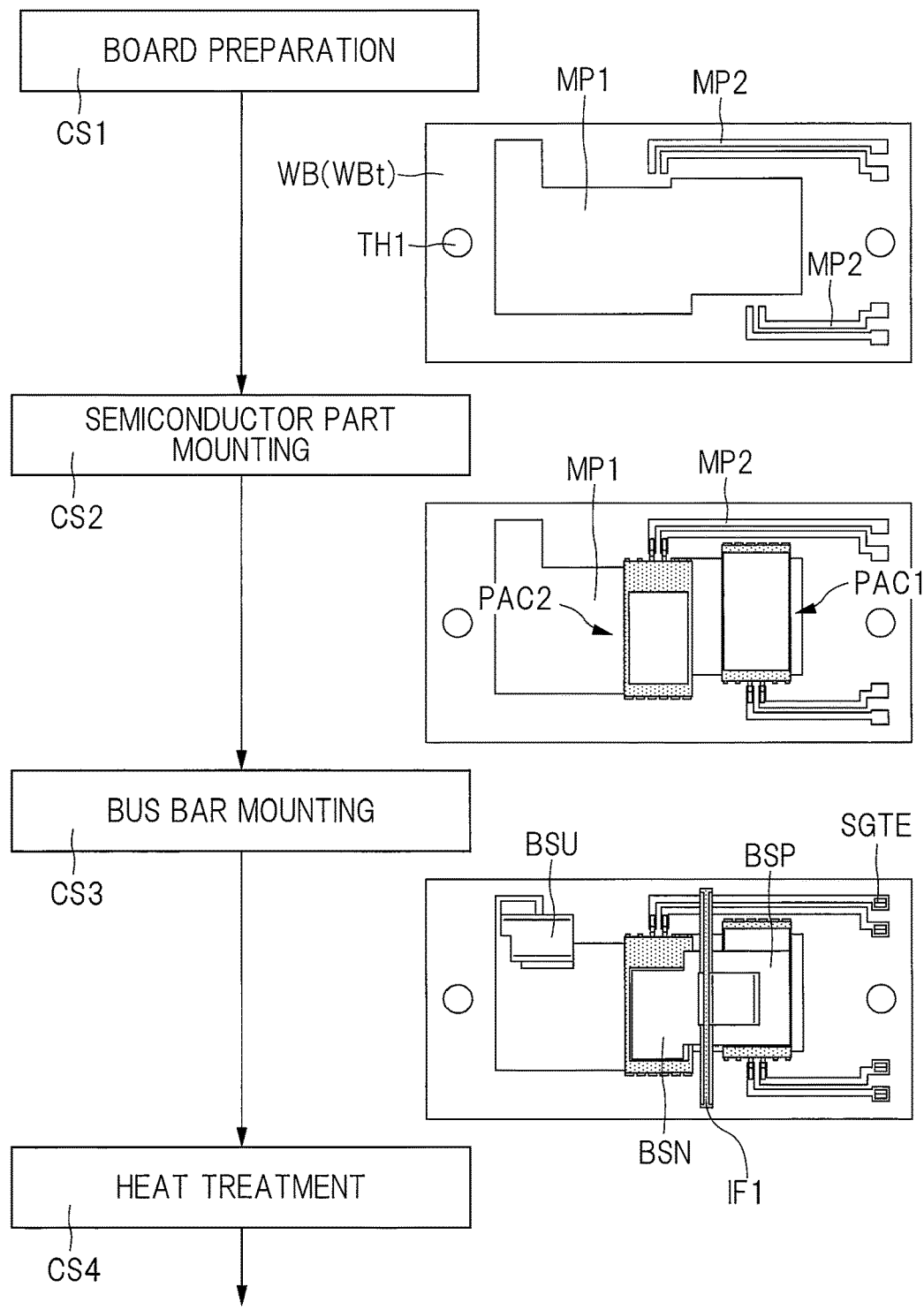
FIG. 23 is an explanatory diagram showing an assembly flow of the electronic device shown in FIG. 4.
Figure 24:
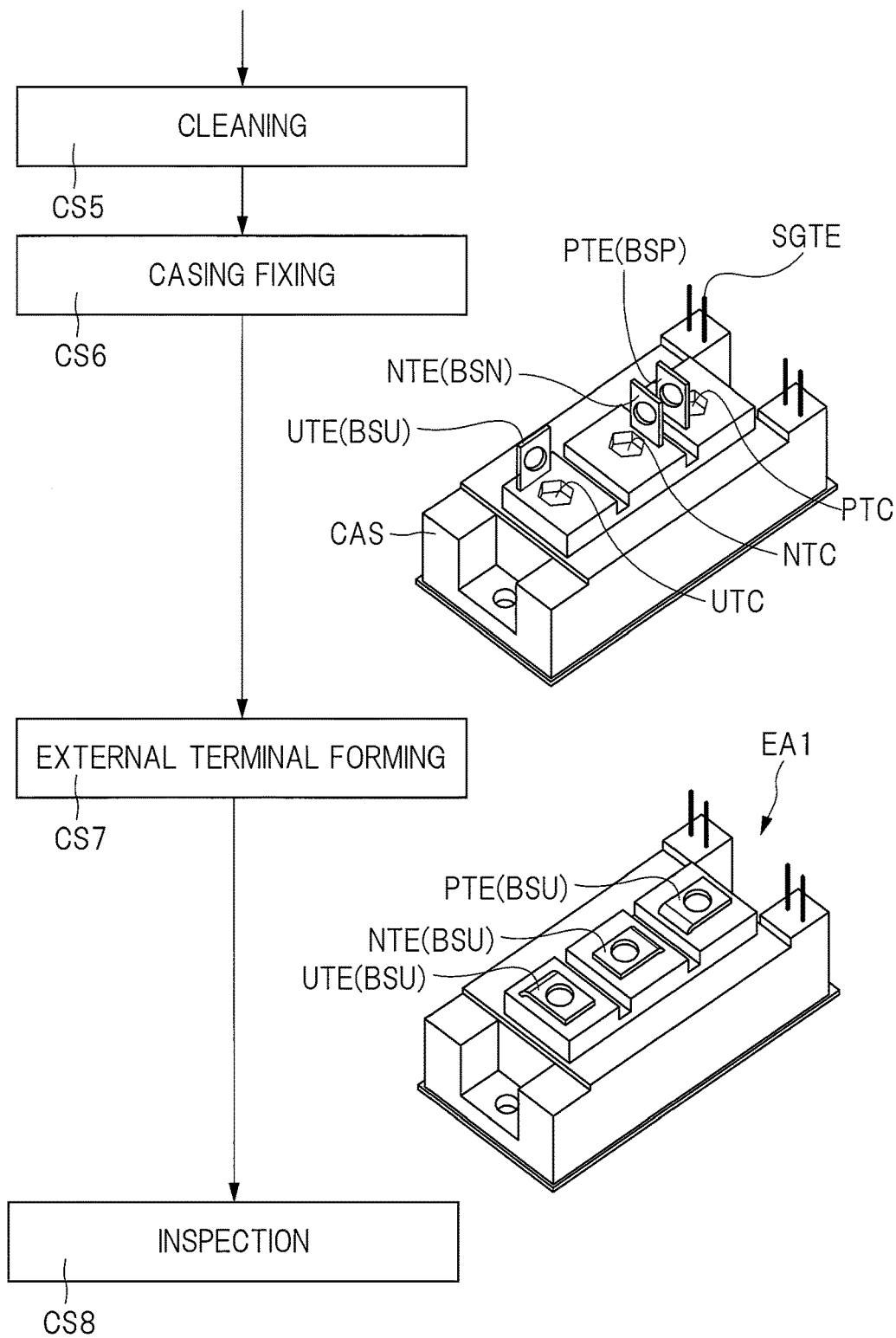
FIG. 24 is an explanatory diagram showing the assembly flow of the electronic device continued from FIG. 23.

Next, a manufacturing method of the electronic device shown in FIG. 4 will be described. FIG. 23 and FIG. 24 are explanatory diagrams showing an assembly flow of the electronic device shown in FIG. 4. Note that plan views showing the outline of respective steps are attached near the respective steps in FIGS. 23 and 24. The following description will be made with reference to figures shown in FIGS. 23 and 24 and figures (for example, FIG. 3 and FIG. 4) described above in principle.

<Preparation of Board>

First, in a step CS1 (board preparation step) shown in FIG. 23, the board WB is prepared. The through hole TH1 for fixing the electronic device is formed in the board WB prepared in this step. In addition, a plurality of conductor patterns including the conductor pattern MP1 and the conductor pattern MP2 are formed on the upper surface WBt of the board WB.

<Semiconductor Part Mounting>

Next, in a step CS2 (semiconductor part mounting step) shown in FIG. 23, the semiconductor device PAC1 and the semiconductor device PAC2 are mounted on the conductor pattern MP1 of the board WB. As shown in FIG. 16, the semiconductor device PAC1 is mounted on the conductor pattern MP1 via the connection member BND1 in the state where the conductor pattern MP1 on the board WB and the emitter terminal ET (clip CLP) of the semiconductor device PAC1 face each other. Also, the semiconductor device PAC2 is mounted on the conductor pattern MP1 via the connection member BND2 in the state where the conductor pattern MP1 on the board WB and the collector terminal CT (die pad DP) of the semiconductor device PAC2 face each other.

In this step, first, a paste-like bond material which is a raw material of the connection members BND1 and BND2 is applied to the semiconductor part mounting regions (planned regions where the semiconductor devices PAC1 and PAC2 are to be mounted) of the conductor pattern MP1. The raw material of the connection members BND1 and BND2 is solder paste or conductive resin paste (resin paste containing conductive particles). A similar bond material is applied also to a part of each of the plurality of conductor patterns MP2 shown in FIG. 3 (lead connection portion to which the lead LD is connected).

Thereafter, the emitter terminal ET exposed from the sealing body MR (see FIG. 14) on the main surface MRt of the semiconductor device PAC1 shown in FIG. 16 is pressed to the bond material (raw material of the connection member BND1) to mount the semiconductor device PAC1 on the conductor pattern MP1. Further, the collector terminal CT exposed from the sealing body MR (see FIG. 14) on the main surface MRb of the semiconductor device PAC2 is pressed to the bond material (raw material of the connection member BND2) to mount the semiconductor device PAC2 on the conductor pattern MP1.

When solder is used for the connection members BND1, BND2, BND3, and BND4 shown in FIG. 16, the heat treatment (reflow) is not performed in the step CS2, and the reflow is performed in heat treatment step in a step SC4. On the other hand, in the case where conductive resin containing metal particles such as silver (Ag) in the thermosetting resin is used for each of the connection members BND1, BND2, BND3, and BND4, the heat treatment (cure baking) at a temperature at which the connection members BND1 and BND2 are cured may be performed in the step CS2. Also, even in the case where the conductive resin is used for each of the connection members BND1, BND2, BND3, and BND4, the cure baking may be performed in a heat treatment step in a step CS4.

<Bus Bar Mounting>

Next, in a step CS3 (bus bar mounting step) shown in FIG. 23, each of the bus bars BSP, BSN, and BSU is mounted. Also, in this step, each of the plurality of signal terminals SGTE shown in FIG. 3 is mounted on the conductor pattern MP2 on the board WB. Further, in this step, the insulating plate IF1 disposed between the bus bar BSP and the bus bar BSN is also mounted on the board WB.

As shown in FIG. 16, the bus bar BSP is mounted on the connector terminal CT (die pad DP) of the semiconductor device PAC1 via the connection member BND3. Also, the bus bar BSN is mounted on the emitter terminal ET (clip CLP) of the semiconductor device PAC2 via the connection member BND4. In the present embodiment, the bus bar BSP and the bus bar BSN are bonded and fixed to the insulating plate IF1. Therefore, the insulating plate IF1 is fixed onto the board WB via the bus bar BSP and the bus bar BSN. In the case where the bus bars BSP and BSN and the insulating plate IF1 are bonded and fixed, the bus bars BSP and BSN can be easily aligned.

In addition, as shown in FIG. 4, the bus bar BSU is mounted on the conductor pattern MP1 of the board WB via the connection member (not shown (conductive connection member similar to the connection member BND1)). Further, each of the plurality of signal terminals SGTE shown in FIG. 3 is mounted on a part of the conductor pattern MP2 (terminal connection portion on which the signal terminal SGTE is mounted) of the board WB via the connection member (not shown (conductive connection member similar to the connection member BND1)).

Each of the connection members (including the connection members BND3 and BND4 shown in FIG. 16) for mounting each of the bus bars BSP, BSN, and BSU and the plurality of signal terminals SGTE shown in FIG. 3 is the conductive connection member similar to the connection member BND1 shown in FIG. 16. Therefore, in this step, a paste material which is a raw material of the connection member is applied to the mounting place of each member, and then the respective members are mounted.

In this step, each of the bus bars BSP, BSN, and BSU is preliminarily bent to be formed. For example, in the case of the bus bar BSP, a bent portion is present between the bonding portion BPC and the portion BP1 shown in FIG. 16. Also, a bent portion is present between the portion BP2 and the portion BP1. Further, a bent portion is present between the portion BP3 and the portion BP2. However, the portion between the terminal PTE and the portion BP3 is not bent at the stage of this step as shown in FIG. 24. Likewise, in the case of the bus bar BSN shown in FIG. 16, a bent portion is present between the bonding portion BPC and the portion BP1, but the portion between the terminal NTE and the portion BP4 is not bent at the stage of this step. Also, in the case of the bus bar BSU shown in FIG. 4, the portion corresponding to the terminal UTE is not bent at the stage of this step. This is for the purpose of making it easier to insert the bus bars BSP, BSN, and BSU into the through holes of the casing CAS in a casing fixing step shown in FIG. 24.

<Heat Treatment>

Next, in a step CS4 (heat treatment step) shown in FIG. 23, heat treatment is performed on the connection members for mounting the semiconductor devices PAC1 and PAC2, the bus bars BSP, BSN, and BSU, and the plurality of signal terminals SGTE.

In the case where the connection members are made of solder, the solder is heated for reflow up to the melting temperature of the solder and is then cooled, whereby the connection members are cured and the respective members are fixed. Also, in the case where the connection members are made of conductive resin, the conductive resin is heated for cure baking up to the temperature at which the resin component contained in the conductive resin is cured. As a result, the conductive resin is cured and the respective members are fixed.

<Cleaning>

Next, in a step CS5 (cleaning step) shown in FIG. 24, the flux residues and the like around the connection members described in the heat treatment step above are cleaned and removed. In the case where the conductive resin is used for each of the connection members BND1, BND2, BND3, and BND4, the cleaning step shown in FIG. 24 may be omitted.

<Casing Fixing>

Next, in a step CS6 (casing fixing step) shown in FIG. 24, the casing CAS is disposed so as to cover the upper side of the board WB and the board WB and the semiconductor devices PAC1 and PAC2 mounted on the board WB are installed in the housing PKT of the casing CAS as shown in FIG. 4.

In this step, the casing CAS is pressed to the board WB in the state where an adhesive (not shown) is applied to the peripheral portion of the upper surface WBt of the board WB and around the two through holes. As a result, the board WB and the casing CAS are bonded and fixed. Thus, the creepage distance between the electronic device installation surface on which the electronic device EA1 is installed and the electronic parts inside the casing CAS, in other words, the dielectric strength is ensured. At this time, a plurality of through holes are formed in the casing CAS, and parts (exposed portions) of the bus bars BSP, BSN, and BSU and the plurality of signal terminals SGTE shown in FIG. 2 are inserted into the plurality of through holes. In this manner, as shown in FIG. 24, the structure in which parts (exposed portions) of the bus bars BSP, BSN, and BSU and the plurality of signal terminals SGTE protrude from the casing CAS can be obtained.

Note that the casing CAS has the concave portion (external terminal portion) UTC, the concave portion (external terminal portion) NTC, and the concave portion (external terminal portion) PTC. Though not illustrated in FIG. 24, the nut NUT shown in FIG. 4 is inserted into each of the concave portions UTC, NTC, and PTC before a following external terminal forming step.

<External Terminal Forming>

Next, in a step CS7 (external terminal forming step) shown in FIG. 24, parts (exposed portions) of the bus bars BSP, BSN, and BSU exposed from the casing CAS are bent. As a result, the concave portion UTC is covered with the terminal UTE, the concave portion NTC is covered with the terminal NTE, and the concave portion PTC is covered with the terminal PTE.

<Inspection>

Next, in a step CS8 (inspection step) shown in FIG. 24, necessary inspections such as appearance inspection and electrical test are performed on the electronic device EA1. Those determined to be acceptable as a result of the inspection are shipped as products.

Second Embodiment

Figure 25:
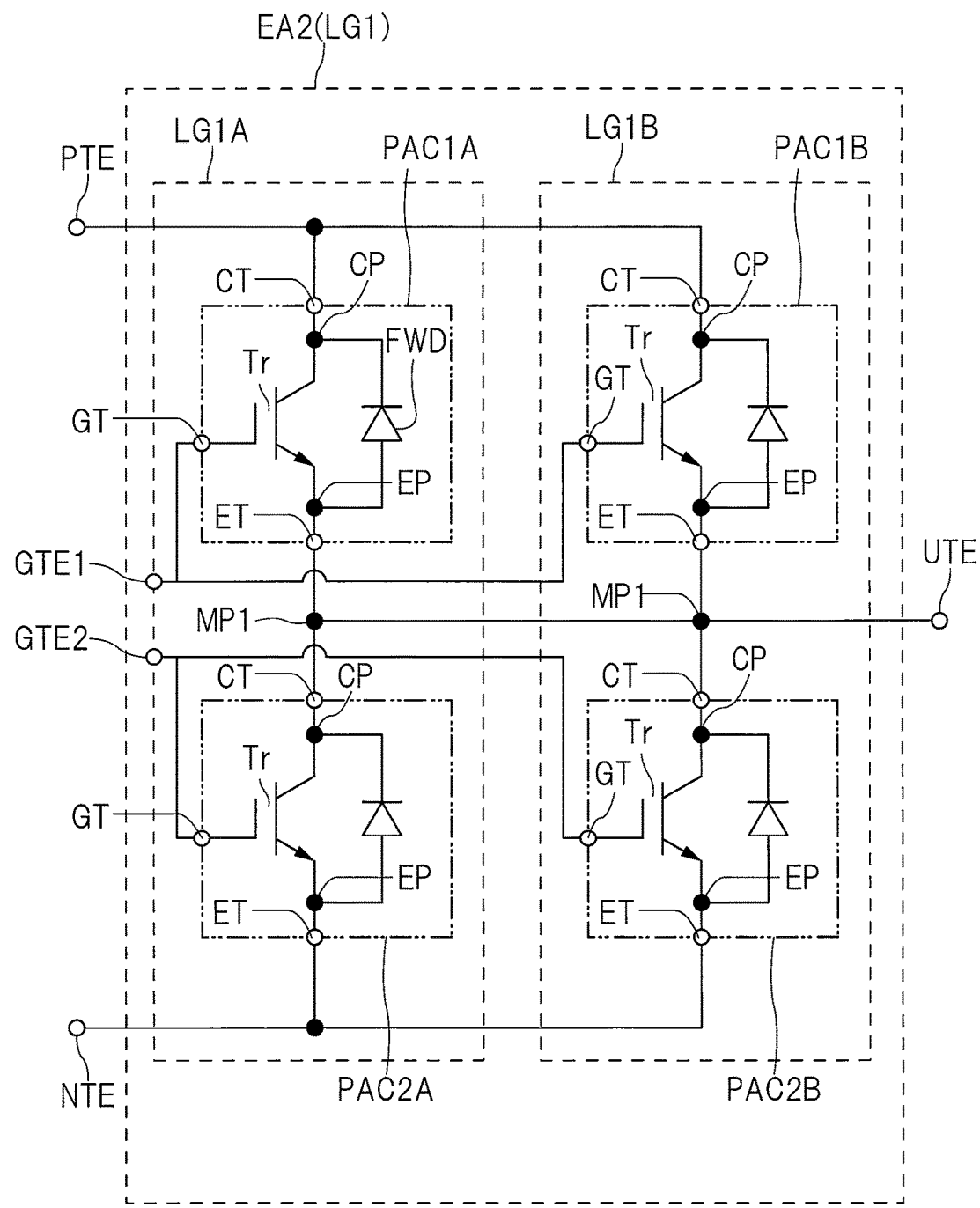
FIG. 25 is a circuit diagram showing a circuit configuration example of an electronic device different from that of FIG. 15.

Next, an electronic device EA2 incorporated in an inverter circuit in which the leg LG1 described with reference to FIG. 1 is configured of a plurality of upper arms and a plurality of lower arms will be described. FIG. 25 is a circuit diagram showing a circuit configuration example of the electronic device according to the second embodiment. In FIG. 25, focusing on the leg LG1 out of the legs LG1 to LG3 of the inverter circuit PWC shown in FIG. 1, the example in which the leg LG1 is configured of a unit leg LG1A and a unit leg LG1B is shown. In the second embodiment, difference from the above-described first embodiment will be mainly described, and description overlapping with the first embodiment will be omitted in principle.

For example, in a general inverter circuit like the inverter circuit PWC shown in FIG. 1, each of the legs LG1 to LG3 is configured of one upper arm and one lower arm. However, depending on the value of the current flowing through the inverter circuit, a current exceeding the allowable current amount may flow through the upper arm and the lower arm in some cases. Thus, by configuring each leg to have a plurality of upper arms and lower arms as in the present embodiment, it is possible to increase the allowable amount of current flowing in the inverter circuit.

The circuit provided in the electronic device EA2 shown in FIG. 25 configures the part corresponding to the leg LG1 shown in FIG. 1, but it differs in including the unit leg LG1A and the unit leg LG1B in the leg LG1. In the case of the electronic device EA2, the unit leg LG1A and the unit leg LG1B are connected in parallel, and thus, the current can be distributed to the unit leg LG1A and the unit leg LG1B even when a large current flows through the leg LG1. In other words, the electronic device EA2 has the configuration capable of causing a larger current to flow as compared with the electronic device EA1 shown in FIG. 15.

<Mounting Form of Electronic Device>

Figure 26:
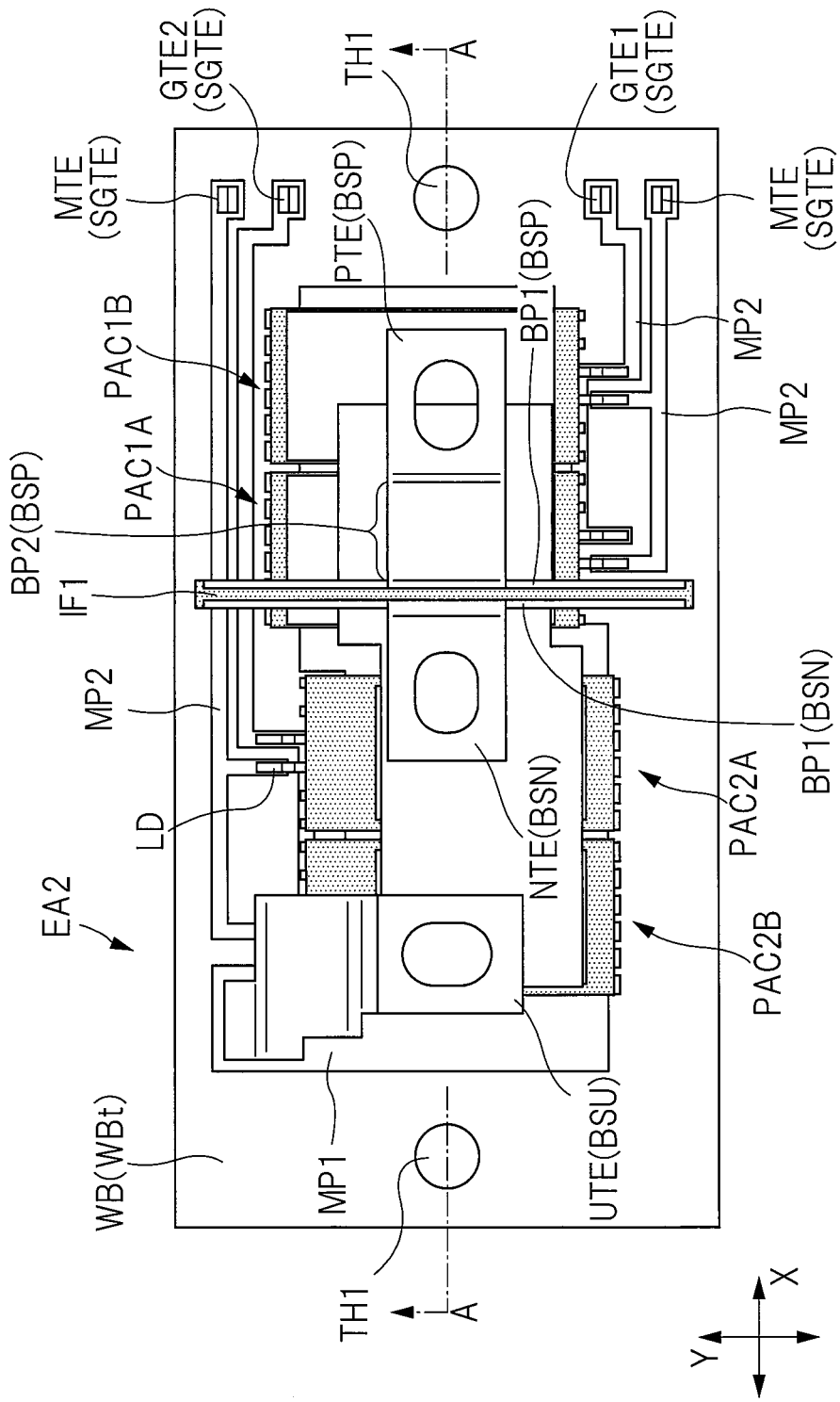
FIG. 26 is a plan view showing an internal structure of the electronic device shown in FIG. 25.
Figure 27:
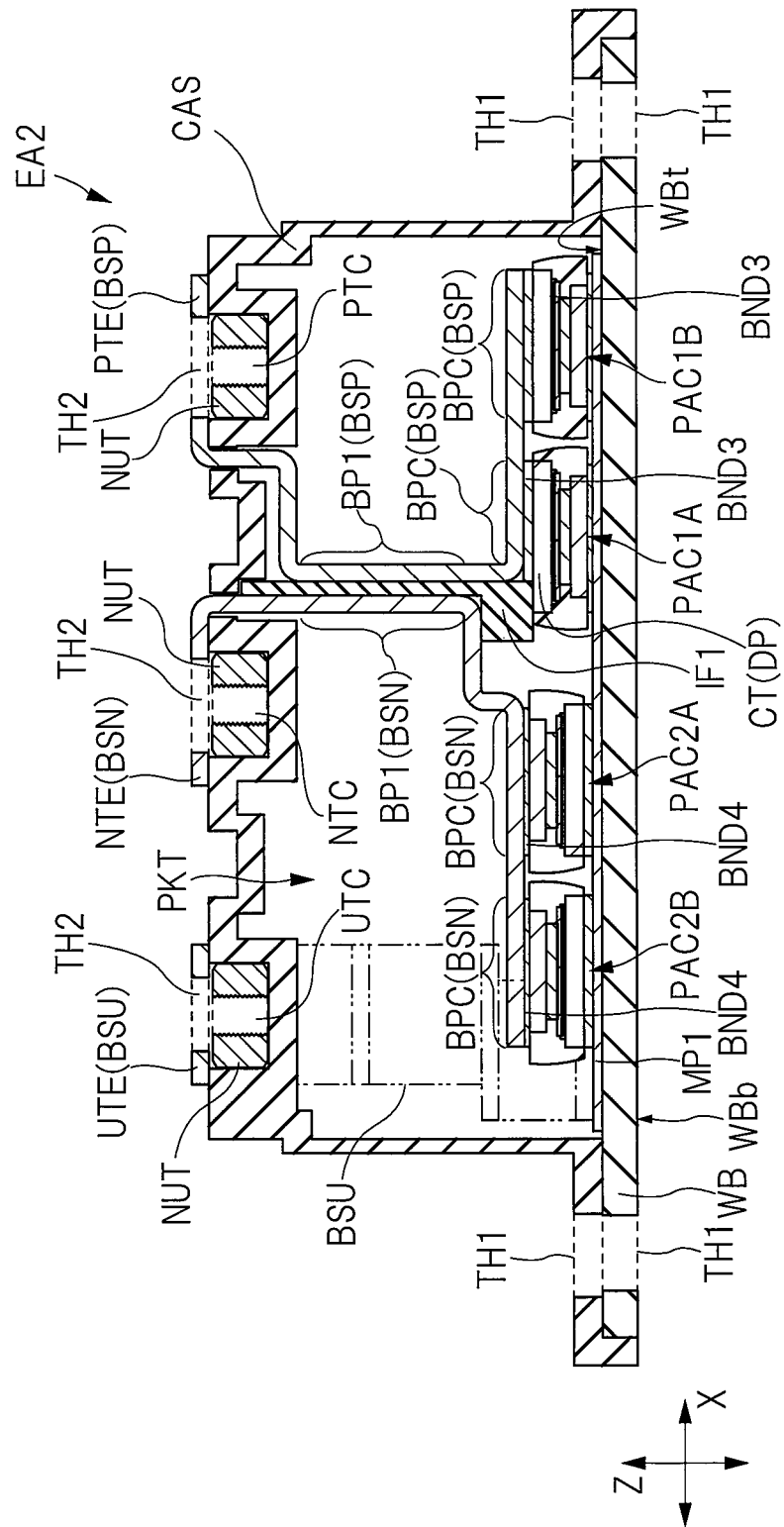
FIG. 27 is a cross-sectional view taken along a line A-A of FIG. 26.
Figure 28:
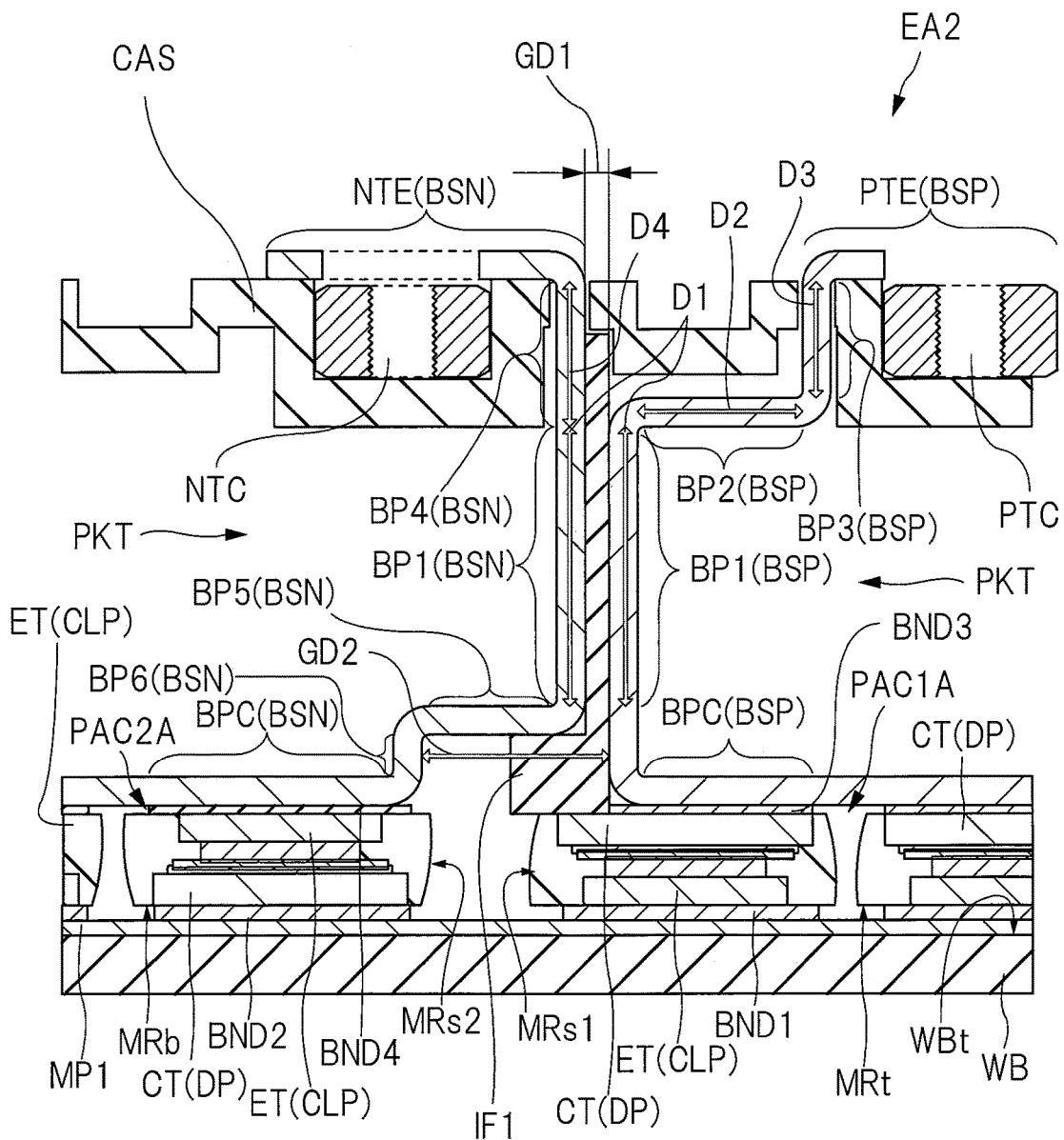
FIG. 28 is an enlarged cross-sectional view showing a periphery of a bus bar connected to the semiconductor device shown in FIG. 27 in an enlarged manner.

Next, an example of the structure of the electronic device corresponding to the circuit shown in FIG. 25 will be described. Since the external appearance of the electronic device EA2 shown in FIG. 26 is the same as the external appearance of the electronic device EA1 shown in FIG. 2, the illustration thereof is omitted. FIG. 26 is a plan view showing an internal structure of the electronic device shown in FIG. 25. FIG. 27 is a cross-sectional view taken along a line A-A of FIG. 26. Also, FIG. 28 is an enlarged cross-sectional view showing a periphery of a bus bar connected to the semiconductor device shown in FIG. 27 in an enlarged manner.

In addition, as shown in FIG. 26, semiconductor devices PAC1A, PAC1B, PAC2A, and PAC2B are mounted on the upper surface WBt of the board WB. Each of the four semiconductor devices PAC1A, PAC1B, PAC2A, and PAC2B has a similar structure, and includes the transistor Tr and the diode FWD shown in FIG. 25. Also, each of the semiconductor devices PAC1A, PAC1B, PAC2A, and PAC2B has the collector terminal CT electrically connected to the collector electrode CP of the transistor Tr which is a power transistor, the emitter terminal ET electrically connected to the emitter electrode EP of the transistor Tr, and the gate terminal GT electrically connected to the gate electrode of the transistor Tr. The semiconductor device PAC1A and the semiconductor device PAC2A constitute the unit leg LG1A shown in FIG. 25, and the semiconductor device PAC1B and the semiconductor device PAC2B constitute the unit leg LG1B shown in FIG. 25.

The semiconductor device PAC1A and the semiconductor device PAC1B are arranged adjacent to each other in the X direction. Further, as shown in FIG. 27, the collector terminals CT (see FIG. 28) of the semiconductor device PAC1A and the semiconductor device PAC1B are electrically connected to each other via the bus bar BSP, and are electrically connected to the terminal PTE. In other words, the bus bar BSP has a bonding portion BPC connected to the collector terminal CT of the semiconductor device PAC1A and a bonding portion BPC connected to the collector terminal CT of the semiconductor device PAC1B.

On the other hand, the emitter terminals ET (see FIG. 25) of the semiconductor device PAC1A and the semiconductor device PAC1B are electrically connected to each other via the conductor pattern MP1, and are electrically connected to the terminal UTE via the conductor pattern MP1 and the bus bar BSU.

The semiconductor device PAC2A and the semiconductor device PAC2B are arranged adjacent to each other in the X direction. Further, as shown in FIG. 27, the emitter terminals ET (see FIG. 28) of the semiconductor device PAC2A and the semiconductor device PAC2B are electrically connected to each other via the bus bar BSN, and are electrically connected to the terminal NTE. In other words, the bus bar BSN has a bonding portion BPC connected to the emitter terminal ET of the semiconductor device PAC2A and a bonding portion BPC connected to the emitter terminal ET of the semiconductor device PAC2B.

On the other hand, the collector terminals CT (see FIG. 25) of the semiconductor device PAC2A and the semiconductor device PAC2B are electrically connected to each other via the conductor pattern MP1, and are electrically connected to the terminal UTE via the conductor pattern MP1 and the bus bar BSU.

Also, as shown in FIG. 26, the plurality of leads LD provided in each of the semiconductor devices PAC1A, PAC1B, PAC2A, and PAC2B are connected to the plurality of conductor patterns MP2 formed on the upper surface WBt of the board WB. Each of the plurality of conductor patterns MP2 is connected to the signal terminal SGTE. As in the electronic device EA1 shown in FIG. 2, the plurality of signal terminals SGTE include the terminals GTE1 and GTE2 which transmit gate signals to the semiconductor device. In addition, the plurality of signal terminals SGTE include the monitoring terminal MTE which outputs signals for monitoring an operation state of the semiconductor device such as a temperature, a voltage, or a current.

Further, each of the semiconductor devices PAC1A, PAC1B, PAC2A, and PAC2B provided in the electronic device EA2 has a board-side main surface facing the upper surface WBt of the board WB and an opposite main surface located on an opposite side of the board-side main surface. The bus bar BSP is bonded to the opposite main surfaces of the semiconductor devices PAC1A and PAC1B and the bus bar BSN is bonded to the opposite main surfaces of the semiconductor devices PAC2A and PAC2B.

Specifically, the main surfaces MRt of the sealing bodies MR (see FIG. 14) of the semiconductor devices PAC1A and PAC1B shown in FIG. 28 face the upper surface WBt of the board WB. The exposed surfaces of the clips CLP exposed from the main surfaces MRt of the sealing bodies MR of the semiconductor devices PAC1A and PAC1B correspond to the board-side main surfaces described above. The exposed surfaces of the clips CLP corresponding to the board-side main surfaces are bonded to the conductor pattern MP1 via the connection members BND1.

Further, the exposed surfaces of the die pads DP exposed from the main surfaces MRb (see FIG. 14) of the sealing bodies MR of the semiconductor devices PAC1A and PAC1B correspond to the opposite main surfaces described above. The exposed surfaces of the die pads DP corresponding to the opposite main surfaces are bonded to the bonding portion BPC of the bus bar BSP via the connection members BND3. The die pads DP of the semiconductor devices PAC1A and PAC1B are electrically connected to the terminal PTE via the bus bar BSP.

Also, the exposed surfaces of the die pads DP exposed from the main surfaces MRb of the sealing bodies MR of the semiconductor devices PAC2A and PAC2B correspond to the board-side main surfaces described above. The exposed surfaces of the die pads DP corresponding to the board-side main surfaces are bonded to the conductor pattern MP1 via the connection members BND2. Further, the exposed surfaces of the clips CLP exposed from the main surfaces MRt (see FIG. 14) of the sealing bodies MR of the semiconductor devices PAC2A and PAC2B correspond to the opposite main surfaces described above. The exposed surfaces of the clips CLP corresponding to the opposite main surfaces are bonded to the bonding portion BPC of the bus bar BSN via the connection members BND4. The clips CLP of the semiconductor devices PAC2A and PAC2B are electrically connected to the terminal NTE via the bus bar BSN. For example, as shown in FIG. 28, the extension distance D3 of the portion BP3 in the Z direction is shorter than the extension distance D2 of the portion BP2 in the X direction.

Even when the four semiconductor devices PAC1A, PAC1B, PAC2A, and PAC2B are installed in the housing PKT of the casing CAS as in the electronic device EA2, the electronic device EA2 can be configured to have the same external dimensions as the electronic device EA1 shown in FIG. 2. However, since the semiconductor devices PAC1A, PAC1B, PAC2A, and PAC2B are not stacked on the board WB, but are arranged side by side on the board WB, layout restrictions are large with the inclusion of the layout of the bus bar BSP and the bus bar BSN.

Thus, in the present embodiment, the technique of reducing the parasitic inductance of the bus bars BSP and BSN while suppressing the increase in the external size of the casing CAS in the electronic device EA2 will be described. The basic concept for reducing the parasitic inductance of the bus bars BSP and BSN is the same as that described in the first embodiment. Namely, when considering the layout of the bus bars BSP and BSN, it is preferable from the viewpoint of improving the power conversion efficiency that the extension distance of the bus bars BSP and BSN (wiring path distance) is shortened and the area of the portions extending in parallel in a state of facing each other at a short distance is increased. Further, it is necessary to ensure the dielectric strength between the bus bar BSP and the bus bar BSN.

First, as shown in FIG. 26 and FIG. 27, the electronic device EA2 differs from the electronic device EA1 in that each of the portion BP1 of the bus bar BSP, the portion BP1 of the bus bar BSN, and the insulating plate IF is disposed at the position overlapping with the semiconductor device PAC1A. As shown in FIG. 27, due to the restriction on the distance from the semiconductor device PAC1B to the side wall of the casing CAS, the electronic device EA2 has the structure in which the bus bar BSP overlaps with the semiconductor device PAC1A.

In this case, when the bus bar BSP and the bus bar BSN are configured to have the portions BP1 extending in parallel in a state of facing each other at a short distance, the insulating plate IF1 and the bus bar BSN overlap with the semiconductor device PAC1A as shown in FIG. 28. Accordingly, the influence of the mutual inductance generated between the bus bar BSP and the bus bar BSN can be increased and the parasitic inductance can be reduced. However, when the bus bar BSN overlaps with the semiconductor device PAC1A, the distance between the bus bar BSN and the semiconductor device PAC1A is shorter compared with the electronic device EA1 shown in FIG. 16.

Therefore, when the dielectric strength characteristics of the electronic device EA2 are taken into consideration, it is important to surely interpose the insulating plate IF1 between the transmission path connected to the terminal PTE and the transmission path connected to the terminal NTE and ensure the necessary creepage distance. In particular, in the case where a part of the collector terminal CT of the semiconductor device PAC1A is not covered with the bus bar BSP and is exposed to the outside of the sealing body MR (see FIG. 14), the creepage distance between the exposed portion and the bus bar BSN tends to be short.

In the case of the electronic device EA2, from the viewpoint of improving the dielectric strength characteristics in the exposed portion of the collector terminal CT described above, the following structure is adopted. Namely, as shown in FIG. 28, the bus bar BSN includes a portion BP5 located between the portion BP1 and the bonding portion BPC and extending in the direction away from the bus bar BSP (X direction in FIG. 28) and a portion BP6 located between the portion BP5 and the bonding portion BPC and extending in the Z direction. Further, a part (tip) of the insulating plate IF1 is located at a position lower than the portion BP5 of the bus bar BSN.

Specifically, the insulating plate IF1 covers a portion of the collector terminal CT of the semiconductor device PAC1A exposed from the bus bar BSP. Further, the insulating plate IF1 is interposed between the portion BP1 of the bus bar BSP and the semiconductor device PAC1. Further, the insulating plate IF1 covers at least a part of the lower surface (surface facing the semiconductor device PAC1A) of the portion BP5 of the bus bar BSN. Accordingly, since it is possible to surely interpose the insulating plate IF1 between the transmission path connected to the terminal PTE and the transmission path connected to the terminal NTE, the necessary creepage distance can be ensured.

In the case of the electronic device EA2, as described above, in order to increase the creepage distance between the transmission path connected to the terminal PTE and the transmission path connected to the terminal NTE, the bus bar BSN is provided with a stepped portion constituted of the portion BP5 and the portion BP6. Therefore, the extension distance D1 of the portions BP1 of the bus bar BSP and the bus bar BSN in the Z direction is shorter than that of the electronic device EA1 shown in FIG. 16. However, in the case where the portion BP1 of the bus bar BSN overlaps with the semiconductor device PAC1A as in the present embodiment, it is preferable that the stepped portion is provided, giving priority to the improvement of the dielectric strength characteristics.

However, the electronic device EA2 is configured such that the extension distance D1 of the portion BP1 is increased by shortening the extension distance D3 of the portion BP3 in the Z direction as in the electronic device EA1 shown in FIG. 16. In the example shown in FIG. 28, the extension distance D3 is, for example, 5.0 mm and the extension distance D2 is, for example, 6.6 mm. If the thickness (height in the Z direction) of the casing CAS is constant, the extension distance D1 of the portion BP1 of the bus bar BSP can be increased by reducing the extension distance D3 as much as possible. In the example shown in FIG. 28, the extension distance D1 of the portion BP1 of the bus bar BSP and the extension distance D1 of the portion BP1 of the bus bar BSN in the Z direction are equal to each other and are 11.8 mm. Namely, in the example shown in FIG. 28, the extension distance D1 is longer than the extension distance D3 of the portion BP3. In addition, in the example shown in FIG. 28, the extension distance D1 is longer than the extension distance D2 of the portion BP2.

Further, since the insulating plate IF1 is interposed between the portion BP1 of the bus bar BSP and the portion BP1 of the bus bar BSN, the dielectric strength can be ensured even if the separation distance GD1 between the portions BP1 facing each other is reduced. Therefore, the separation distance GD1 between the portion BP1 of the bus bar BSP and the portion BP1 of the bus bar BSN is shorter than the extension distance D3 of the portion BP3 of the bus bar BSP in the Z direction. In the example shown in FIG. 28, the portion BP1 of the bus bar BSP and the portion BP1 of the bus bar BSN are arranged at a regular interval, and a value of the separation distance GD1 is, for example, 1.0 mm. The plate thickness (thickness) of each of the bus bar BSP and the bus bar BSN is 1.2 mm, and the value of the separation distance GD1 is smaller than the plate thickness of each of the bus bar BSP and the bus bar BSN.

On the other hand, the separation distance between the bus bar BSN and the bus bar BSP is increased in the vicinity of the semiconductor device PAC1A from the viewpoint of improving the dielectric strength characteristics. In the example shown in FIG. 28, the separation distance GD2 between the portion BP6 of the bus bar BSN and the bus bar BSP is 7.9 mm. Note that the separation distance between the semiconductor device PAC1A and the semiconductor device PAC2A is 3.0 mm.

In addition, the electronic device EA2 has the structure in which a part (portion BP1) of the bus bar BSN overlaps with the semiconductor device PAC1A due to the layout restriction on the board WB. However, the transmission path connected to the terminal PTE and the transmission path connected to the terminal NTE are preferably demarcated as far as possible with the insulating plate IF1 as a boundary. As shown in FIG. 27, in the case of the electronic device EA2, the terminal PTE overlaps with at least one of the semiconductor device PAC1A and the semiconductor device PAC1B in the Z direction. In the example shown in FIG. 27, the terminal PTE overlaps with the semiconductor device PAC1B. Also, the terminal NTE overlaps with at least one of the semiconductor device PAC2A and the semiconductor device PAC2B in the Z direction. In the example shown in FIG. 27, the terminal NTE overlaps with the semiconductor device PAC2A. In the case of the electronic device EA2, it is difficult to dispose all the semiconductor devices immediately below the terminals to which the semiconductor devices are connected, due to the layout restriction. For example, the semiconductor device PAC2B overlaps with the terminal UTE in the Z direction.

Further, as described above, in the electronic device EA2, the extension distance D1 of the portion BP1 in the Z direction is shorter as compared with the electronic device EA1 shown in FIG. 16. Therefore, it is preferable to apply the structure described with reference to FIGS. 17 and 18 from the viewpoint of increasing the influence of mutual inductance. Namely, as shown in FIG. 17, the portion BP1 of the bus bar BSP extends in the Y direction intersecting with each of the Z direction and the X direction (see FIG. 28). Also, the extension distance (width) of the portion BP1 in the Y direction is longer than the extension distance D1 of the portion BP1 in the Z direction. In addition, the extension distance D1W of the portion BP1 in the Y direction is longer than the extension distance (width) D3W of the portion BP3 in the Y direction. Likewise, as shown in FIG. 18, the portion BP1 of the bus bar BSN extends in the Y direction intersecting with each of the Z direction and the X direction (see FIG. 28). Also, the extension distance (width) D1W of the portion BP1 in the Y direction is longer than the extension distance D1 of the portion BP1 in the Z direction. Further, the extension distance D1W of the portion BP1 in the Y direction is longer than the extension distance (width) D4W of the portion BP4 in the Y direction.

In other words, this can be expressed as follows. Namely, the portion BP1 of the bus bar BSP shown in FIG. 17 has a central portion located between the portion BP2 and the bonding portion BPC and overhang portions BPf on both sides of the central portion in a side view. Likewise, the portion BP1 of the bus bar BSN shown in FIG. 18 has a central portion located between the portion BP4 and the bonding portion BPC and overhang portions BPf on both sides of the central portion in a side view.

Also, in the case of the electronic device EA2, the separation distance between the semiconductor device PAC1A and the semiconductor device PAC1B and the separation distance between the semiconductor device PAC2A and the semiconductor device PAC2B are shorter than the separation distance between the semiconductor device PAC1A and the semiconductor device PAC2A. In the example shown in FIG. 27, the separation distance between the semiconductor device PAC1A and the semiconductor device PAC2A is 3.0 mm, and the separation distance between the semiconductor device PAC1A and the semiconductor device PAC1B and the separation distance between the semiconductor device PAC2A and the semiconductor device PAC2B are, for example, 1 mm. The separation distance between the semiconductor device PAC1A and the semiconductor device PAC1B and the separation distance between the semiconductor device PAC2A and the semiconductor device PAC2B included in the same leg are preferably smaller from the viewpoint of electrical characteristics. However, considering that the dielectric strength drops due to the creeping up of the connection members BND1 and BND2 disposed on the conductor pattern MP1 and the cleaning residue due to deterioration of cleaning properties, it is preferable that there is a certain degree of separation distance.

Figure 29:
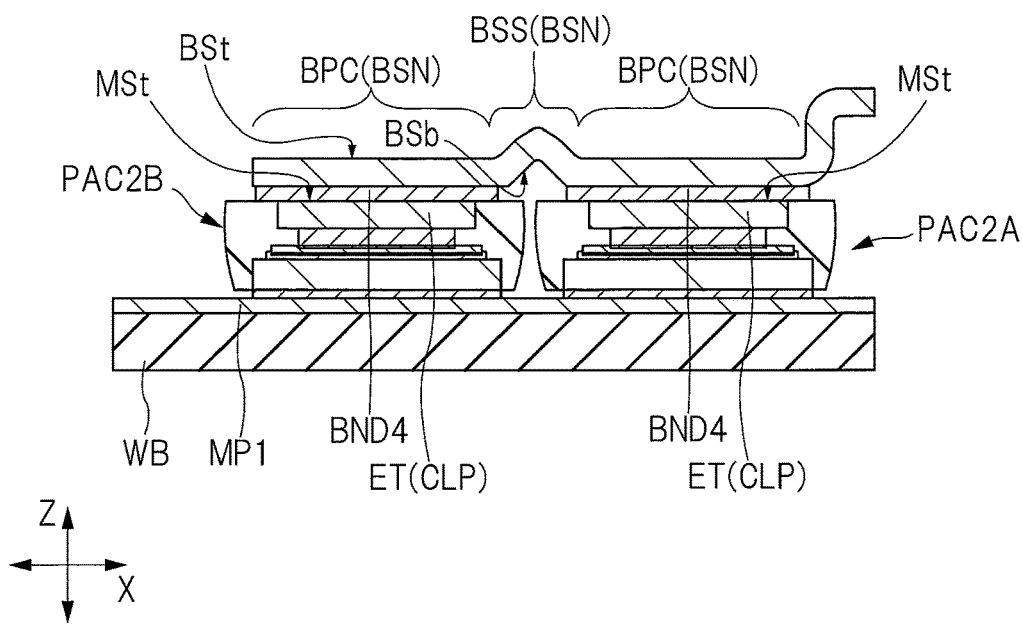
FIG. 29 is an enlarged cross-sectional view showing a modification of a connection portion between the bus bar and the semiconductor device on a low side shown in FIG. 27.
Figure 30:
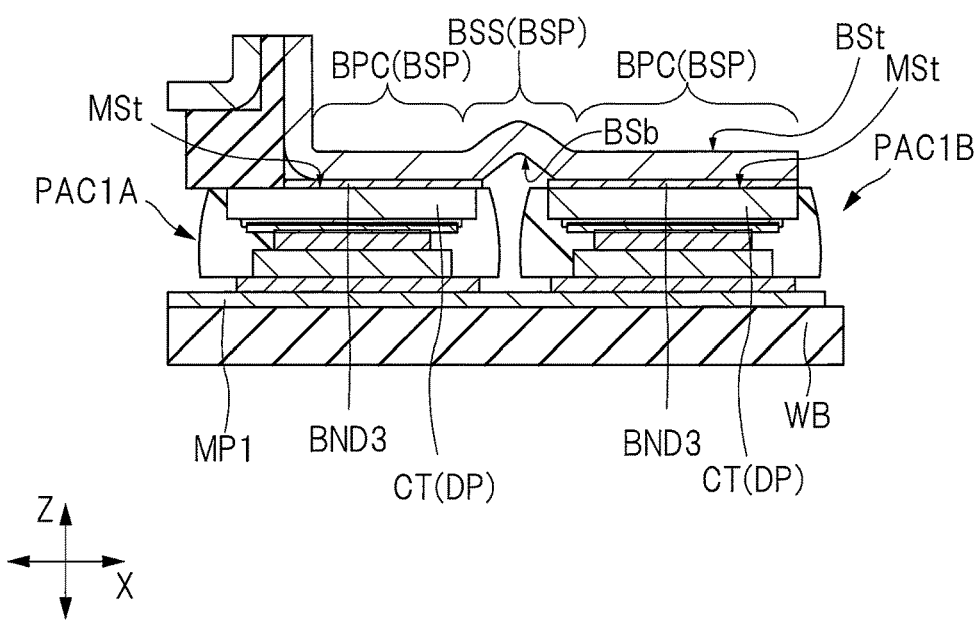
FIG. 30 is an enlarged cross-sectional view showing a modification of a connection portion between the bus bar and the semiconductor device on a high side shown in FIG. 27.

As described above, when the separation distance between the semiconductor device PAC1A and the semiconductor device PAC1B and the separation distance between the semiconductor device PAC2A and the semiconductor device PAC2B are short, the separation distance between the adjacent connection members BND3 and the separation distance between the adjacent connection members BND4 are shortened. Therefore, from the viewpoint of preventing the overflown connection members BND3 and BND4 from going around between adjacent semiconductor devices to be in contact with the conductor pattern MP1, the modification shown in FIG. 29 and FIG. 30 is preferable. FIG. 29 is an enlarged cross-sectional view showing a modification of a connection portion between the bus bar and the semiconductor device on a low side shown in FIG. 27. FIG. 30 is an enlarged cross-sectional view showing a modification of a connection portion between the bus bar and the semiconductor device on a high side shown in FIG. 27.

As shown in FIG. 29, the bus bar BSN has a projecting portion BSS disposed between the two adjacent bonding portions BPC and projecting in the direction away from the board WB. Also, as shown in FIG. 30, the bus bar BSP has a projecting portion BSS disposed between the two adjacent bonding portions BPC and projecting in the direction away from the board WB.

As shown in FIG. 29, each of the two bonding portions BPC and the projecting portion BSS of the bus bar BSN has a back surface BSb facing the main surface MSt of the semiconductor device PAC2A or the main surface MSt of the semiconductor device PAC2B and a front surface BSt on an opposite side of the back surface BSb. The interval in the Z direction from the main surface MSt of the semiconductor device PAC2A to the back surface BSb of the bonding portion BPC is smaller than the interval in the Z direction from the main surface MSt of the semiconductor device PAC2B to the back surface BSb of the projecting portion BSS. Also, as shown in FIG. 30, each of the two bonding portions BPC and the projecting portion BSS of the bus bar BSP has the back surface BSb facing the main surface MSt of the semiconductor device PAC1A or the main surface MSt of the semiconductor device PAC1B and the front surface BSt on an opposite side of the back surface BSb. The interval in the Z direction from the main surface MSt of the semiconductor device PAC1A to the back surface BSb of the bonding portion BPC is smaller than the interval in the Z direction from the main surface MSt of the semiconductor device PAC1B to the back surface BSb of the projecting portion BSS.

In the case where the projecting portion BSS is provided between the adjacent bonding portions BPC as described above, even if the amount of the connection members BND3 and BND4 to be disposed is large, a space for absorbing the excessive connection members BND3 and BND4 can be ensured on the side of the back surface BSb of the projecting portion BSS. Namely, in the structure shown in FIG. 29 and FIG. 30, it is possible to prevent the overflown connection members BND3 and BND4 from going around between the adjacent semiconductor devices to be in contact with the conductor pattern MP1.

Also, the manufacturing method of the electronic device EA2 differs from the manufacturing method of the electronic device EA1 described in the first embodiment in that the four semiconductor devices (semiconductor parts) are mounted on the conductor pattern MP1 in the semiconductor part mounting step shown in FIG. 23. Also, the manufacturing method of the electronic device EA2 differs from the manufacturing method of the electronic device EA1 described in the first embodiment in that the portion BP1 (see FIG. 28) of the bus bar BSN and the insulating plate IF1 are mounted so as to overlap with the semiconductor device PAC1A (see FIG. 28) in the bus bar mounting step shown in FIG. 23.

Other than the differences described above, the electronic device EA2 is similar to the electronic device EA1 described in the first embodiment. Therefore, redundant description will be omitted.

In the foregoing, the invention made by the inventor of the present invention has been concretely described based on the embodiments. However, it is needless to say that the present invention is not limited to the foregoing embodiments and various modifications can be made within the scope of the present invention. Although some modifications have been described in the embodiments above, typical modifications other than those described in the embodiments above will be described below.

<Modification 1>

Figure 31:
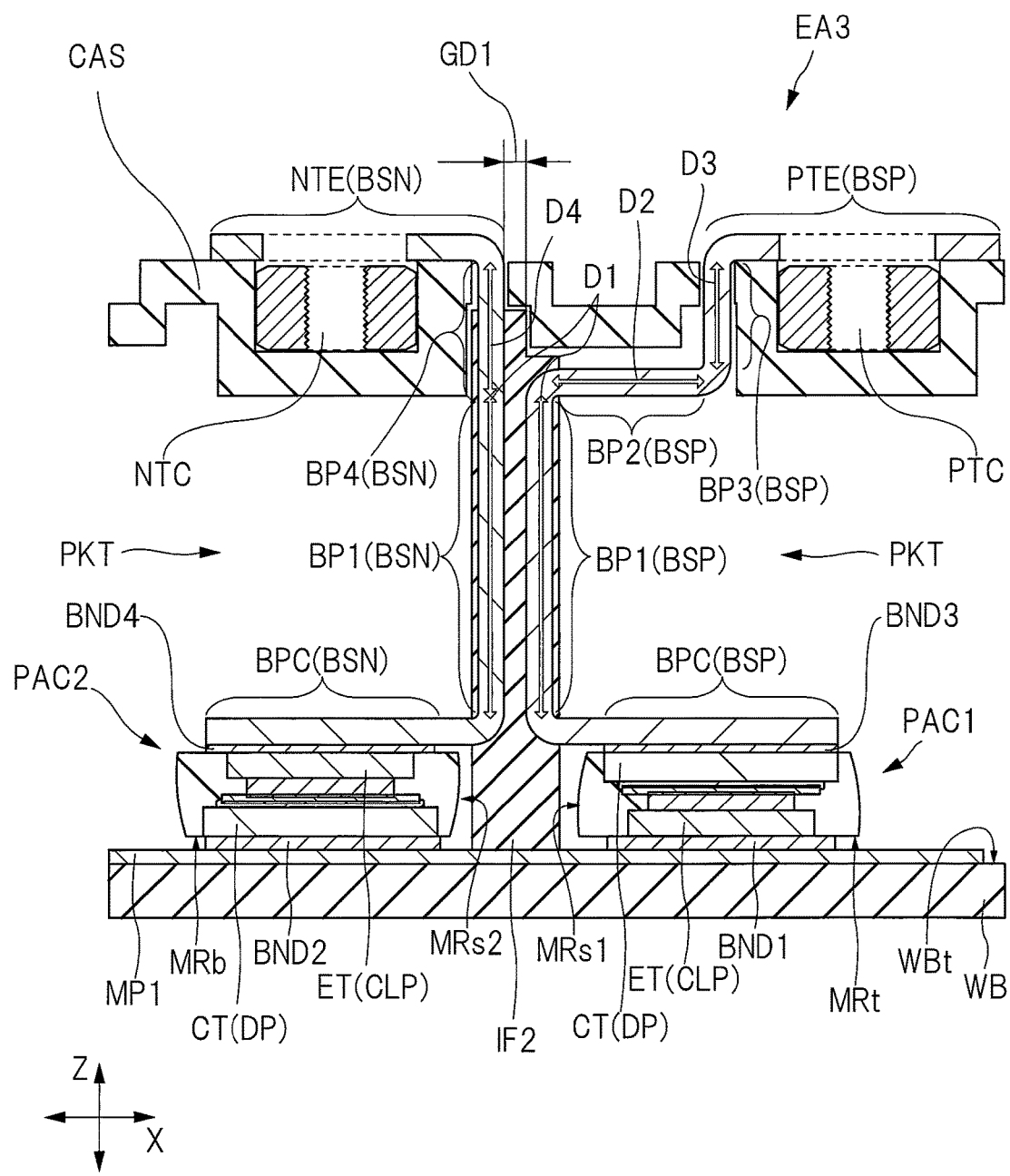
FIG. 31 is an enlarged cross-sectional view showing a modification of the electronic device shown in FIG. 16.

For example, in the first embodiment described above, the mode in which the bus bar BSP and the bus bar BSN shown in FIG. 16 are bonded to the insulating plate IF1 has been described. However, the bus bar BSP and the bus bar BSN may be partially sealed with a resin body IF2 made of an insulator as in an electronic device EA3 shown in FIG. 31. FIG. 31 is an enlarged cross-sectional view showing a modification of the electronic device shown in FIG. 16.

The electronic device EA3 shown in FIG. 31 differs from the electronic device EA1 shown in FIG. 16 in that the bus bar BSP and the bus bar BSN are partially sealed with the resin body IF2 made of an insulator. In addition, the insulating plate IF1 shown in FIG. 16 is not present between the portion BP1 of the bus bar BSP and the portion BP1 of the bus bar BSN of the electronic device EA3, and a part of the resin body IF2 is provided instead.

Specifically, the portion BP1 of the bus bar BSP and the portion BP1 of the bus bar BSN are sealed with the integrally formed single resin body IF2, and the bonding portion BPC and the terminal (exposed portion) PTE of the bus bar BSP and the bonding portion BPC and the terminal (exposed portion) NTE of the bus bar BSN are each exposed from the resin body IF2. The resin body IF2 is formed by placing the bus bar BSP and the bus bar BSN in a molding die (not shown), supplying the resin into the molding die, and curing the resin in the molding die.

In the case of the electronic device EA3 provided with the resin body IF2 formed in the above-described manner, a value of the separation distance GD1 between the portion BP1 of the bus bar BSP and the portion BP1 of the bus bar BSN is defined by the accuracy at the time of placing the bus bar BSP and the bus bar BSN in the molding die. Therefore, the value of the separation distance GD1 can be controlled with high accuracy.

In addition, in the case of the electronic device EA3, the resin body IF2 inserted between the portion BP1 of the bus bar BSP and the portion BP1 of the bus bar BSN is formed integrally with its surrounding portion, and thus, the rigidity in the portion between the bus bar BSP and the bus bar BSN only is not required. Therefore, the value of the separation distance GD1 between the portion BP1 of the bus bar BSP and the portion BP1 of the bus bar BSN can be further reduced as compared with the electronic device EA1 shown in FIG. 16.

Further, in the case of the electronic device EA3, not only the opposing surfaces of the portion BP1 of the bus bar BSP and the portion BP1 of the bus bar BSN, but also the surfaces on the opposite side of the opposing surfaces are covered with the insulating material. In this case, since the risk of aerial discharge when a voltage is applied to the bus bars BSP and BSN is reduced, the condition of the creepage distance in the portion exposed from the resin body IF2 (for example, the portion BP2 and the portion BP3) is mitigated.

In addition, although FIG. 31 has been described as a modification of the electronic device EA1 shown in FIG. 16, the portion BP1 of the bus bar BSP and the portion BP1 of the bus bar BSN shown in FIG. 27 may be sealed with single resin body IF2 formed integrally as a modification of the electronic device EA2 shown in FIG. 27. In this case, since the extension distance of the portion BP6 in the Z direction shown in FIG. 28 can be shortened because of the effect of mitigating the condition of the creepage distance described above, the extension distance D1 of the portion BP1 can be increased.

Also, though not shown, it is also possible to form the resin body IF2 shown in FIG. 31 in the state where the bus bar BSP and the bus bar BSN are bonded to the insulating plate IF1 as shown in FIG. 16. In this case, the insulating plate IF1 is interposed between the portion BP1 of the bus bar BSP and the portion BP1 of the bus bar BSN as shown in FIG. 16.

<Modification 2>

Further, the example in which an IGBT is used as the transistor Tr constituting the switching element has been described in the first embodiment and the second embodiment. However, as a modification, a power MOSFET may be used as the switching element of the inverter circuit. In the case of the power MOSFET, a body diode which is a parasitic diode is formed in the semiconductor element constituting the transistor. The body diode functions as the diode (freewheeling diode) FWD shown in FIG. 15 and FIG. 25. Accordingly, if the semiconductor chip provided with the power MOSFET is used, the body diode is incorporated in the semiconductor chip. Therefore, when the power MOSFET is used, it is sufficient that only one semiconductor chip is mounted in one semiconductor device (semiconductor package). However, the body diode and the diode FWD described in the embodiments above differ in diode characteristics. Thus, even when the power MOSFET is used, the diode FWD described in the embodiments above is also formed in some cases.

Also, in the case where the power MOSFET is used as the switching element of the inverter circuit, the first embodiment and the second embodiment can be applied by replacing the part described as "emitter" with "source" and the part described as "collector" with "drain". Therefore, redundant description will be omitted.

<Modification 3>

Also, in the first embodiment and the second embodiment described above, the mode in which the semiconductor device PAC in which the semiconductor chip CHP1 is packaged as shown in FIG. 13 is manufactured in advance and the semiconductor device PAC is mounted on the board WB (see FIG. 16) has been described. However, as a modification, the first embodiment and the second embodiment described above can be applied to the mode in which the semiconductor chip (semiconductor part) CHP1 and the semiconductor chip (semiconductor part) CHP2 shown in FIG. 13 are directly mounted on the conductor pattern MP1 of the board WB shown in FIG. 3.

In this case, since the collector electrode CP (see FIG. 6) of the semiconductor chip CHP1 is connected to the conductor pattern on the board WB, it is necessary to form a plurality of conductor patterns separated from each other on the board WB. Also, the emitter electrode EP and the gate electrode GP of the semiconductor chip CHP1 are connected to one of the plurality of conductor patterns via the wire BW. In addition, the bus bar BSP and the bus bar BSN shown in FIG. 16 are connected to one of the plurality of conductor patterns. Further, in the case of this modification, it is necessary to seal each of the plurality of semiconductor chips CHP1 and the plurality of wires BW with a gel-like resin material in order to protect the wire BW and suppress the aerial discharge from the wire BW.

As described above, the method of directly mounting the unpackaged semiconductor chip CHP1 on the board WB is also applicable, but in this case, the structure of the electronic device is complicated. Therefore, from the viewpoint of reducing the parasitic inductance by simplifying the structure of the bus bars BSP and BSN as shown in FIG. 16, the mode in which the packaged semiconductor device PAC is mounted on the board WB as in the electronic device EA1 shown in FIG. 16 and the electronic device EA2 shown in FIG. 27 is more preferable.

<Modification 4>

Also, in the first embodiment and the second embodiment described above, the electronic device in which the base bar is connected to the terminal of the semiconductor device and the board WB is covered with the casing CAS has been described. However, there are various modifications for the mode of the electronic device. For example, there is a case where the electronic device in the state where the plurality of semiconductor devices are mounted on the board WB but are not covered with the casing CAS is shipped as a product. Alternatively, there is also a case where the electronic device in the state before the bus bar is connected to the semiconductor device is shipped as a product.

<Modification 5>

Also, various modifications have been described above, and these modifications described above may be applied in combination.

Figure 32:
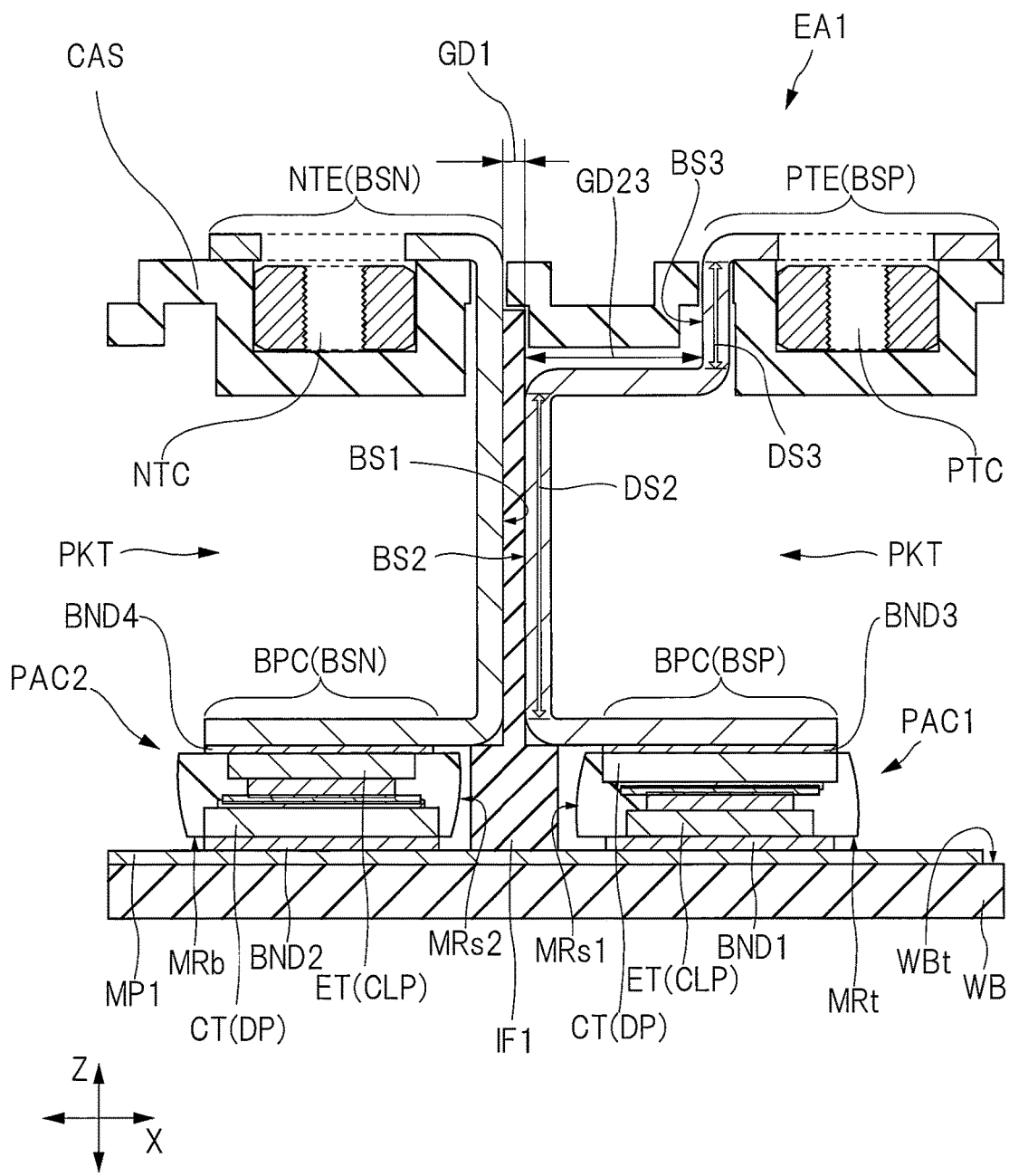
FIG. 32 is an enlarged cross-sectional view of the electronic device shown in FIG. 16.

Further, the configuration described in the embodiments above can be expressed by the following elements. FIG. 32 is an enlarged cross-sectional view of the electronic device shown in FIG. 16.

Note that the electronic device EA1 shown in FIG. 32 is the same as the electronic device EA1 described in the first embodiment. Therefore, in the following description, some of the elements of the electronic device EA1 will be described with reference to the respective drawings already described in the first embodiment.

As shown in FIG. 15, the electronic device EA1 includes the semiconductor device PAC1 having the transistor (power transistor) Tr, the collector terminal CT electrically connected to the collector electrode CP of the transistor Tr, the emitter terminal ET electrically connected to the emitter electrode EP of the transistor Tr, and the gate terminal GT electrically connected to the gate electrode of the transistor Tr.

Also, the electronic device EA1 includes the semiconductor device PAC2 having the transistor (power transistor) Tr, the emitter terminal ET electrically connected to the emitter electrode EP of the transistor Tr, the collector terminal CT electrically connected to the collector electrode CP of the transistor Tr, and the gate terminal GT electrically connected to the gate electrode of the transistor Tr.

In addition, the electronic device EA1 includes the board WB on which the semiconductor device PAC1 and the semiconductor device PAC2 are mounted adjacent to each other in the X direction as shown in FIG. 4.

Further, the electronic device EA1 includes the casing CAS having the housing PKT in which the board WB on which the semiconductor device PAC1 and the semiconductor device PAC2 are mounted is installed and the concave portion (external terminal portion) PTC, the concave portion (external terminal portion) NTC, and the concave portion (external terminal portion) UTC arranged in the X direction above the board WB.

Also, as shown in FIG. 32, the electronic device EA1 includes the bus bar (conductor bar, conductor plate) BSP having the bonding portion BPC connected to the collector terminal CT of the semiconductor device PAC1 and the terminal (exposed portion) PTE exposed to the outside of the casing CAS on the concave portion PTC of the casing CAS.

Also, the electronic device EA1 includes the bus bar (conductor bar, conductor plate) BSN having the bonding portion BPC connected to the emitter terminal ET of the semiconductor device PAC2 and the terminal (exposed portion) NTE exposed to the outside of the casing CAS on the concave portion NTC of the casing CAS.

In addition, as shown in FIG. 4, the electronic device EA1 includes the bus bar (conductor bar, conductor plate) BSU that is electrically connected to each of the emitter terminal ET (see FIG. 32) of the semiconductor device PAC1 and the collector terminal CT (see FIG. 32) of the semiconductor device PAC2 via the conductor pattern MP1 and has the terminal (exposed portion) UTE exposed to the outside of the casing CAS on the concave portion UTC of the casing CAS.

Further, as shown in FIG. 32, the electronic device EA1 includes the insulating plate (insulator) IF1 disposed between a portion of the bus bar BSP and a portion of the bus bar BSN. The bus bar BSN has a surface BS1 located between the terminal NTE and the bonding portion BPC and extending in the Z direction intersecting with the upper surface (main surface) WBt of the board WB. The bus bar BSP has a surface BS2 located between the terminal PTE and the bonding portion BPC, facing the surface BS1 with the insulating plate IF1 interposed therebetween, and extending in the Z direction and a surface BS3 coupled to the terminal PTE and extending in the Z direction. Each of the surfaces BS1, BS2, and BS3 is disposed in the housing PKT of the casing CAS. In this case, a separation distance GD23 between the surface BS2 and the surface BS3 in the X direction is longer than each of the separation distance GD1 between the surface BS1 and the surface BS2 and an extension distance DS3 of the surface BS3 in the Z direction.

Also, an extension distance DS2 of the surface BS2 in the Z direction is longer than the extension distance DS3 of the surface BS3 in the Z direction.

In the electronic device EA1, the parasitic inductance can be reduced by increasing the extension distance DS2 in the Z direction of the surface BS2 facing the bus bar BSN in the vicinity of the bus bar BSN.

Further, the technical idea extracted for the electronic device described in the embodiments above can be expressed as follows.

<Appendix 1>

An electronic device, comprising:

a first semiconductor part having a first power transistor, a first emitter terminal electrically connected to a first emitter electrode of the first power transistor, a first collector terminal electrically connected to a first collector electrode of the first power transistor, and a first gate terminal electrically connected to a first gate electrode of the first power transistor;

a second semiconductor part having a second power transistor, a second emitter terminal electrically connected to a second emitter electrode of the second power transistor, a second collector terminal electrically connected to a second collector electrode of the second power transistor, and a second gate terminal electrically connected to a second gate electrode of the second power transistor;

a board having a first main surface on which the first semiconductor part and the second semiconductor part are mounted adjacent to each other in a first direction;

a casing having a housing in which the board on which the first semiconductor part and the second semiconductor part are mounted is installed and a first external terminal portion and a second external terminal portion arranged in the first direction above the board;

a first conductor plate having a first bonding portion bonded to the first collector terminal of the first semiconductor part and extending in the first direction in a cross-sectional view and an exposed portion exposed to outside of the casing above the first external terminal portion of the casing; and a second conductor plate having a second bonding portion bonded to the second emitter terminal of the second semiconductor part and extending in the first direction in a cross-sectional view and an exposed portion exposed to outside of the casing above the second external terminal portion of the casing, wherein the first conductor plate and the second conductor plate have first portions facing each other with an insulator interposed therebetween and extending in a second direction intersecting with the first direction in a cross-sectional view, the first conductor plate has a second portion located between the first portion and the exposed portion and extending in the first direction away from the second conductor plate and a third portion located between the second portion and the exposed portion and extending in the second direction, each of the first portions of the first conductor plate and the second conductor plate, the second portion of the first conductor plate, and the third portion of the first conductor plate is disposed in the housing of the casing, an interval between the first portion of the first conductor plate and the first portion of the second conductor plate in the first direction is smaller than an interval between the first semiconductor part and the second semiconductor part in the first direction in a cross-sectional view, an interval between the exposed portion of the first conductor plate and the exposed portion of the second conductor plate in the first direction is larger than the interval between the first portion of the first conductor plate and the first portion of the second conductor plate in the first direction in a cross-sectional view, and an extension distance of the third portion in the second direction is shorter than an extension distance of the second portion in the first direction.

<Appendix 2>

An electronic device, comprising:

a first semiconductor part having a first power transistor, a first source terminal electrically connected to a first source electrode of the first power transistor, a first drain terminal electrically connected to a first drain electrode of the first power transistor, and a first gate terminal electrically connected to a first gate electrode of the first power transistor;

a second semiconductor part having a second power transistor, a second source terminal electrically connected to a second source electrode of the second power transistor, a second drain terminal electrically connected to a second drain electrode of the second power transistor, and a second gate terminal electrically connected to a second gate electrode of the second power transistor;

a board having a first main surface on which the first semiconductor part and the second semiconductor part are mounted adjacent to each other in a first direction;

a casing having a housing in which the board on which the first semiconductor part and the second semiconductor part are mounted is installed and a first external terminal portion and a second external terminal portion arranged in the first direction above the board;

a first conductor plate having a first bonding portion bonded to the first drain terminal of the first semiconductor part and extending in the first direction in a cross-sectional view and an exposed portion exposed to outside of the casing above the first external terminal portion of the casing; and a second conductor plate having a second bonding portion bonded to the second source terminal of the second semiconductor part and extending in the first direction in a cross-sectional view and an exposed portion exposed to outside of the casing above the second external terminal portion of the casing, wherein the first conductor plate and the second conductor plate have first portions facing each other with an insulator interposed therebetween and extending in a second direction intersecting with the first direction in a cross-sectional view, the first conductor plate has a second portion located between the first portion and the exposed portion and extending in the first direction away from the second conductor plate and a third portion located between the second portion and the exposed portion and extending in the second direction, each of the first portions of the first conductor plate and the second conductor plate, the second portion of the first conductor plate, and the third portion of the first conductor plate is disposed in the housing of the casing, an interval between the first portion of the first conductor plate and the first portion of the second conductor plate in the first direction is smaller than an interval between the first semiconductor part and the second semiconductor part in the first direction in a cross-sectional view, an interval between the exposed portion of the first conductor plate and the exposed portion of the second conductor plate in the first direction is larger than the interval between the first portion of the first conductor plate and the first portion of the second conductor plate in the first direction in a cross-sectional view, and an extension distance of the third portion in the second direction is shorter than an extension distance of the second portion in the first direction.

What is claimed is:

1. An electronic device, comprising:
   a first semiconductor part having a first power transistor, a first emitter terminal electrically connected to a first emitter electrode of the first power transistor, a first collector terminal electrically connected to a first collector electrode of the first power transistor, and a first gate terminal electrically connected to a first gate electrode of the first power transistor;
   a second semiconductor part having a second power transistor, a second emitter terminal electrically connected to a second emitter electrode of the second power transistor, a second collector terminal electrically connected to a second collector electrode of the second power transistor, and a second gate terminal electrically connected to a second gate electrode of the second power transistor;
   a board having a first main surface on which the first semiconductor part and the second semiconductor part are mounted adjacent to each other in a first direction;
   a casing having a housing in which the board on which the first semiconductor part and the second semiconductor part are mounted is installed and a first external terminal portion and a second external terminal portion arranged in the first direction above the board;
   a first conductor plate having a first bonding portion bonded to the first collector terminal of the first semiconductor part and extending in the first direction in a cross-sectional view and an exposed portion exposed to outside of the casing above the first external terminal portion of the casing; and
   a second conductor plate having a second bonding portion bonded to the second emitter terminal of the second semiconductor part and extending in the first direction in a cross-sectional view and an exposed portion exposed to outside of the casing above the second external terminal portion of the casing,
   wherein the first conductor plate and the second conductor plate have first portions facing each other with an insulator interposed therebetween and extending in a second direction intersecting with the first direction in a cross-sectional view,
   the first conductor plate has a second portion located between the first portion and the exposed portion and extending in the first direction away from the second conductor plate and a third portion located between the second portion and the exposed portion and extending in the second direction,
   each of the first portions of the first conductor plate and the second conductor plate, the second portion of the first conductor plate, and the third portion of the first conductor plate is disposed in the housing of the casing,
   an interval between the first portion of the first conductor plate and the first portion of the second conductor plate in the first direction is smaller than an interval between the first semiconductor part and the second semiconductor part in the first direction in a cross-sectional view,
   an interval between the exposed portion of the first conductor plate and the exposed portion of the second conductor plate in the first direction is larger than the interval between the first portion of the first conductor plate and the first portion of the second conductor plate in the first direction in a cross-sectional view,
   an extension distance of the third portion in the second direction is shorter than an extension distance of the second portion in the first direction,
   a third semiconductor part is disposed next to the first semiconductor part in the first direction, is mounted on the first main surface of the board, and has a third power transistor, a third emitter terminal electrically connected to a third emitter electrode of the third power transistor, a third collector terminal electrically connected to a third collector electrode of the third power transistor, and a third gate terminal electrically connected to a third gate electrode of the third power transistor,
   a fourth semiconductor part is disposed next to the second semiconductor part in the first direction, is mounted on the first main surface of the board, and has a fourth power transistor, a fourth emitter terminal electrically connected to a fourth emitter electrode of the fourth power transistor, a fourth collector terminal electrically connected to a fourth collector electrode of the fourth power transistor, and a fourth gate terminal electrically connected to a fourth gate electrode of the fourth power transistor,
   the first conductor plate further has a third bonding portion bonded to the third collector terminal of the third semiconductor part and extending in the first direction,
   the second conductor plate further has a fourth bonding portion bonded to the fourth emitter terminal of the fourth semiconductor part and extending in the first direction,
   each of the first semiconductor part, the second semiconductor part, the third semiconductor part, and the fourth semiconductor part has a second main surface facing the first main surface of the board and a third main surface on an opposite side of the second main surface,
   each of the first bonding portion, the second bonding portion, the third bonding portion, and the fourth bonding portion are bonded to the third main surface,
   the first conductor plate has a first projecting portion between the first bonding portion and the third bonding portion in the first direction, and
   the second conductor plate has a second projecting portion between the second bonding portion and the fourth bonding portion in the first direction.

2. The electronic device according to claim 1,
wherein an extension distance of the first portion of the first conductor plate in the second direction is longer than the extension distance of the third portion in the second direction.

3. The electronic device according to claim 2,
wherein the extension distance of the first portion of the first conductor plate in the second direction is longer than the extension distance of the second portion in the first direction.

4. The electronic device according to claim 1,
wherein the second external terminal portion is located above the second semiconductor part in a cross-sectional view.

5. The electronic device according to claim 1,
wherein a separation distance between the first portion of the first conductor plate and the first portion of the second conductor plate is shorter than the extension distance of the third portion in the second direction.

6. The electronic device according to claim 1,
wherein the second conductor plate has a fourth portion extending in the second direction between the first portion and the exposed portion,
the insulator extends in the second direction, and
the insulator has a first portion located between the first portion of the first conductor plate and the first portion of the second conductor plate in the first direction and a second portion located between the fourth portion of the second conductor plate and the third portion of the first conductor plate in the first direction.

7. The electronic device according to claim 1,
wherein the first semiconductor part has a first side surface facing the second semiconductor part,
the second semiconductor part has a second side surface facing the first side surface of the first semiconductor part,
the first portion of the first conductor plate, the first portion of the second conductor plate, and the insulator are disposed between the first semiconductor part and the second semiconductor part in a plan view,
the first conductor plate and the second conductor plate are not present between the first side surface of the first semiconductor part and the second side surface of the second semiconductor part, and
a part of the insulator is present between the first side surface of the first semiconductor part and the second side surface of the second semiconductor part.

8. The electronic device according to claim 1,
wherein each of the first portion of the first conductor plate, the first portion of the second conductor plate, and the insulator is located at a position overlapping with the first semiconductor part in a plan view,
the second conductor plate has a fourth portion located between the first portion of the first conductor plate and the second bonding portion of the second conductor plate and extending in the first direction away from the first conductor plate and a fifth portion located between the fourth portion and the second bonding portion of the second conductor plate and extending in the second direction, and
a part of the insulator is located between the fourth portion of the second conductor plate and the first bonding portion of the first conductor plate in the second direction.

9. The electronic device according to claim 1,
wherein each of the first portion of the first conductor plate, the first portion of the second conductor plate, and the insulator is located at a position overlapping with the second semiconductor part in a plan view,
the first conductor plate has a fourth portion located between the first portion of the second conductor plate and the first bonding portion of the first conductor plate and extending in the first direction away from the first conductor plate and a fifth portion located between the fourth portion and the first bonding portion of the first conductor plate and extending in the second direction, and
a part of the insulator is located between the fourth portion of the first conductor plate and the second bonding portion of the second conductor plate in the second direction.

10. The electronic device according to claim 1,
wherein each of the first bonding portion, the third bonding portion, and the first projecting portion of the first conductor plate has a first back surface facing the third main surface of the first semiconductor part or the third main surface of the third semiconductor part and a first front surface on an opposite side of the first back surface,
each of the second bonding portion, the fourth bonding portion, and the second projecting portion of the second conductor plate has a second back surface facing the third main surface of the second semiconductor part or the third main surface of the fourth semiconductor part and a second front surface on an opposite side of the second back surface,
an interval in the second direction from the third main surface of the first semiconductor part to the first back surface of the first bonding portion is smaller than an interval in the second direction from the third main surface of the first semiconductor part to the first back surface of the first projecting portion, and
an interval in the second direction from the third main surface of the second semiconductor part to the second back surface of the second bonding portion is smaller than an interval in the second direction from the third main surface of the second semiconductor part to the second back surface of the second projecting portion.

11. The electronic device according to claim 1,
wherein the first portion of the first conductor plate and the first portion of the second conductor plate extend in a third direction intersecting with each of the second direction and the first direction, and
an extension distance of the first portion in the third direction is longer than an extension distance of the first portion in the second direction.

12. The electronic device according to claim 1,
wherein each of the first semiconductor part and the second semiconductor part includes:
a semiconductor chip having a power transistor, a plurality of front surface electrodes, and a back surface electrode provided on an opposite side of the plurality of front surface electrodes; and
a sealing body that seals the semiconductor chip,
the plurality of front surface electrodes of the semiconductor chip of the first semiconductor part are disposed between the board and the back surface electrode of the semiconductor chip of the first semiconductor part, and
the back surface electrode of the semiconductor chip of the second semiconductor part is disposed between the board and the plurality of front surface electrodes of the semiconductor chip of the second semiconductor part.

13. The electronic device according to claim 1,
wherein each of the first semiconductor part and the second semiconductor part has a second main surface facing the first main surface of the board and a third main surface on an opposite side of the second main surface, and
each of the first conductor plate and the second conductor plate is bonded to the third main surface.

14. An electronic device comprising:
a first semiconductor part having a first power transistor, a first emitter terminal electrically connected to a first emitter electrode of the first power transistor, a first collector terminal electrically connected to a first collector electrode of the first power transistor, and a first gate terminal electrically connected to a first gate electrode of the first power transistor;
a second semiconductor part having a second power transistor, a second emitter terminal electrically connected to a second emitter electrode of the second power transistor, a second collector terminal electrically connected to a second collector electrode of the second power transistor, and a second gate terminal electrically connected to a second gate electrode of the second power transistor;
a board having a first main surface on which the first semiconductor part and the second semiconductor part are mounted adjacent to each other in a first direction;
a casing having a housing in which the board on which the first semiconductor part and the second semiconductor part are mounted is installed and a first external terminal portion and a second external terminal portion arranged in the first direction above the board;
a first conductor plate having a first bonding portion bonded to the first collector terminal of the first semiconductor part and extending in the first direction in a cross-sectional view and an exposed portion exposed to outside of the casing above the first external terminal portion of the casing; and
a second conductor plate having a second bonding portion bonded to the second emitter terminal of the second semiconductor part and extending in the first direction in a cross-sectional view and an exposed portion exposed to outside of the casing above the second external terminal portion of the casing,
wherein the first conductor plate and the second conductor plate have first portions facing each other with an insulator interposed therebetween and extending in a second direction intersecting with the first direction in a cross-sectional view,
the first conductor plate has a second portion located between the first portion and the exposed portion and extending in the first direction away from the second conductor plate and a third portion located between the second portion and the exposed portion and extending in the second direction,
each of the first portions of the first conductor plate and the second conductor plate, the second portion of the first conductor plate, and the third portion of the first conductor plate is disposed in the housing of the casing,
an interval between the first portion of the first conductor plate and the first portion of the second conductor plate in the first direction is smaller than an interval between the first semiconductor part and the second semiconductor part in the first direction in a cross-sectional view,
an interval between the exposed portion of the first conductor plate and the exposed portion of the second conductor plate in the first direction is larger than the interval between the first portion of the first conductor plate and the first portion of the second conductor plate in the first direction in a cross-sectional view,
an extension distance of the third portion in the second direction is shorter than an extension distance of the second portion in the first direction,
the casing includes the first external terminal portion, the second external terminal portion, and a third external terminal portion arranged in the first direction above the board, and
the casing further includes a bonding portion electrically connected to each of the first emitter terminal of the first semiconductor part and the second collector terminal of the second semiconductor part and a third conductor plate having an exposed portion exposed to outside of the casing above the third external terminal portion of the casing.

15. An electronic device comprising:
a first semiconductor part having a first power transistor, a first emitter terminal electrically connected to a first emitter electrode of the first power transistor, a first collector terminal electrically connected to a first collector electrode of the first power transistor, and a first gate terminal electrically connected to a first gate electrode of the first power transistor;
a second semiconductor part having a second power transistor, a second emitter terminal electrically connected to a second emitter electrode of the second power transistor, a second collector terminal electrically connected to a second collector electrode of the second power transistor, and a second gate terminal electrically connected to a second gate electrode of the second power transistor;
a board having a first main surface on which the first semiconductor part and the second semiconductor part are mounted adjacent to each other in a first direction;
a casing having a housing in which the board on which the first semiconductor part and the second semiconductor part are mounted is installed and a first external terminal portion and a second external terminal portion arranged in the first direction above the board;
a first conductor plate having a first bonding portion bonded to the first collector terminal of the first semiconductor part and extending in the first direction in a cross-sectional view and an exposed portion exposed to outside of the casing above the first external terminal portion of the casing; and
a second conductor plate having a second bonding portion bonded to the second emitter terminal of the second semiconductor part and extending in the first direction in a cross-sectional view and an exposed portion exposed to outside of the casing above the second external terminal portion of the casing,
wherein the first conductor plate and the second conductor plate have first portions facing each other with an insulator interposed therebetween and extending in a second direction intersecting with the first direction in a cross-sectional view,
the first conductor plate has a second portion located between the first portion and the exposed portion and extending in the first direction away from the second conductor plate and a third portion located between the second portion and the exposed portion and extending in the second direction,
each of the first portions of the first conductor plate and the second conductor plate, the second portion of the first conductor plate, and the third portion of the first conductor plate is disposed in the housing of the casing, an interval between the first portion of the first conductor plate and the first portion of the second conductor plate in the first direction is smaller than an interval between the first semiconductor part and the second semiconductor part in the first direction in a cross-sectional view, an interval between the exposed portion of the first conductor plate and the exposed portion of the second conductor plate in the first direction is larger than the interval between the first portion of the first conductor plate and the first portion of the second conductor plate in the first direction in a cross-sectional view, an extension distance of the third portion in the second direction is shorter than an extension distance of the second portion in the first direction, the first portion of the first conductor plate and the first portion of the second conductor plate are sealed with a single sealing body formed integrally, and the first bonding portion and the exposed portion of the first conductor plate and the second bonding portion and the exposed portion of the second conductor plate are exposed from the sealing body.

* * * * *